US008516280B2

(12) United States Patent
Felch et al.

(10) Patent No.: US 8,516,280 B2
(45) Date of Patent: *Aug. 20, 2013

(54) PARALLEL PROCESSING COMPUTER SYSTEMS WITH REDUCED POWER CONSUMPTION AND METHODS FOR PROVIDING THE SAME

(75) Inventors: Andrew C. Felch, Hanover, NH (US); Richard H. Granger, Lebanon, NH (US)

(73) Assignee: Cognitive Electronics, Inc., Boston, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/493,515

(22) Filed: Jun. 11, 2012

(65) Prior Publication Data

US 2012/0311353 A1 Dec. 6, 2012

Related U.S. Application Data

(63) Continuation of application No. 12/236,187, filed on Sep. 23, 2008, now Pat. No. 8,200,992.

(60) Provisional application No. 60/974,713, filed on Sep. 24, 2007, provisional application No. 61/021,757, filed on Jan. 17, 2008.

(51) Int. Cl.
*G06F 1/00* (2006.01)
*G06F 13/00* (2006.01)

(52) U.S. Cl.
USPC .......................................... 713/300; 711/100

(58) Field of Classification Search
None
See application file for complete search history.

(56) References Cited

U.S. PATENT DOCUMENTS

| 5,411,824 | A | 5/1995 | Vasudev et al. |
| 5,588,152 | A | 12/1996 | Dapp et al. |
| 5,590,345 | A | 12/1996 | Barker et al. |
| 5,625,836 | A | 4/1997 | Barker et al. |
| 5,708,836 | A | 1/1998 | Wilkinson et al. |
| 5,713,037 | A | 1/1998 | Wilkinson et al. |
| 5,717,943 | A | 2/1998 | Barker et al. |
| 5,717,944 | A | 2/1998 | Wilkinson et al. |
| 5,734,921 | A | 3/1998 | Dapp et al. |
| 5,752,067 | A | 5/1998 | Wilkinson et al. |
| 5,754,871 | A | 5/1998 | Wilkinson et al. |
| 5,761,523 | A | 6/1998 | Wilkinson et al. |
| 5,765,011 | A | 6/1998 | Wilkinson et al. |

(Continued)

FOREIGN PATENT DOCUMENTS

| EP | 1313029 A1 | 5/2003 |
| WO | 9516239 A1 | 6/1995 |
| WO | 9963751 A1 | 12/1999 |
| WO | 03088033 A1 | 10/2003 |

OTHER PUBLICATIONS

English language translation of Chinese Office Action issued Sep. 6, 2012 in CN Application No. 200880117897.9 and original version of Chinese Office Action, 21 pages.

(Continued)

*Primary Examiner* — Ji H Bae
(74) *Attorney, Agent, or Firm* — Panitch Schwarze Belisario & Nadel LLP

(57) ABSTRACT

A computing system is provided that includes a web page search node including a web page collection, a web server, and a search page returner.

18 Claims, 29 Drawing Sheets

(56) References Cited

U.S. PATENT DOCUMENTS

| | | | |
|---|---|---|---|
| 5,794,059 | A | 8/1998 | Barker et al. |
| 5,870,619 | A | 2/1999 | Wilkinson et al. |
| 5,878,241 | A | 3/1999 | Wilkinson et al. |
| 5,963,745 | A | 10/1999 | Collins et al. |
| 5,963,746 | A | 10/1999 | Barker et al. |
| 5,966,528 | A | 10/1999 | Wilkinson et al. |
| 6,094,715 | A | 7/2000 | Wilkinson et al. |
| 6,754,802 | B1 | 6/2004 | Kirsch |
| 6,757,019 | B1 | 6/2004 | Hsieh et al. |
| 7,069,416 | B2 | 6/2006 | Kirsch |
| 7,132,664 | B1 | 11/2006 | Crosetto |
| 7,159,082 | B1 | 1/2007 | Wade |
| 7,167,890 | B2 | 1/2007 | Lin et al. |
| 7,512,816 | B2 | 3/2009 | Ootsuka et al. |
| 8,200,992 | B2 * | 6/2012 | Felch et al. .................. 713/300 |
| 2003/0222879 | A1 | 12/2003 | Lin et al. |
| 2006/0261279 | A1 | 11/2006 | Crosetto |
| 2007/0083785 | A1 | 4/2007 | Sutardja |
| 2007/0094444 | A1 | 4/2007 | Sutardja |
| 2007/0226522 | A1 | 9/2007 | Aleksic et al. |
| 2008/0040563 | A1 | 2/2008 | Brittain et al. |
| 2008/0140921 | A1 | 6/2008 | Sutardja et al. |
| 2009/0083263 | A1 | 3/2009 | Felch et al. |

OTHER PUBLICATIONS

Barroso et al, "Web Search for a Planet: The Google Cluster Architecture," IEEE Micro, vol. 23, No. 2, pp. 22-28 (Mar.-Apr. 2003).

Hennessy, "Computer Architecture: A Quantitative Approach. Chapter Three, Limits on Instruction-Level Parallelism," Fourth Ed., pp. 172-179 (Sep. 27, 2006).

Cascaval et al, "Evaluation of a Multithreaded Architecture for Cellular Computing", 2002, pp. 1-11, Publisher: IEEE, Published in: US.

Grimm et al, "Parallel Volume Rendering on a single-chip SIMD Architecture", 2001, pp. 107-114, Publisher: IEEE, Published in: DE.

Birkland et al, "The Petacomp Machine a MIMD Cluster for Parallel Pattern Mining", 2006, pp. 1-10, Publisher: IEEE, Published in: NO.

Barroso et al, "Web Search for a Planet the Google Cluster Architecture", Mar. 2003, pp. 22-28, Publisher: IEEE, Published in: US.

Hennessy et al, "MultiThreading Using ILP Support to Exploit Thread Level Parallelism", 2007, pp. 172-179, Publisher: Computer Architecture, Published in: US.

Moore, Branden J., "Exploiting Large Shared On-Chip Caches for Chip Multiprocessors", Apr. 2005, pp. 1-69, Published in: US.

Olukotun et al, "Chip Multiprocessor Architecture", Nov. 28, 2007, pp. 1-47, Publisher: Morgan & Claypool, Published in: US.

Clabes, et al., "Design and Implementation of the POWERS5(TM) Microprocessor", "2004 IEEE International Conference on Integrated Circuit Design and Technology", May 17, 2004, pp. 143-145, Publisher: IEEE, Published in: US.

Elliot et al, "Computational RAM Implementing Processors in Memory", Mar. 1999, pp. 32-41, Publisher: IEEE, Published in: US.

Murakami et al, "Parallel Processing RAM Chip with 256Mb DRAM and Quad Processors", Feb. 1997, pp. 228-229, Publisher: IEEE, Published in: JP.

* cited by examiner

PARALLEL PROCESSING COMPUTER SYSTEMS WITH REDUCED POWER CONSUMPTION AND METHODS FOR PROVIDING THE SAME

CROSS-REFERENCE TO RELATED APPLICATIONS

This application is a continuation of co-pending U.S. application Ser. No. 12/236,187 filed Sep. 23, 2008, the entire disclosure of which is incorporated herein by reference.

This application claims the benefit of U.S. Provisional Application No. 60/974,713, filed Sep. 24, 2007, entitled EFFICIENT COMPUTER ARCHITECTURE FOR SEARCH ENGINES and U.S. Provisional Application No. 61/021,757, filed Jan. 17, 2008, entitled SEARCH PROCESSING UNIT (SPU), both by Andrew Felch and Richard Granger, the entire disclosures of which two applications are herein incorporated by reference.

FIELD OF THE INVENTION

This invention relates to parallel processing computer systems, and approaches intended to reduce the power consumption of large scale parallel processing systems.

BACKGROUND OF THE INVENTION

Microprocessors have evolved since their original creation, now boasting billions of transistors with picoseconds of switching speed. Over time they have gained enormous complexity and have been optimized for a particular set of applications such as speeding up existing programs run on common computing devices such as personal computers (PCs) and their more-powerful cousins, commercial file servers.

One particularly intense activity, employing large arrays of computers is the performance of searches power the World Wide Web (the "Web") of the well-known Internet. Searching for particular content on the Web is an activity typically requested by a client computer and user, and delivered to a search service, such as the well known Google website. Google, and others like it, implement an algorithm known as a "search engine," which efficiently sorts through the available list of interconnected web sites and their underlying content from Internet-connected sources all over the Web/world. Within fractions of a second of performing a search request, the search engine typically returns to the requesting client a voluminous (in many cases) listing of applicable sites and textual references.

As the volume of available content on the web and number of interconnected requesting clients have grown exponentially in recent years, search engines, such as Google, have risen to the challenge of organizing the billions of web pages (trillions of words) that make up the Internet. Such search engines have maintained (and attempted to improve) the responsiveness and quality of their search results. To do this they have created massive datacenters and filled them with hundreds of thousands of PC-based servers. They exploit the massive parallelism of their search algorithms by dividing up web pages amongst their servers so that each server is responsible for searching only a small piece of the Internet.

Search Engines are now building new datacenters because their old datacenters have reached the limits of their electricity usage (megawatts). These datacenters are very expensive and their construction would be unnecessary if the computer architecture used in their servers were more power efficient.

The ability to divide a search task into many pieces is somewhat unique to certain types of tasks, which require massive parallelism (e.g. simulation of brain circuits is also massively parallel). These algorithms often differ from the programs for which existing microprocessors have been optimized, namely those that involve serial dependencies of program steps, delivered through a pipeline. An example of a serial dependency would be where a+b=c, and c is needed to calculate f (e.g. e+c=f)—one must know c before calculating f. In the case of massively parallel algorithms, conversely, c's and f's are determined without regard to each other.

In various large scale data processing systems, there is an increasing need for tools to reduce power consumption. This is particularly a problem in large scale parallel processing systems, including high traffic web search data centers. The power consumption of some large scale web search data centers has approached or exceeded the power limits of their existing facilities. Accordingly, some of these web search data centers have been moved to facilities that can access more electrical power.

As newer processors manufactured by companies such as Intel of Santa Clara, Calif. have provided faster processor clock rates, and multiple processor cores, speed has increased, but with the concomitant increase in power-consumption, heat, and cost. With the cost of energy on the rise, simply increasing a processor's speed and/or adding additional server capacity may not be the best solution to increased volume in search activities and others involving mainly parallel operations.

However, the ability to divide the search task into many pieces is somewhat unique to certain types of tasks, which require massive parallelism (e.g. simulation of brain circuits is also massively parallel). These algorithms often differ from the programs for which existing microprocessors have been optimized, namely those that involve serial dependencies of program steps, delivered through a pipeline. An example of a serial dependency would be where a+b=c, and c is needed to calculate f (e.g. e+c=f)—one must know c before calculating f. In the case of massively parallel algorithms, conversely, c's and f's are determined without regard to each other.

It is highly desirable to provide improved computer architectures and methods for providing and using such architectures that provide sufficient speed performance in large scale parallel processing data centers, while maintaining or reducing their power consumption. Such architectures should allow conventional software and operating systems to be employed where possible so that serial tasks are still available, but those tasks involving parallel operations can be achieved at significantly increased performance thereby reducing the burden to employ more numerous, and more powerful processors to expand capacity.

SUMMARY OF THE INVENTION

Various developments are presented in the present disclosure to serve one or more objectives, for example, reducing power consumption of parallel processing systems (e.g., in large scale parallel processing systems). Additional or alternative objectives will be evident from the description below.

The invention presented by the disclosure may be directed to a system (a single system or plural system), a method, computer-readable media (single medium or plural media), or any one or more subcombinations thereof, for example, in accordance with one or more of the embodiments described below. For purposes of this disclosure, system means system and/or computer-readable media (single or plural) and not a signal by itself.

In accordance with one embodiment of the disclosure, system may be provided which include a web page search node including a web page collection. In addition, the system may include a web server configured to receive, from a given user via a web browser, a search query including keywords, wherein the node is caused to search pages in its own collection that best match the search query. A search page returner may be provided which is configured to return, to the user, high ranked pages.

The node may include a power-efficiency-enhanced processing subsystem, which includes M processors. The M processors are configured to emulate N virtual processors, and they are configured to limit a virtual processor memory access rate at which each of the N virtual processors accesses memory.

The memory accessed by each of the N virtual processors may be RAM. In select embodiments, the memory accessed by each of the N virtual processors includes dynamic random access memory (DRAM).

BRIEF DESCRIPTION OF THE DRAWINGS

The invention description below refers to the accompanying drawings, of which.

DETAILED DESCRIPTION

Figure 1:
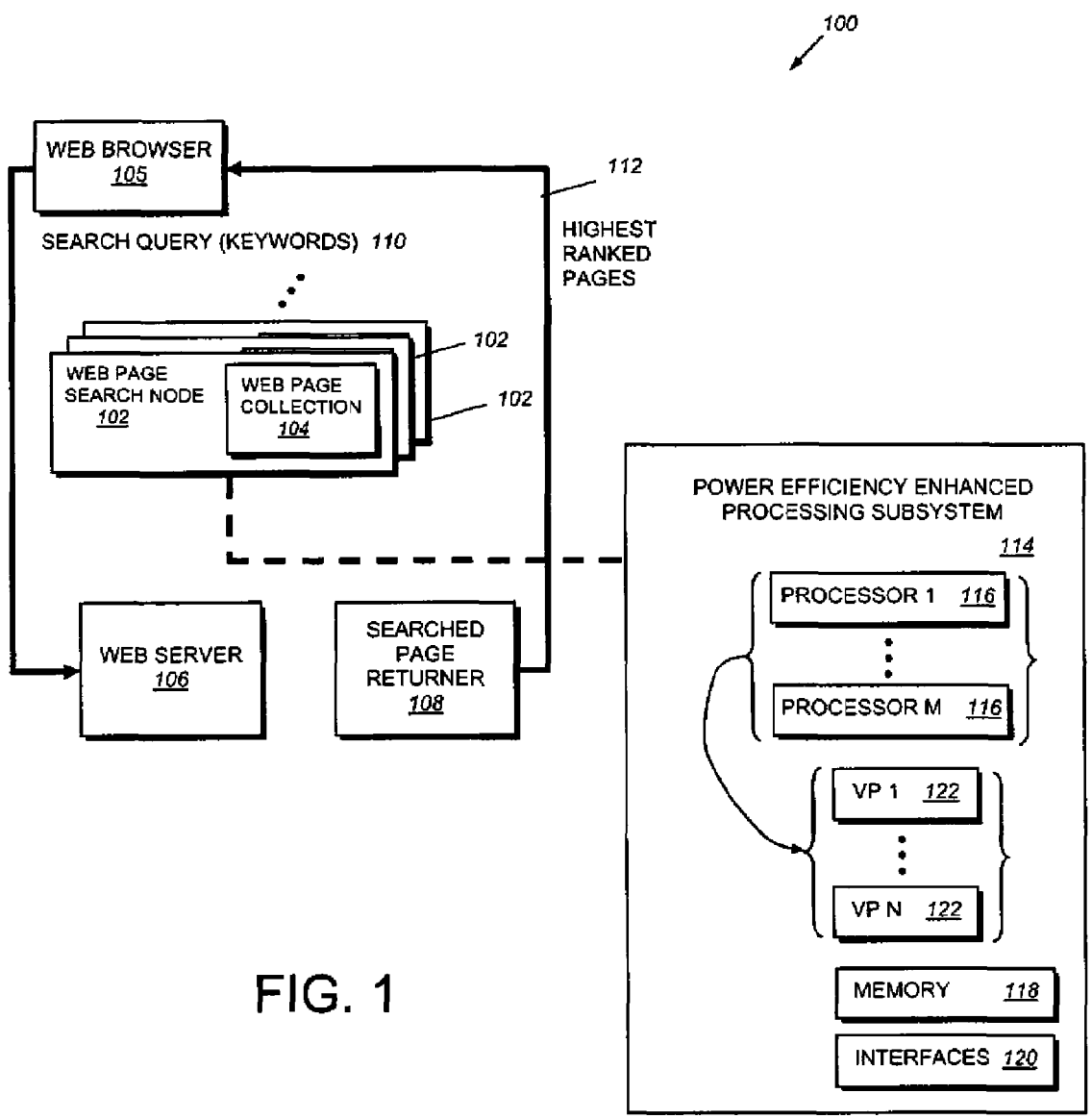
FIG. 1 is a diagram of one embodiment of web search system.

One embodiment of the disclosure is directed to a system, e.g., as shown in FIG. 1, or any one or more subcombinations thereof. The illustrative system includes a web search system 100 that operates in accordance with a conventional search request delivered by a client over a network, such as the Internet. The illustrative system 100 also includes a plural set of web page search nodes 102, a web server 106, and a searched page returner 108. In operation, a given web page search node 102 (and each of the others per this embodiment) includes a web page collection 104. The web server 106 is configured to receive, from a given user via a web browser 105, a search query 110 including keywords. The given node 102 is caused to search pages in its own collection that match the search query. The searched page returner 108 is configured to return, to the user, highest ranked pages 112. Those high ranked pages 112 may be among results that were brought together by a results bringer that is configured to bring together results from plural web page search nodes 102.

The exemplary node 102 is provided with a power-efficiency-enhanced processing subsystem 114. The power-efficiency-enhanced processing subsystem 114 includes M (physical) processors 116. The M processors 116 are configured to, together with memory 118 and interfaces 120, emulate N virtual processors 122, and the M physical processors, as configured, limit a virtual processor memory access rate at which each of the N virtual processors 122 accesses the memory 118.

In the illustrated embodiment, the memory 118 that is accessed by each of the N virtual processors 122 may include DRAM (embedded DRAM in a more specific embodiment). This memory accessed by the N virtual processors 122 may be "local" memory, i.e., memory on a same chip as processors 116 or connected in close proximity over a low-latency, low-power bus, interface, and/or network connection. More specifically, the memory accessed by a given one of the virtual processors may be local memory on the same chip as a processor 116 emulating the given one of the virtual processors 122.

In one embodiment, the integer number N of virtual processors 122 is equal to a multiple of M which is the number of processors 116. In a specific embodiment, N=kM, where k is an integer value. In certain embodiments, k=16.

The virtual processor memory access rate of a given virtual processor 122 may be defined as the rate at which one of a load and a store is performed by the given virtual processor 122. In terms of memory accesses per second, in embodiments herein, this rate is limited to a value well below a processor clock rate of one of the M processors 116. The virtual processor memory access rate may be approximately equal to or less than (M/N) multiplied by the processor clock rate.

In select embodiments, each processor 116 has a clock rate of 350 MHz, while each of the virtual processors has a clock rate (and accordingly a memory access rate) of 21 MHz.

In accordance with another aspect of the disclosure, the web page collection 104 for a given search node 102 may be divided into a number of small databases that can be searched in parallel. Specifically, in accordance with one embodiment, a given web page collection for a search node may include a shard, and that collection may be divided into a number of local DRAM-stored small databases, each of which is stored in a respective portion of DRAM (in memory 118) corresponding to a virtual processor 122.

A given processor 116 of the M processors 116 may be configured to emulate a set of virtual processors 122 by time slicing the given processor 116. More specifically, for example, each of the virtual processors of the set may support a thread, and the given processor may execute an instruction for a given virtual processor (of the set) during a given single cycle of the given processor, where the given processor executes an instruction for a next virtual processor (of the set) during a next single cycle of the given processor.

Figure 2:
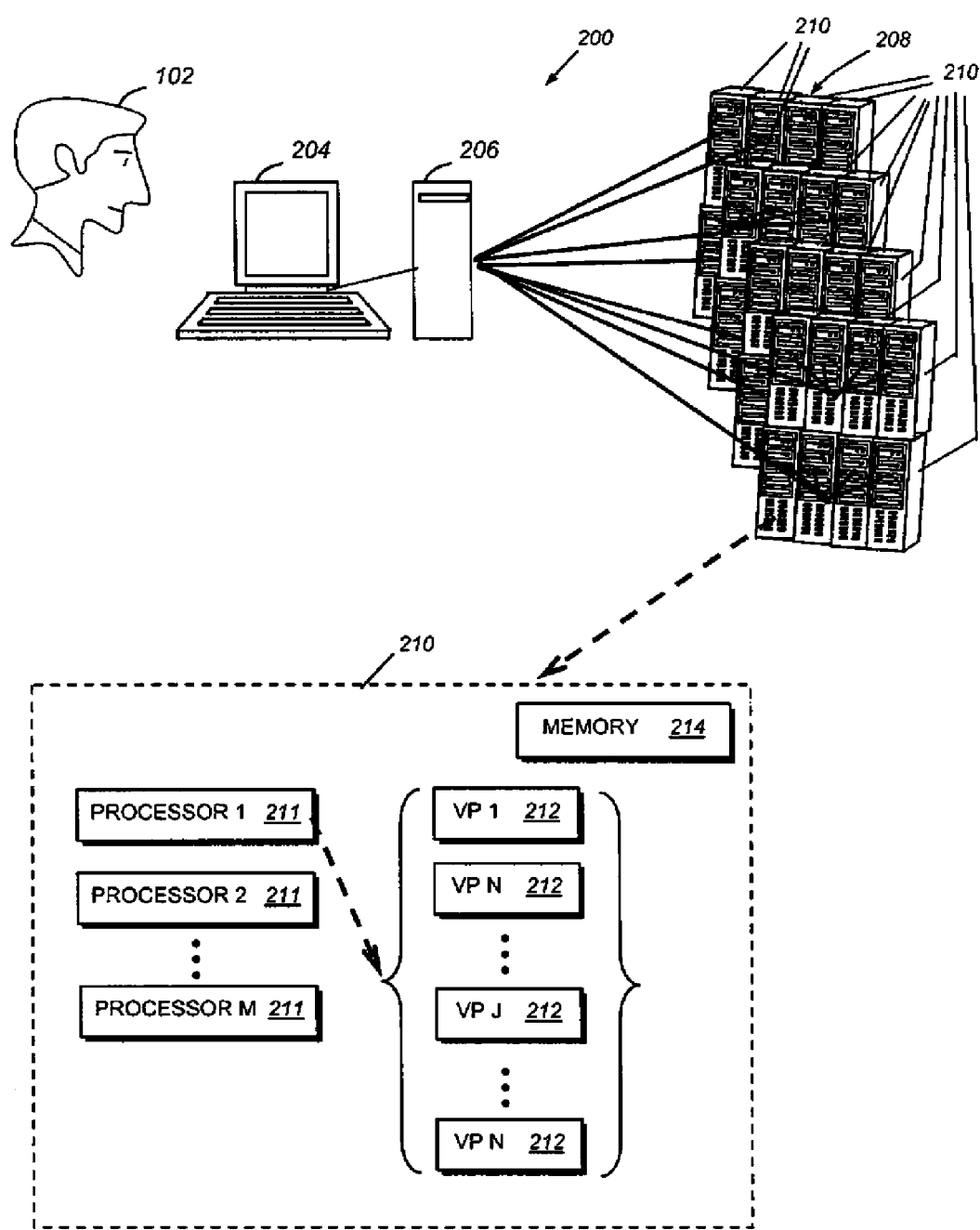
FIG. 2 is a block diagram of an illustrative embodiment of a web search system.

Another aspect of the disclosure is directed to a method, or any one or more subcombinations thereof. As part of the method, referring, e.g., to the web search system 200 shown in FIG. 2, a cluster 208 of web page search computers may be provided, including networked nodes 210. In one embodiment, a given web page search computer is used to implement a given node 210. At least one of the web page search computers 210 is replaced with one or more power-efficiency-enhanced computers. The one or more power-efficiency-enhanced computers collectively include M processors 211. The M processors 211 are configured to emulate N virtual processors, and they are configured to limit a rate at which each of N virtual processors accesses memory. In the embodiment of FIG. 2, an integer value "J" (k=J) of virtual processors is emulated by a given processor, which is PROCESSOR 1 in the illustrated example. M and N are integer values, and N is larger than M. In one variation of this embodiment, the memory accessed by each of the virtual processors 112 is DRAM, which has a larger capacity and consumes less power than SRAM. In a more specific variation, N equals kM, where k is an integer. In one example embodiment, k=16.

The M processors may be connected to each other via a network connection, for example, a gigabit per second (gbps) Ethernet network. In certain embodiments, the clock rate of a given one of the M processors may be s MHz, and the effective memory access rate of a given one of the N virtual processors 112 may be substantially less than s (e.g., approximately s/k MHz). In one embodiment, s=350 MHz, while k=16.

Replacing the web page search computers with power-efficiency-enhanced computers may be done by providing search processing cards, each of which holds a number of networked processors networked together, wherein each of the networked processors implements a number of emulated virtual processing threads. In the illustrated embodiment of FIG. 2, this number is J. In one embodiment, one search processing card includes 16 networked processors, and each networked processor implements 16 virtual processors.

Memory associated with given virtual processors may be embedded on the same chip as the processors emulating those given virtual processors. Alternatively, the memory may be on a dedicated chip separate from the chip holding the processors emulating the given virtual processors.

A group of less than N emulated processing threads may share a small low-power memory. This small low-power memory may, for example, be 1 MB. More specifically, this small low-power memory may be 1 MB of DRAM, which may be accessed at a lower rate, for example, at 170 MHz.

A given emulated processing thread may be assigned to a portion of the small low-power memory that is dedicated to the given emulated processing thread. Meanwhile, all of the threads in a group (i.e., implemented by the same set of one or more processors) may share a common portion of the memory that holds web page data.

Figure 6:
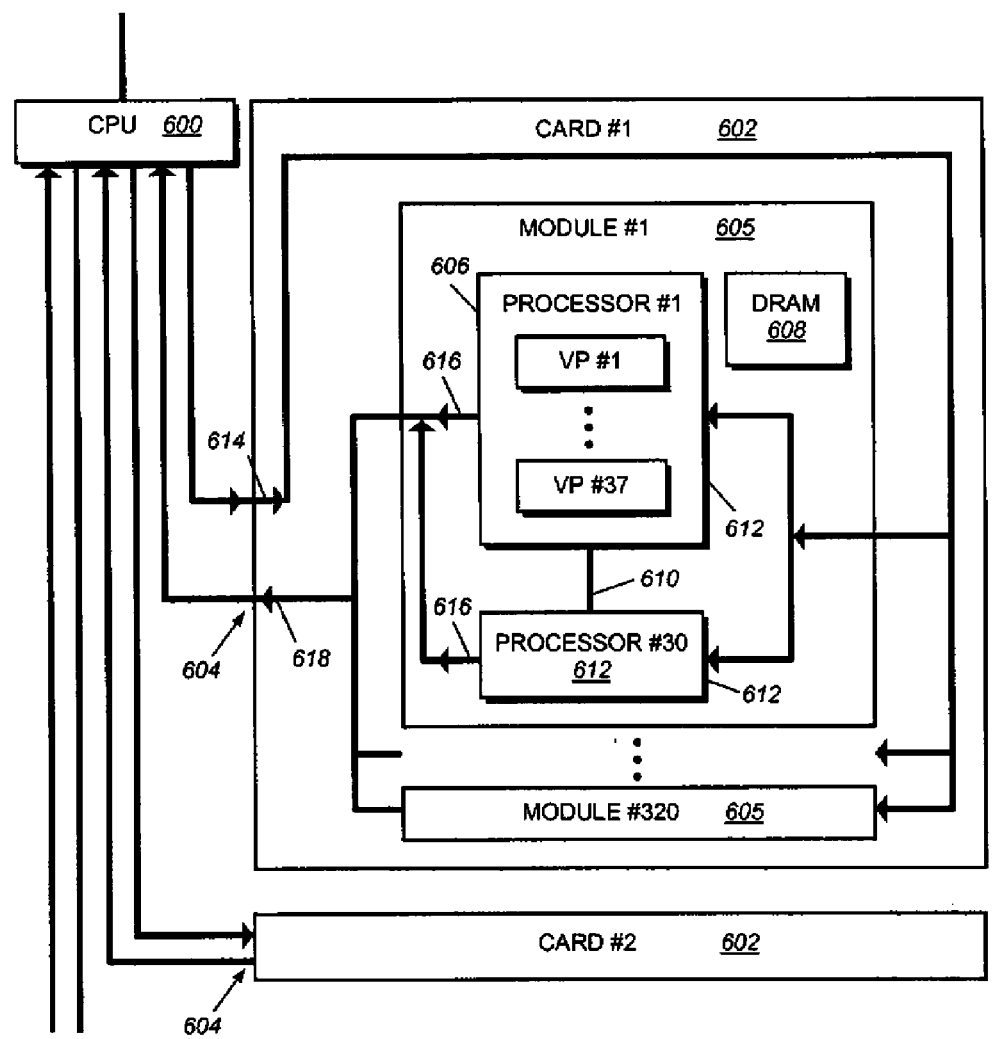
FIG. 6 is a block diagram of an illustrative embodiment of search processing system, employing search processing cards coupled to a central processing unit (CPU)

In accordance with another aspect of the disclosure, e.g., as shown in FIG. 6, search process system (or any one or more subcombinations thereof) are provided which include one or more search processing cards 602. A duplex interface 604 may be provided for each card, which is configured to connect the search processing card 602 to a central processing unit 600. The central processing unit 600 may serve as an intermediary to relay requests to the processors on each of the search processor cards 602.

In one embodiment, the search processor card 602 includes a plurality of processor 605. A given processor 605 includes a plurality of processor cores 606, DRAM 608, and a channel for communication among processors 606. In this embodiment each processor 605 is called a module, and is its own chip.

The processors may be configured in a pipeline to achieve a high instruction throughput per Watt.

A given processor 605 includes DRAM 608, a plural set (30 in the illustrated embodiment) of processor cores 606, and a channel 610 for communication among the processors 606.

Processor inputs 612 of each of the processors cores 606 are connected in parallel to an output 614 of duplex interface 604. Meanwhile, processor outputs 616 of each of processors 606 are connected in parallel to an input 618 of duplex interface 604.

A given card 602, for example, Card #1, may include a number of processors (one per module). In the illustrative embodiment, the number of processors equals the number of modules times the number of processors per module. As shown in the embodiment of FIG. 6, a given card 602 (for example, Card #1) includes a total of 320 modules, each module includes a total of 30 processor cores, and each processor core emulates a total of 37 virtual processors.

In accordance with one aspect of this embodiment, a given processor core 606 is configured to emulate each of its virtual processors by time slicing the processor. A particular processor may have a communication interface of 1.5 megabits per second, and accordingly output data at the same rate, resulting in a per module output data rate of 50 megabits per second average. If 320 modules are provided on a given card 502, the total output data rate for that module will be 16 gigabits per second, at the input 618 of duplex interface 604.

Each of processor inputs 612 may have a data input rate of 1.5 megabits per second average. Accordingly, for all of the 320 modules for a given card 602, the input data rate on average to each module may be 50 megabits per second. If 320 modules are provided in a given card 602, as shown, the total data rate at output 614 of duplex interface 604 is, accordingly, 16 gigabits per second (50 megabits per second times 320 modules).

The channel 610 within a given module (e.g., Module #1) connecting all of the processor cores of that module (for example, processor cores #1-30) may transfer data between processors at a rate, for example, of 16 gigabits per second.

Referring back to FIG. 2, in accordance with the disclosure of the above-incorporated-by-reference U.S. Provisional Application No. 60/974,713, a web search company may construct a supercomputer in the form of web search system 200 by networking together thousands of desktop PCs, each serving as a node. Each such node 210 may be assigned to a different set of web pages. When a user 102 searches for new keywords, each node 210 finds pages in its own collection that best match the query. Results from all the nodes are brought together, and the highest ranked pages are returned to the user 102 via a desktop 204 having a web browser.

Once a user types keywords into browser 204, those keywords are sent to a web server 206. Web server 206, in turn, sends the keywords to a cluster of computers 210, that operate concurrently or in parallel. Billions of pages may be searched in total, and the results may be combined to send the best results back to the user's browser on desktop computer 204 within a few hundred milliseconds.

As discussed generally above, in order to keep up with the increasing amounts of data that is being search on the Internet, and the increasing reliance of users on internet searching, given search companies are buying multiple clusters and distributing them across the globe. When data centers continue to run their existing systems, the search companies do not have enough electricity and cooling to upgrade their clusters by replacing old computers with the latest processors, for example, those available from Intel® and AMD® of Sunnyvale, Calif.

While processor speeds in a system using conventional processors may have increased, for example, from 100 MHz to several gigahertz, running processors at their higher clock speeds has also increased the amount of power those processors consume. In the embodiment shown in FIG. 2, the nodes 210 may be replaced with thousands of low-power slow processors, in exchange for a smaller number of high-powered processors per node. This would allow the search engine to run much faster while consuming less power overall.

Figure 3:
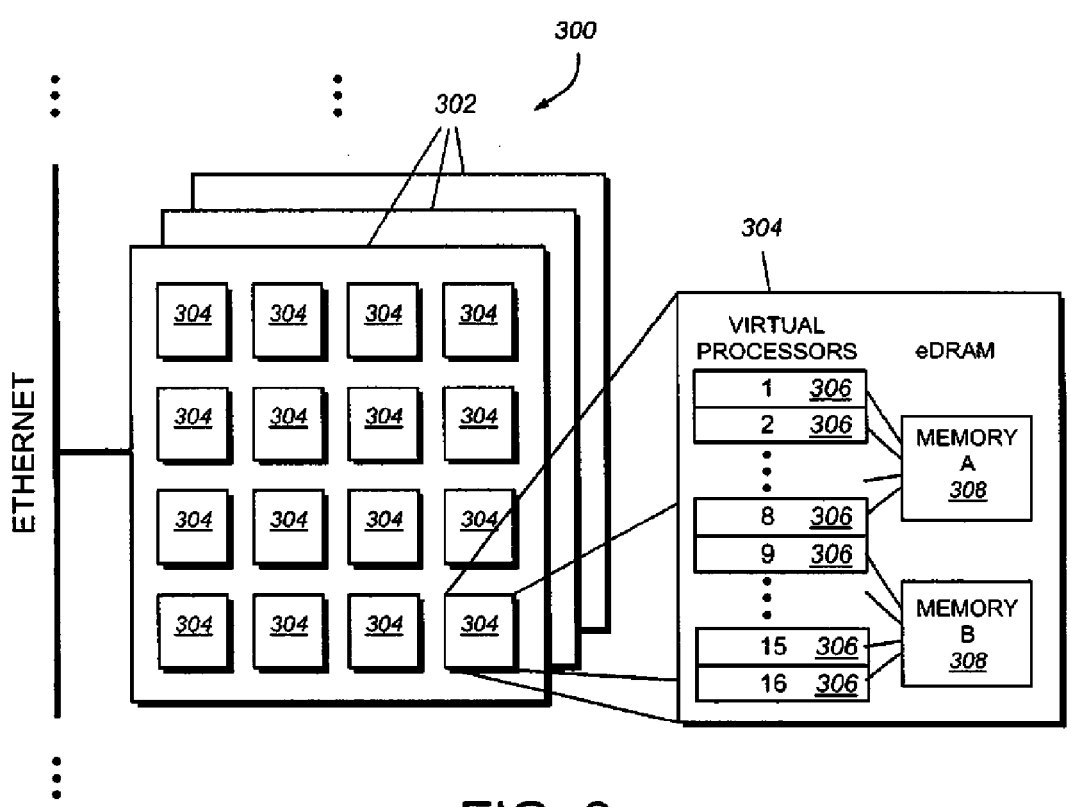
FIG. 3 is a block diagram of an illustrative embodiment of search processor system.

As shown in FIG. 3, search processing system 300 may be provided, which include many modules 302, each module 302 being implemented as a small flat computer chip approximately 150 square millimeters in area. In the embodiment shown in FIG. 3, search processing system 300 is shown in a disassembled form to show how subcomponents may be combined to form an entire architecture.

Each module 302 may contain 16 processor cores 304. In the embodiment shown in FIG. 3, each processor core runs at 350 MHz, resulting in an aggregate processing rate of 5.6 GHz for a given module 302. 16 times 21 MHz equals 336 MHz which is a value approaching the rate of each processor core which is 350 MHz.

In this embodiment, each processor core 304 is time sliced into 16 virtual processors, logically running at 21 MHz.

Time slicing in this way may provide a much longer time window for each virtual processor 306 to complete instructions. This amount of time is 150 times longer than that of some Intel CPUs.

This enables the use of slower or longer memory latency such as that provided by DRAM, which has a larger capacity and is more power-efficient at these larger capacities than SRAM of some CPUs.

In this embodiment, search processing system as shown in FIG. 3 may have 15 nanoseconds between logical cycles where the Intel Q9770 has only 300 picoseconds. The reduced memory access speed of virtual processors 306 as shown in FIG. 3 (of 21 MHz) also serves to prevent stalls, for example, that regularly occur with the Intel CPU.

Special instructions (IF-THEN) called code "branches" are common in web searches. This occurs when a search program checks whether a page has all the key words, and, if so, whether they are spread throughout the page or placed in the same sentence (indicating a better match).

In a given module 302 as shown in FIG. 3, processor cores 304 are laid out in the form of a matrix. The modules 302 are connected to a gigabit Ethernet network, so that million of modules can operate together. Each module 302 includes 16 cores, each running at 350 MHz. Each core 304 is time sliced into 16 virtual processors each running at 350/16=21 MHz. Each processor core 304 is provided with local memory (including memory A 308 and memory B 308 (each of which are eDRAM memory)). This allows a given processor core 304 to provide each of its virtual processors 306 with sufficient bandwidth (to memory) to allow one load or store per clock cycle.

In the illustrated example, each 170 MHz eDRAM supplies eight 21 MHz virtual processors 306. Power usage of a given search processing module 304 (including 256 virtual processors 306 in the illustrated embodiment) can be estimated by utilizing information from studies related to each subcomponent. Based upon some calculations, the power usage of the active processing cores 304 may be 600 milliwatts, while the Ethernet connection may consume 200 milliwatts, and the overall network hub may consume 200 milliwatts.

Memory can be embedded in the same silicon as each processor core 304, or alternatively put on dedicated memory chip that is placed in the same package. Such memory may consume, for example, 680-800 milliwatts during activity and very low-power at idle. Accordingly, it is estimated that the illustrated search process system 300 may consume at most 1.7 watts.

Actual tests of the 3.2 GHz Intel QX9770 estimate a power usage of 19.5 watts per processor core. Memory usage of that same core is estimated to be 6 watts during activity and 3 watts during idle.

Figure 4:
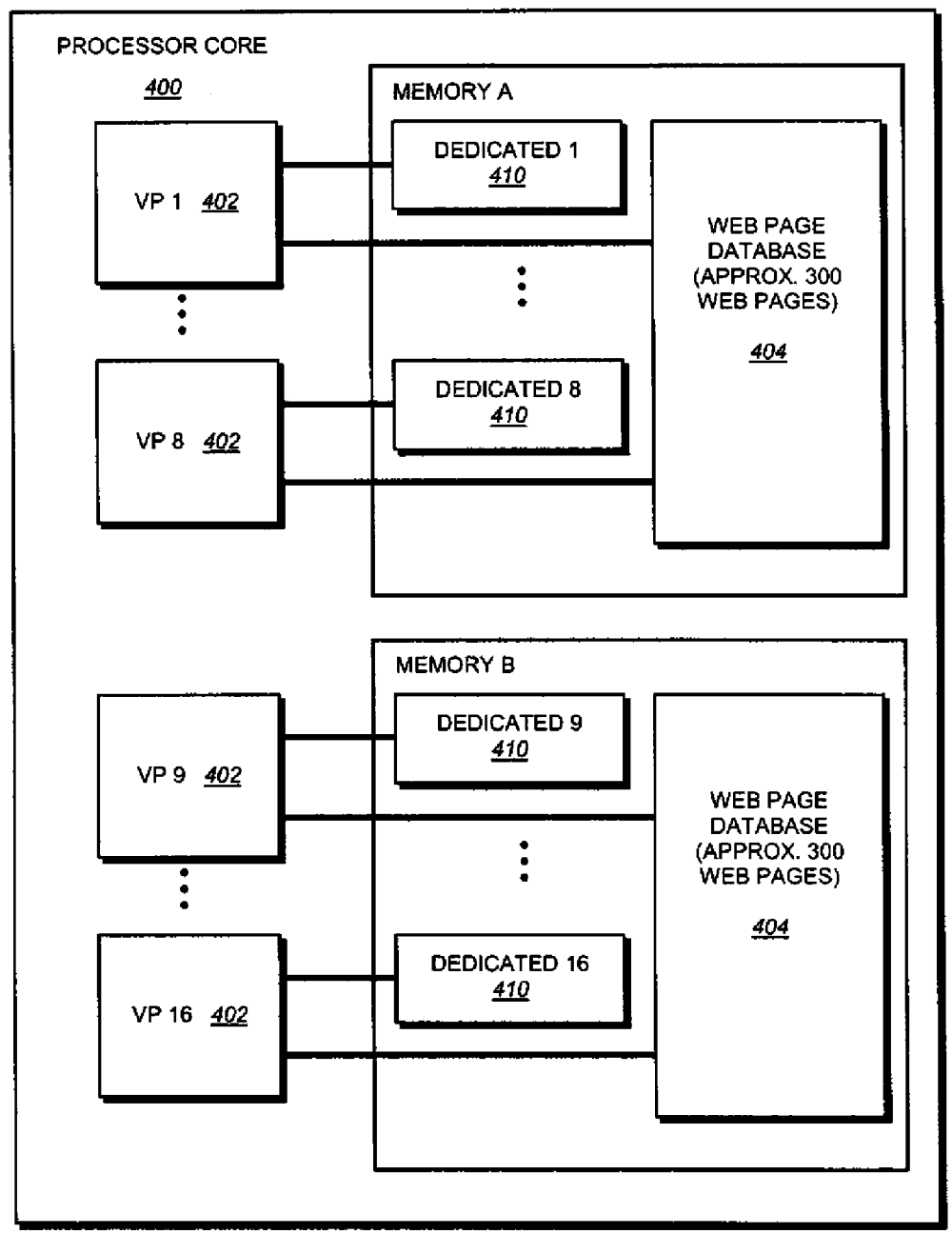
FIG. 4 is a block diagram of an further illustrative embodiment of a search processor core.

FIG. 4 shows another embodiment of a processor core 400 which may be provided, for example, on a search processing module 302, for example, as shown in the embodiment of FIG. 3.

The illustrated processor core 400 includes 16 virtual processors 402. A given one of the virtual processors, for example, VP1, is coupled to a dedicated portion (Dedicated 1) of memory A, and to a web page database portion 404 of memory A. Accordingly, in the embodiment shown in FIG. 4, half of the virtual processors of the illustrated processor core 400 (virtual processors 1-8) are coupled to a dedicated memory A, which in this embodiment comprises 1 MB of storage of an eDRAM memory unit. Meanwhile, the other half of virtual processors (9-16) are coupled to a dedicated memory B, which also comprises 1 MB of an eDRAM memory unit. The total eDRAM provided on processor core 400 is accordingly 2 MB.

Each virtual processor 402 accordingly is provided with a dedicated portion of its corresponding memory unit (memory A and memory B), and is also coupled to a shared web page database portion holding a portion of the web page database in that memory (memory A or memory B). In the embodiment shown in FIG. 4, the web page database portion of each of memory A and memory B includes approximately 300 web pages of data.

The embodiment shown in FIG. 4 may be designed for increased speed performance, at the expense of power savings. A total of 4 search processing modules, with a total of 16 processing cores per module, is contemplated for such a speed optimized search processing system. As shown in FIG. 4, each processor core 400 includes 16 virtual processors, for a total of 1024 virtual processors in this embodiment. Such a search processing system may be estimated to consume up to 7.2 watts for all 1024 virtual processors, which is about one third of that of an Intel CPU.

Each of the dedicated memories 410, e.g. Dedicated 1, shown in FIG. 4 may be implemented in the form of "stack" memory.

Figure 5:
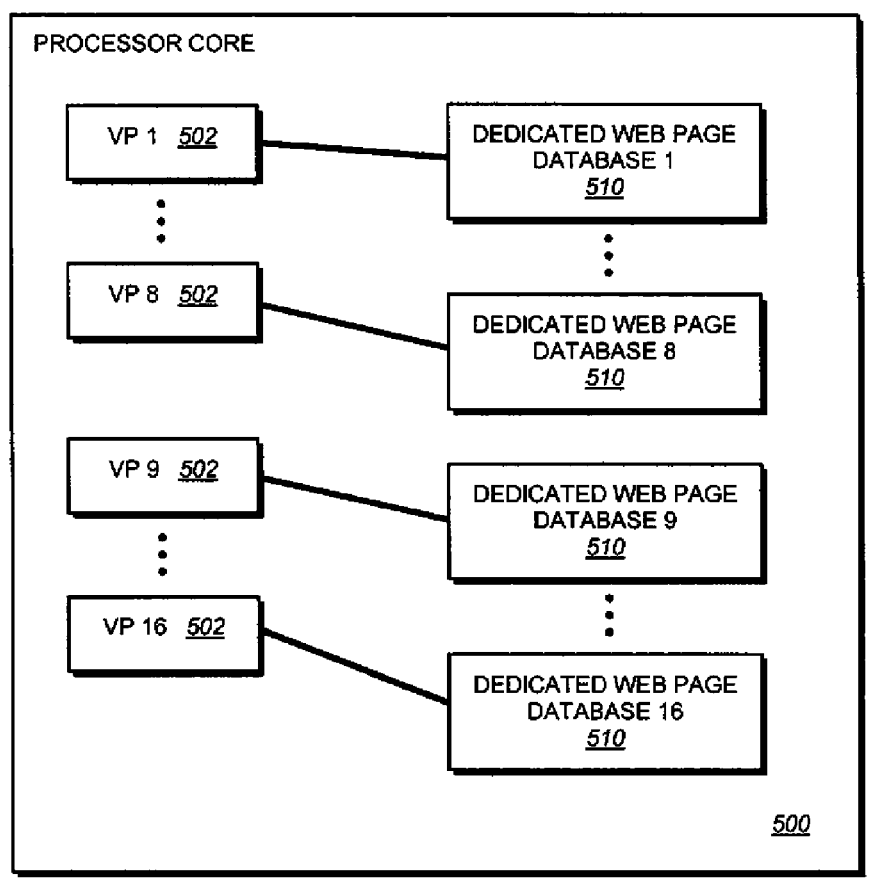
FIG. 5 is a block diagram of another illustrative embodiment of a search processor core.

The embodiment of FIG. 5 shows a processor core 500 that includes 16 virtual processors (VP1-16) 502, each of which is coupled to a portion of a memory bank holding a dedicated web page database 1-16 (510). Accordingly, virtual processor 1 (VP1) has a corresponding dedicated web page database 1, and virtual processor 8 (VP8 has a dedicated web page database 8. Each dedicated memory for a dedicated web page database, in this embodiment, is 2 MB, each of which holds approximately 600 web pages. This allows for a total eDRAM memory of 32 MB per processor core 500.

This embodiment is estimated to operate at a speed comparable to the Intel CPU at certain tasks, but utilizes much less power.

Figure 7:
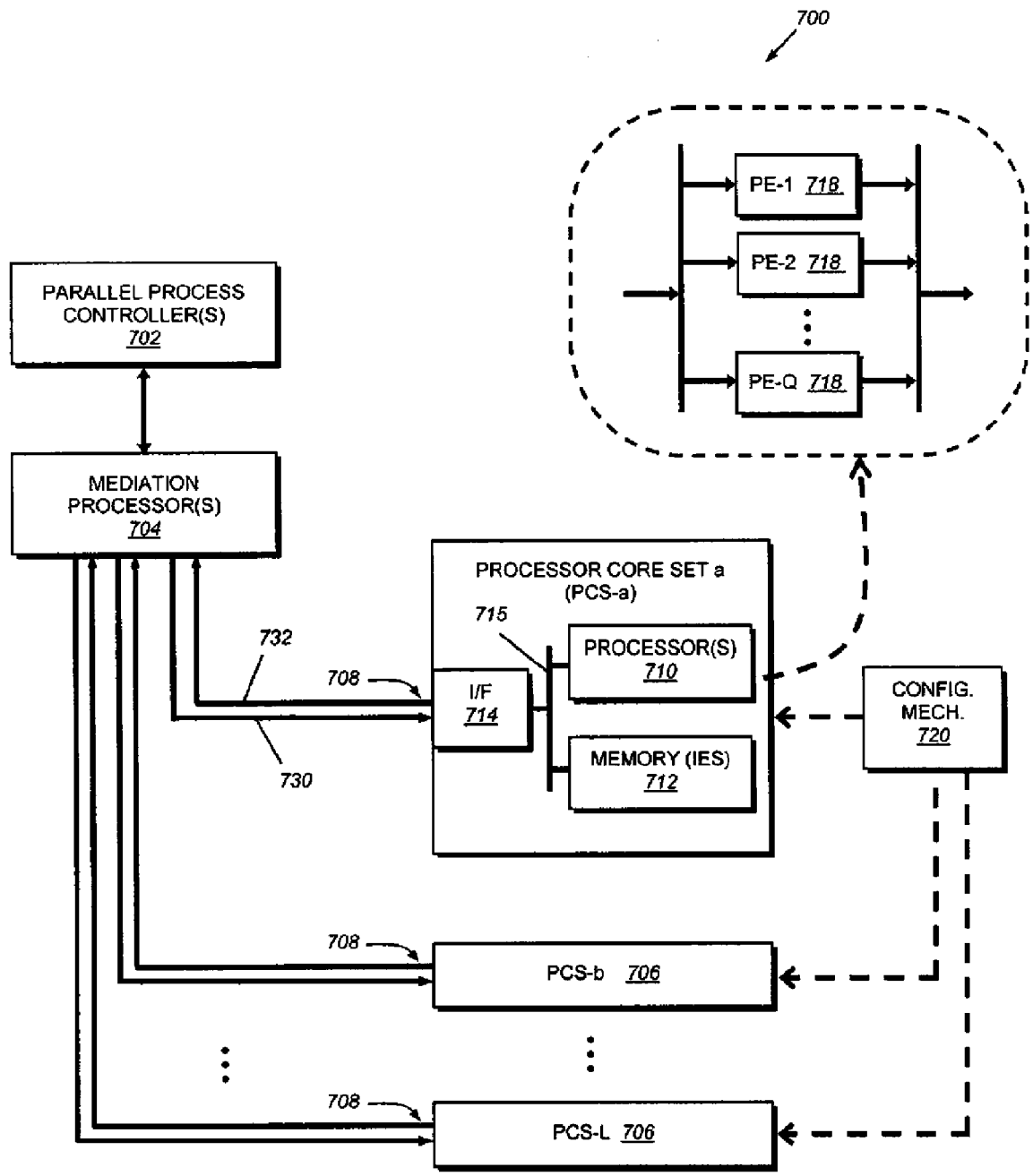
FIG. 7 is a block diagram of an illustrative embodiment of a low-power processing system which may be configured to be a web search system.

FIG. 7 is a block diagram of another embodiment of a low-power parallel processing system 700. The illustrated system 700 includes one or more parallel process controllers 702, and one or more mediation processors 704. A number of processor core sets (PCSs) 706 (a total of L) is provided, each PCS being coupled to mediation processor(s) 704 via a duplex connector 708.

In the embodiment of FIG. 7, each PCS, for example, PCS-a, also includes an interface 714, a local bus, network, or channel connections 715, one or more processors 710, and one or more memories 712.

The set of processors 710, memories 712, connections 715 collectively emulate or carry out the functions of a number of processing elements 718. As illustrated, the processing elements include Q processing elements, including PE-1, PE-2, . . . PE-Q. Each processing element 718 supports a processing thread. By way of example, a processing element 718 may be a virtual processor emulated by one or more of processors 710. Alternatively, a processing element 718 may be a given low-power actual processor 710. That is, a number of processors 710 may equal the number of processing elements 718, for a given PCS (processor core set) 706.

Processing elements 718 each have inputs and outputs. Each of the inputs of processing elements 718 for a given PCS is connected in parallel to an output 730 of a duplex connection 708, and each of the outputs of processing elements 718 is connected in parallel to an input 732 of duplex connection 708.

A configuration mechanism 720 may be provided, the functions of which may be carried out by one or more processors of mediation processor(s) 704 operating in conjunction with local communication channels and local memory thereof. Alternatively, configuration mechanism 720 can be carried out by a separate specially configured computer or general purpose computer, including a processor, memory, and local connections, to carry out the functionality of the mechanism.

Configuration mechanism 720 may be provided with configuration fields or switches, an input mechanism for controlling or changing the settings of such fields or switches, and an output portion for displaying the current state of such fields or switches. Accordingly a user can view the current configuration or modify the current configuration, for example which specifies how each processor core set (PCS) 706 is configured.

How each PCS is configured may be based upon, for example, the number of processors 710 and memories 712 that are allowed to operate within a PCS. For example, a given PCS may be provided with 100 processors and 50 memories, while only 20 of the processors of the given PCS and 10 of the memories may be allowed to operate, per how they were configured by configuration mechanism 720.

In the illustrated embodiment, a PCS 706 includes processors 710, memories 712, interface 714, and connections 715, all provided on a system-on-chip. Alternatively, processors 710 and connections 715 may be provided on one chip, while memories 712 may be provided on a separate chip, where there is a high-speed, low-latency, low-power connection between the chip holding the processors 710 and the chip holding the memories 712.

Another way in which configuration mechanism 720 can configure a given PCS (e.g., PCS-a) is by indicating the number of processing elements to be carried out by processors 710. For example, one processor 710 may be utilized to emulate a number of processing elements, the processing elements thereby serving as virtual processors. By way of example, a given processor 720 of a given PCS-a 706 may emulate 16 virtual processors respectively serving as the processing elements 718.

Figure 8:
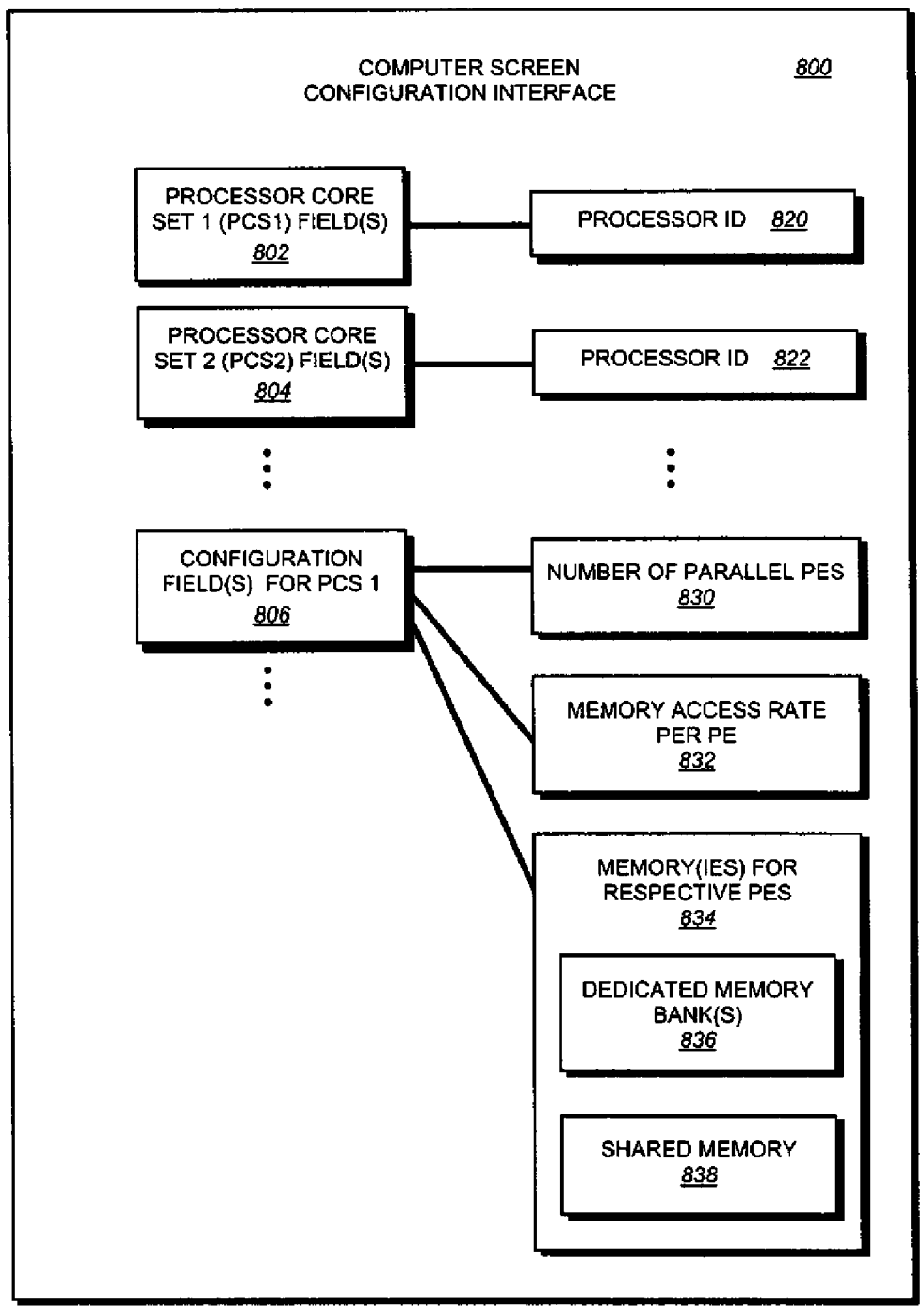
FIG. 8 is a schematic diagram of a computer screen, or portion of a computer screen, including a configuration interface.

FIG. 8 is a schematic diagram of a configuration interface 800 on a computer screen (or a portion of a displayed computer screen), which includes elements displayed on the computer screen and mechanisms (e.g., a mouse-controlled cursor) allowing a user to interact with those elements on the computer screen, e.g., to modify the manner in which information is displayed, and to input new data or other configuration information.

The illustrated configuration interface 800 includes a number of fields. Those fields may include, for example, one or more processor core set 1 (PCS1) fields 802, one or more processor core set 2 (PCS2) fields 804, . . . and so on. In addition, one or more PCS configuration fields 806 may be provided for each PCS.

Data associated with these illustrated fields 802, 804, and 806 may be provided in storage (memory or computer-readable media). Meanwhile, configuration interface 800 displays the data associated with these fields in the graphical tools (802, 804, 806, etc.) representing them. Accordingly, graphical tools 802, 804, and 806 allow input or changes to that data for their respective fields.

As shown in FIG. 8, inputs for the illustrated fields may include a processor ID input 820 corresponding to PCS1 field(s) 802, and processor ID input 822 corresponding to PCS2 field(s) 804. In addition, a set of various configuration inputs may be provided corresponding to the configuration fields for each PCS (PCS1, PCS2, etc.). These may include, e.g., a "number of parallel PEs" input 830, "memory access rate per PE" input 832, and addresses or other identifiers of one or more memories for the respective PEs 834.

Among the memory inputs 834, more specific inputs may be provided including inputs 836 identifying one or more dedicated memory banks, and identifying how those memory banks will correspond to particular PEs, and inputs 838 identifying shared memory and a configuration of the same, indicating how a memory may be set aside and shared among a particular set of PEs.

Each of inputs 820, 822, 830, 832, 834, 836, and 838 (and/or others not shown) may include graphical tools which are presented by a computer screen. Such a graphical tool may identify to the user types of data to be input, and present one or more values that are already input for the corresponding field or fields. Already input values that are presented to the user via the computer screen may include previously input values, default values, or values proposed by the configuration mechanism. A graphical tool further may be configured to receive via graphical user input, an input of data defining a configuration for a corresponding field or fields.

The processing elements (PEs) shown in FIG. 7 may be emulated by a given PCS (e.g., as different time slots of a given processor within the PCS), and the number of those emulated PEs could be varied dynamically. This could be controlled by one or more of mediation processors 704 and/or by configuration mechanism 720. Alternatively, the total number of PEs per PCS and/or for system 700 could be set to a fixed number, which could be a default number fixed by the system, or could be a number configurable by a user via configuration mechanism 720, e.g., using the configuration interface 800 shown in FIG. 8.

The one or more parallel process controllers 720 shown in FIG. 7 carry out certain parallel processes. In one embodiment, the parallel process controllers 702 comprise a search engine. In another embodiment, the parallel process controllers 702 comprise a financial analysis system that carries out a financial analysis method. The financial system could be a real-time financial analysis system. In addition, scientific applications including chemistry and protein folding can be the parallel processes. In another embodiment, they comprise a weather prediction system.

The embodiment shown, for example, in FIG. 2 includes a number of virtual processors carrying out a number of threads that are sufficient to remove the performance penalty for memory access latency when the processors are coupled with DRAM memory, and also to remove any need for pipeline flushes and branch prediction. In addition, the memory associated with the processors should have a sufficient number of banks and memory capacity within those banks, to provide higher memory access bandwidth including but not limited to one memory access per processor per cycle.

Power usage may be, in certain embodiments, optimized so that a low amount of power is need per megabyte and also so that a low amount of power is needed for per memory access. Connections between the local memory associated with processors 211 is preferably by low-power connections. Each of the low-power processors 211 may be connected to memory and/or to each other via a lower power on-chip network.

The total memory power usage and total processor power usage for a given node 210 could be made comparable to each other. For example, for a given node 210, the maximum or average power usage of the node's processors may be configured to be at a level close to a maximum or average power usage of the memory in that node.

The nodes (e.g., of FIG. 2) may be organized into node groups such that each node is a member of one group. Each group may be implemented in the form of an add-on card connectable to a standard interface of an existing PC. The node groups may be further organized so that multiple add-on cards could be used within one PC. See, for example, FIG. 6. All of the nodes in a node group may receive information from a common input bus.

A high capacity memory may be provided in a node, and associated with a particular group of processors. In one embodiment, this memory may be manufactured by using an optimized lithographic fabrication process on one die, while each of the processors associated with that memory may be manufactured using their own different optimized manufacturing process on their own die.

The chip dies of the processors and the memory associated with those processors may be joined together via 3-D (three dimensional) stacking.

The chip dies respectively for the processors and the high capacity memories associated with those processors may be joined by laying the dies flat side-by-side and connecting them to each other via very low-power connections in a package.

A given node, for example, node 210 shown in FIG. 2, may be further provided with a flash memory for seldom-used data storage.

The memory requested by the processors of a node (e.g., processors 211) may be requested in blocks of a size similar to the size of operands of a given processor 211. The memory may be requested in blocks of a size larger than the size of operands of a given node processor 211, to reduce the number of memory access and thus reduce power consumption.

Each of the low-power processors 211 may have an execution speed for a single virtual processing thread that is lower but more power efficient per memory access.

Each of the low-power processors may be further provided with an execution speed for a single thread that is slower but more power efficient per instruction execution.

The processors 211 may be optimized for high instruction throughput per watt by utilizing transistors optimized for low leakage current. The leakage current of the transistors may be decreased by increasing the proportion of time a transistor is actively switching and working toward instruction completion. The proportion of time that a transistor is actively switching and working toward instruction completion may be increased by increasing pipeline depth and further by increasing the number of virtual processors 212. In one embodiment, each of the processors 211 is configured to emulate a corresponding set of virtual processors by switching between each of its corresponding virtual processors in a round robin fashion.

A node 210 as shown in FIG. 2 may be further provided with a low-power implementation of instruction level parallelism (ILP) by bundling independent instructions into small groups at compile time.

A low-power implementation of ILP may bundle independent or dependent instructions into small groups at compile time. This may be done while masking any increased instruction latency or pipeline depth by adding virtual processors and by reducing the speed of all virtual processors so that their aggregate speed still equals the total real processor speed for the processor 211 corresponding to those virtual processors.

A given node 210, for example as shown in FIG. 2, may be provided with a very small low-power data cache on the same chip as the processors of that node. The virtual processors 212 that correspond to a given processor 211 may be allowed to communicate with each other (and/or to other nodes) via such a very small local cache.

Real-time applications may be executed utilizing fixed speed instruction throughput per virtual processors 212.

A node network, for example, as shown in FIG. 2, may be optimized for small communication buffers by utilizing a non-blocking low-latency switch. Such a node network optimized for low power may be further optimized by segregating nodes into hierarchically organized local groups.

A given high capacity memory provided on a node 210 may be optimized for low power usage during idle (standby) phases when no new memory accesses are made.

Figure 9:
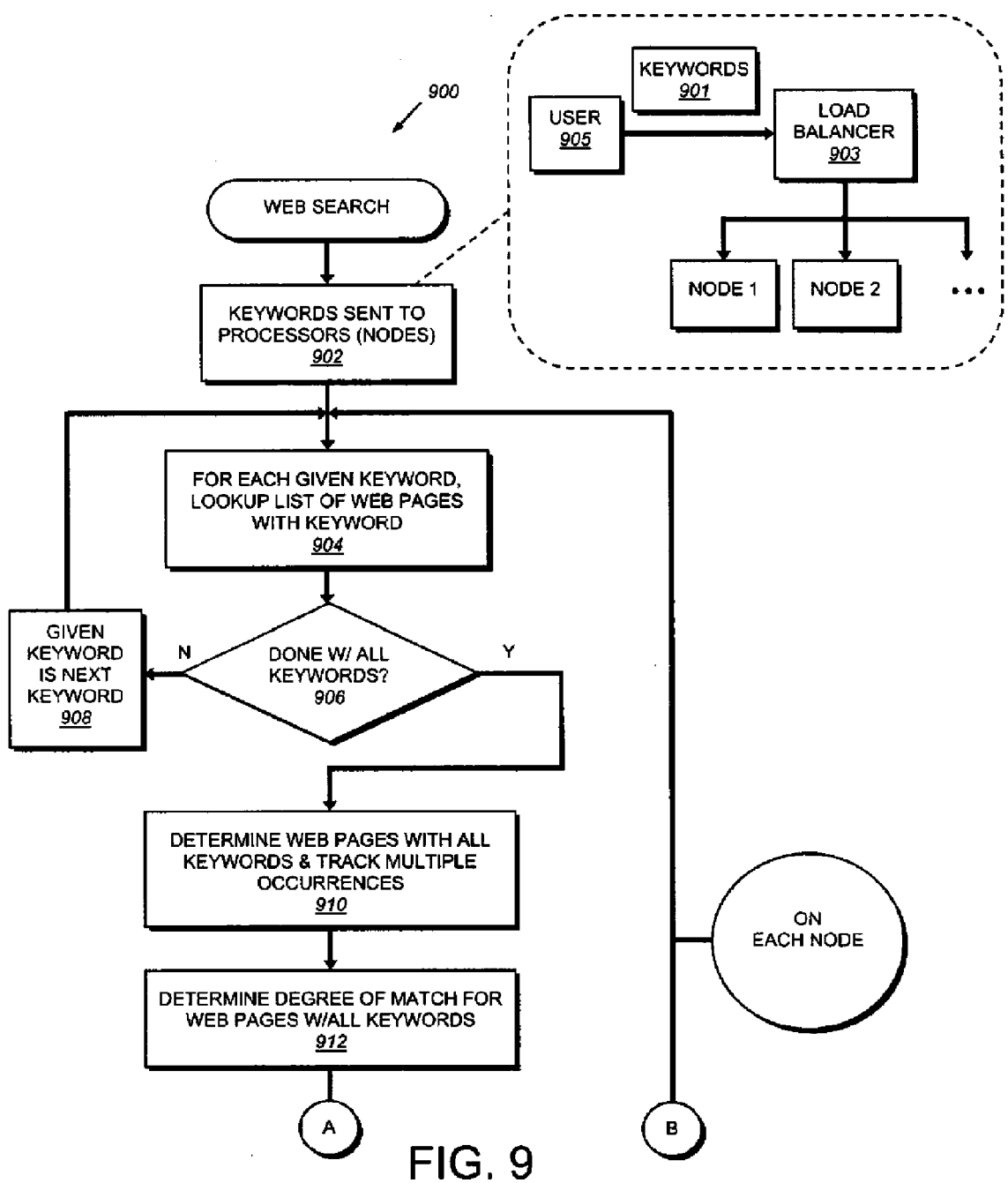
FIGS. 9 and 10 show a flowchart of an illustrative web search process.

FIG. 9 is a flowchart showing an exemplary search process 900, in accordance with the search process described in the above incorporated-by-reference U.S. Provisional Application No. 61/021,757.

In an act 902, keywords are sent by a user 905 to nodes in a web search system. The keywords 901 may be forwarded to each node via a load balancer 903, for example, as shown in FIG. 9. After act 902, on each node (i.e., each processor corresponding to a node), a number of acts are performed. These may include, within a set of web pages assigned to the given node, looking up a list of web pages for the current keyword. The pages looked up are web pages that contain the given keyword. This happens in act 904. In a next act 906, a determination is made as to whether a node is done with all keywords that have been sent by the user. If not, the process moves on to the next keyword at act 908, and returns to act 904, where the web pages with the given keyword are looked up.

Once all the keywords have been looked up, as determined at act 906, the process proceeds to act 910, at which point a determination is made as to the web pages having all keywords (e.g., the web pages in both lists that were obtained in act 904, where there were two keywords).

In embodiments herein, the process may keep track of each keyword's multiple occurrences in those web pages.

In act 912, a determination is made as to the degree of match for each web page that has all keywords. This may involve finding short sentence fragments that may contain all keywords in order. In addition, the process may take into account the "page rank" of web pages so that important pages are ranked (like CNN) higher than others. This portion of the process at act 912 may be computation intensive. This could be a limiting factor in bigger search engines, resulting in the purchase of more computers.

Figure 10:
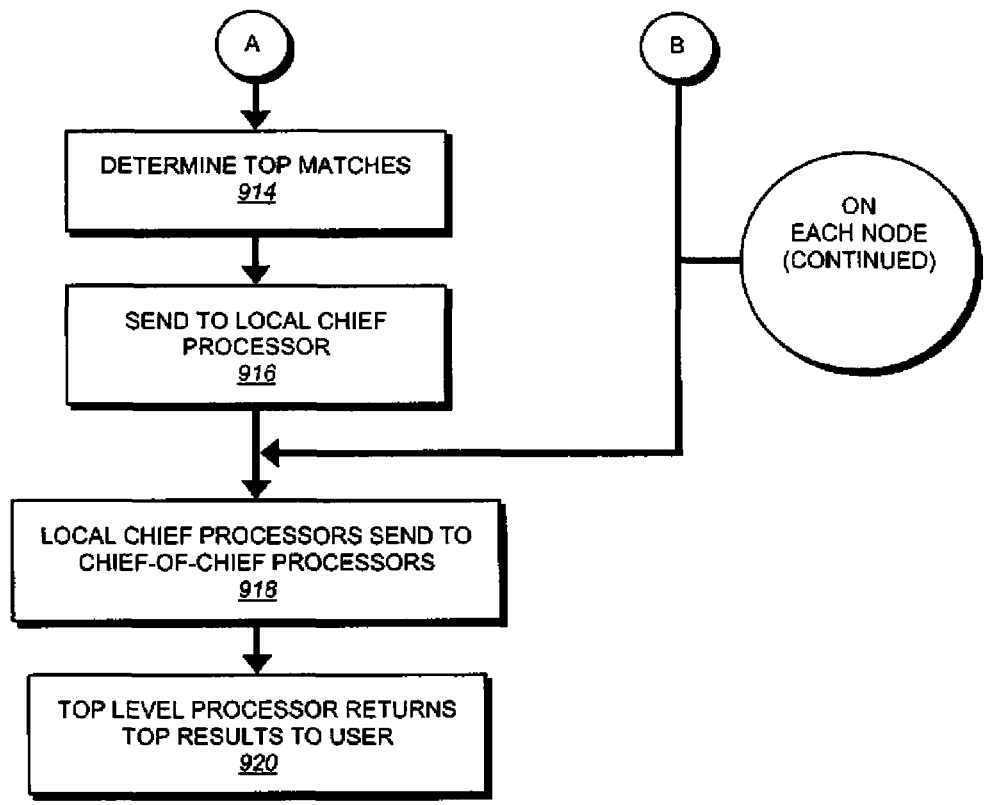

The process proceeds to act 914, which is shown at the top of FIG. 10. At act 914, for the current node, (a determination is made for each of the various processes connected in parallel), a determination is made as to the top matches, i.e., the top 10 matches in the illustrated embodiment. This process is similar for larger sets of results, and the costs increase linearly or sub-linearly for more results.

In a next act 916, the top 10 results for the current node are sent to a local "chief" processor that has been assigned to find the top 10 within several processor top results. For example, 10 processors may send 10 results to a single separate processor that finds the top 10 of those 100.

In a next act 918, the process may involve the local chief processors sending their top 10 results to "chief-of-chief" processors. This may be repeated as necessary, including the "chief-of-chief" processors sending their top results to a "chief-of-chief-of-chief" processor.

This hierarchy can be optimized so that communications bandwidth limitations are not reached.

In a next act 920, a top-level processor will return the overall top 10 results to the user.

Figure 11:
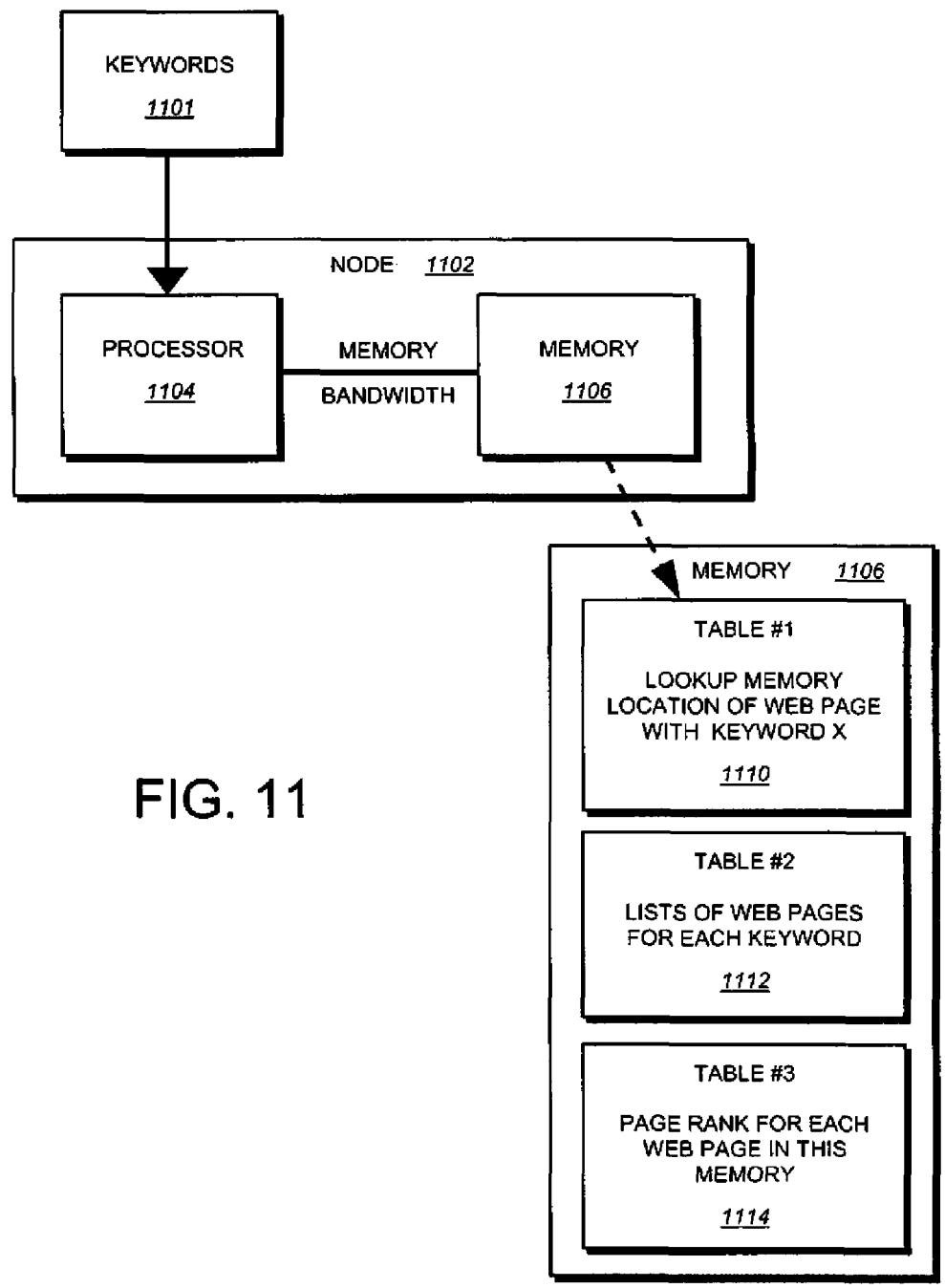
FIG. 11 is a block diagram of a given node of a search system.

FIG. 11 shows an example node 1102. Keywords 1101 are forwarded to a processor 1104 of node 1102, which is coupled to a corresponding memory 1106. In embodiments herein, processor 1104 is a virtual processing thread emulated by an actual processor, that has a corresponding portion of embedded eDRAM memory 1106, and that utilizes a certain maximum bandwidth to access that memory, managed by limiting the access rate of virtual processor 1104.

The memory 1106 corresponding to processor 1104 may include a number of tables (i.e., lookup tables), for example, Table #1 (1110), Table #2 (1112), and Table #3 (1114). As shown in the example of FIG. 1, Table #1 (1110) may include a lookup memory location of a web page with a keyword X. Table #2 (1112) may include lists of web pages for each keyword. Table #3 (1114) may include a page rank for each web page in this memory.

As noted above, a given virtual processor may be a thread supported by an actual processor emulating the virtual processor, where the actual processor executes one instruction for one virtual processor each cycle and automatically switches between virtual processors every cycle.

A given architecture may support a number of virtual processor threads, with the use of a smaller number of actual processors, where the virtual processor threads are sufficient in number to remove performance penalties for memory access latency and to remove any need for pipeline flushes and branch predictions. This becomes an issue when the virtual processors are interacting with slower memory including eDRAM, which has a high capacity yet consumes less power per megabyte than other types of memory.

The memory associated with the virtual processors should utilize a sufficient number of banks to provide a minimum memory access bandwidth including at least one memory access per virtual processor.

The memory may be coupled to the corresponding actual processors via low-power connections. These connections may be via a low-power on-chip network or bus.

The processor architecture may support a Harvard architecture for efficient storage and access of instruction memory. It may also be optimized for search engine support applications such as filtering out pornography, detecting cloaking sites, finding duplicate sites, assigning a priori ranks to respective pages, searching email, and serving dynamic web pages.

The nodes of a cluster may be organized into groups such that each node is a member of one group. The collocation of nodes within the same group may also be on the same modular piece of hardware; for example, the nodes of a particular group may all be on the same card, for example, in accordance with the embodiment shown in FIG. 6 and described above.

A modular piece of hardware, which may be a card as shown in FIG. 6, may be implemented as an add-on card to a PC that interfaces via a high-speed bus of the PC. The high-speed bus may be implemented as a PCI Express interface. The PCI Express interface may comprise a multiple lane PCI interface. The high-speed bus may more specifically be a PCI Express x16. In accordance with another embodiment, the PCI Express bus may be a PCI Express 2.0.

Nodes in a cluster may include a network of PCs, interconnected via a Gigabit Ethernet network. Each of those PCs may then include modular hardware containing processors coupled to that PC via a high-speed bus to the PC.

A cluster of nodes may also include a network of PCs interconnected via high-speed 10 Gigabit connections. The PCs may also be connected via a high-speed Infiniband connection.

A number of hardware modules, e.g., cards as described above and as shown in FIG. 6, may be interconnected via a high-speed connection. This may be done by installing all of those hardware modules in a bus structure of a given PC. For example, a number of PCs may be organized such that enough add-on cards are integrated into each PC, such that the total power usage of the entire PC is dominated by power usage of the add-on cards.

A layout of nodes of a cluster may be provided within a given module, such that air cooling is optimized. The layout of nodes within a given module may be optimal for water cooling via a water block.

The nodes within a hardware module may be organized such that all nodes receive information from a common input bus.

The nodes within a given hardware module (e.g., a card as shown in FIG. 6) may be networked together via an interconnect including, e.g., a Gigabit network, 10-Gigabit Ethernet, and Infiniband.

The node architecture may be designed such that each node contains a highest number of processors and a previously determined accompanying memory that will fit in a single chip die with the processors, or a number of such processors rounded to the next lower power of 2.

The node architecture may be such that each node contains two chip dies, where the high capacity memory is manufactured using its own optimized lithographic fabrication process on one die and the processors corresponding thereto are manufactured using their own optimized processes on their own die.

As noted above, if the processors and the corresponding memory are provided on separate dies, those dies may be joined together via 3-D (three dimensional) stacking. In the alternative, those dies may be joined together by lying them flat side-by-side and connecting them via very low-power connections in the same package.

A given node may be provided with flash memory for seldom-used data storage with no power cost.

The high-density memory may be implemented as DRAM.

The node architecture may be designed such that the memory is requested by a given processor, in blocks of a size similar to the size of operands of the given processor. The requested blocks may be of a size larger than the size of operands of the processor to reduce the number of memory accesses and thus reduce power consumption.

Per one embodiment, memory requests may be in blocks of 32 bits. Alternatively, in accordance with another embodiment, memory request may be in blocks of 64 bits.

The node architecture may achieve a parallel operation designation via a user indication of threads able to operate in parallel.

The overall system may be provided with a network bandwidth allocation for low-power via hierarchical connections. The hierarchical network bandwidth allocation may be such that the aggregation of search results is uninhibited.

The system may support high-speed communication between nodes via a high-speed non-blocking switch. Networking elements may be low-power relative to the power usage of the nodes being networked.

The node architecture may be designed such that the execution speed of any single thread corresponding to a virtual processor is about a hundred times slower than a typical commodity processor but about twenty times more power efficient per memory access than the typical commodity processor.

The system may be designed so that the node architecture has an execution speed for any given single virtual processing thread that is about a hundred times slower than a typical commodity processor but about 20 times more power efficient per instruction execution.

The architecture may be utilized for search processing such that elements being searched, such as documents, are assigned to particular virtual processors and stored within respective high capacity memories associated with those virtual processors.

The system may be designed so that the virtual processor receives a keyword and it searches for the documents that have been assigned to that virtual processor. When a thread sends the results of its search, it may send them to another proximal node (either on chip, or proximal within a hierarchical node network). The node may aggregate and filter results of several threads, reducing the total network bandwidth usage.

The architecture may be designed so that the search process uses aggregation which is recursive and hierarchical, so that a network of nodes will provide a final node with results aggregated from all other nodes.

The node architecture may be optimized for high instruction throughput per watt by utilizing transistors that are optimized for low leakage current.

The power consumed by a given system may be further reduced by not utilizing a dedicated floating point processing unit (FPU). However, it should be noted that an FPU may be provided as part of the architecture (and interconnected according to conventional techniques) where such functionality may be needed, such as in the case of a financial application.

In performing a search, search criteria may be sent to all virtual processors over an existing network. More specifically, a keyword broadcast or multicast mechanism may be provided in the network.

The broadcast or multicast feature may be implemented via time division multiplexing (TDM) of a shared bus.

The broadcast or multicast feature may be implemented via a statistical time-domain multiplexing of a shared bus such as Ethernet.

The search criteria may include keywords. The node network may be optimized for small communication buffers by utilizing a non-blocking low-latency switch. The network may be further optimized for low power by segregating nodes into hierarchically organized local groups. Those network groups may be provided with a path facilitating high-speed, intra-group communication. In addition, junctions may be provided between groups that allow groups to intercommunicate up to some fixed bandwidth limit.

Junctions may be provided between groups of groups that allow groups of groups to intercommunicate up to some fixed bandwidth limit.

The system may be provided with an additional hierarchical organization of network groups. A method may be provided for aggregating search results of multiple virtual processors such that the maximum bandwidth of any network junction is not exceeded during a maximum throughput of virtual processor document search.

An aggregation method including virtual processors sending a document identifier (ID) and a rank of the top X best matching documents, if any, to a local virtual processor that determines the top X best-matching documents from those multiple top X results.

The aggregation method may reduce bandwidth requirements of network junctions by only transmitting top X best-matching results out through any junction.

The system may be further optimized by utilizing such an aggregation method tuned to limit the input bandwidth required at junctions by reducing the number of sets of results being aggregated at any one stage.

The node architecture may be designed so that the total memory power usage and the total processor power usage are close to each other in practice by adjusting a processor-tomemory ratio according to benchmarks of the target application that take into account the lower power usage of cycles that do not make new memory accesses.

The total power usage may be optimized by tuning the node architecture according to benchmark performances or estimated benchmark performances of the target application and power usage or estimated power usage during those benchmarks.

The benchmark optimization may utilize web search as a benchmark. The system may further include optimized pipeline depth for a benchmark.

The power requirements for particular pipeline stages may be optimized during particular cycles that require less power due to the particular instructions or conditions of execution. The power tuning may be optimized by increasing benchmark performance-per-watt throughput by adding new processor instructions that would otherwise require multiple instructions to complete. The instructions may be implemented in addition to or as a lower power partial or whole replacement of super scalar architecture or simplified super scalar architecture.

The power requirements of the system may be optimized by increasing benchmark performance-per-watt throughput. This may be done by adding processor support and memory support for new processor instructions that allow access to multiple contiguous pieces of memory with a single processor instruction. For example, 64 bits may be retrieved from memory and stored in two 32 bits CPU registers that would otherwise require two processor instructions.

The system may also be optimized by increasing benchmark performance-per-watt throughput by adding processor support and memory support for queue registers that automatically condense multiple contiguous memory reads into fewer reads of larger blocks.

The system may further be optimized by implementing power saving measures during periods of non-peak server demand.

The system may be further optimized by increasing benchmark performance-per-watt throughput by adding processor support and memory support for sleep commands that power down real CPUs for small periods of time to eliminate power consumption except for DRAM standby consumption.

Tasks may be switched when demand for a current server task is low, such as during a non-peak period of server requests. The processor architecture may further comprise support for a very light weight operating system. The processor architecture may further support a non-preemptive operating system. The system may be further provided with an ability to swap in and swap out current program data stored in high capacity memory from or to high capacity storage. The high capacity storage may be implemented on chip, stacked, or in side-by-side flash memory. The high capacity storage may be further implemented as network attached storage.

Network attached storage may be implemented using a local hard drive.

A method for sending search criteria to the virtual processors may use keyword communication pruning. Such pruning would involve determining which ones of a collocated group of nodes, processors, or virtual processors do not contain any documents that meet the search criteria. Such nodes, processors, or virtual processors would not have any keywords sent to them, when none of their documents contains any of the searched keywords.

A process may be provided for tuning the architecture from benchmarks or simulated benchmarks such that the next architecture revision has optimized the keyword pruning method by optimizing a pruning branching factor for an expected real-world impact of different pruning branching factors.

The system may be further provided with a mechanism for utilizing a reduced memory access method via processor and memory support for one or more "queue registers." The registers may support a method "pop" that retrieves a next memory value in a sequence containing contiguous memory reads. Implementation of the "pop" instruction involves only accessing memory to retrieve the memory value that was not recently retrieved in a previous memory read involving multiple values.

The system may employ contiguous memory reads to improve performance-per-watt. For example, when searching through lists of documents to determine documents that contain two or more keywords, contiguous memory reads may be used to read each list of documents from memory.

Contiguous memory reads may be used to iterate through lists of keyword occurrences found in the same document. This may be done to determine clusters of query keywords or in-order clusters of the query keywords by using the contiguous memory reads to read each list of word occurrences from memory during processing.

The system may further involve a processor instruction set that allows sub-byte addressing of memory via a retrieval of adjacent memory values that contain a portion of the requested memory, appropriate shift operations on those values, and an appropriate logical OR operation.

A list of web pages and word-indices may be stored and accessed within those web pages via a reverse-index hash table using an optimized storage and addressing method.

The instruction set for a process may include an instruction able to translate an integer representing a key word into the first memory address in a reverse index hash table that might store the key and a value-pointer for that keyword.

The instruction set may further include an instruction including a conditional memory read that reads from one of two designated memory locations, and stores the value in one designated register based on the condition.

The instruction set may further include an instruction holding a conditional memory read that reads from one designated memory location (or register), and stores the value in one of two designated registers based on the condition.

The instruction set may further include a conditional memory read from one of two designated registers, and stores the value in one designated memory location based on the condition.

The instruction set may further include a conditional increment that increments one of two designated registers based on the condition.

The instruction set may further include functionality of two conditional instructions such as a conditional increment and a conditional memory read.

The instruction set may further include an "unlikely branch" instruction that requires low overhead when combined with other instructions in compile-time superscalar instruction groupings at the sacrifice of not completing other instructions in the grouping if the unlikely branch is taken, whereby unlikely branches such as loop exits require less power and/or silicon resources.

The instruction set architecture may be optimized to reduce a number of bits required per instruction by constraining the usable registers e.g., by constraining two operand registers to be contiguous.

Documents may be allocated to virtual processors such that the load of document searching is balanced across virtual processors, for example, by verifying the documents that are frequently found in searches are spread out among the virtual processors.

The virtual processors may be provided to aid other local virtual processors that are over burdened with the demands of query processing due to a temporary unbalanced load.

The aiding of other virtual processors by given virtual processors may include a virtual processor accessing another virtual processor's assigned memory during cycles that the memory is not being accessed by its assigned virtual processor.

The system may be optimized so that a low amount of power and silicon of shared memory access are utilized by using a program architecture, such that memory accesses are rare and are only performed when virtual processors are attempting to reduce the load of an overburdened virtual processor.

Less power and less use of shared memory may be maintained by allowing the aiding virtual processor to stall while a memory access is unavailable.

Less power and less use of shared memory may be maintained by programming virtual processors utilizing register buffers to reduce the number of memory accesses.

The parallel process that is implemented by a given cluster may include real-time financial prediction, forecast, or trading analysis. The program performed by the parallel processing system may include real-time analysis of sensor networks including prediction, analysis, and threat assessment of natural disasters such as tsunamis or hurricanes.

The parallel execution of network routing tasks may include sophisticated multicast network support requiring high capacity memory to store routing data and high memory access throughput to determine the route.

The architecture may be designed to run high-performance applications, such as those normally requiring a conventional desktop processor, on mobile devices including cell phones. The applications may run within the power envelope of these devices.

The process may be applied to efficiently perform physics simulations including video game physics acceleration or protein folding.

The parallel processing may involve high-performance graphics calculations including high resolution 3D rendering.

The parallel processing may include generic server applications including dynamic web page serving.

The process performed by the parallel processing system may include database operations including but not limited to SQL statement execution.

The parallel processing may involve transmitting and receiving of radio signals for information exchange. The parallel processing may involve reconstructing bits from missing bits in a probabilistic and propagational manner such as Bayesian network coding. Such a process may be executed with mobile devices including low-power wireless communications.

The parallel processing may involve database operations including law enforcement and investigative support databases. The parallel processing may involve searching for fingerprint matches, criminal face matching, and image reconstruction from noisy video from database searching.

The parallel processing may further involve surveillance using sensor networks including larger rays of cameras monitored for particular patterns such as movement of people, including face recognition of persons not allowed on the given premises. Such a process may involve a touch system for use in banning members from casinos.

Per another embodiment, the virtual processors, e.g., VPs 306 as shown in FIG. 3, may serve as a small server for a search engine. By way of example, such virtual processor servers may be run at approximately 15 MHz accessing 200 kilobytes of memory which can perform their search engine operations. These small servers would search smaller sets of web pages.

This use of virtual processing threads facilitates the use of a smaller processor speed of power-efficient processors which reduces the power usage and decreases the difference between memory latency and processor speed. Another advantage is that it allows a user to designate a sufficient amount of parallelism (for example, enough threads) and hardware support for all the virtual processors, in order to increase the delay between instructions executed on the same virtual processor.

Accordingly, a processor pipeline can be implemented that never needs to be flushed due to a dependency or branch miss prediction, and that never stalls while waiting for memory when using a bank assigned to that virtual processor.

High capacity memory storage can be achieved by hard drives, which can be used in addition to or instead of the DRAM memories associated with the virtual processors. Hard drives have approximately one hundred times the storage capacity per dollar as DRAM memory. However, accessing information on the hard drive is orders of magnitude lower in bandwidth (tens of megabytes per second instead of gigabytes per second) and higher in latency (milliseconds instead of nanoseconds).

In a more specific variation of this embodiment, a PCI express card or a small group of such cards (for example, three) may be plugged into the available slots of a typical ATX computer motherboard. Many servers may be outfitted with these devices that are about twenty times more power efficient at search than existing systems. Each PCI express card may be outfitted with 90 two hundred and fifty square millimeter chips, each chip serving as a node, lying side by side on one large printed circuit board (PCB).

These chips may be networked together using, for example, gigabit Ethernet or Infiniband. All of the chips may be connected to one or a few switching chips that receive connections from many node chips. The switching chips may also conduct communication over a PCI express bus.

In this embodiment, referring to FIG. 3, 90 nodes are provided on a given module 302 (a single printed circuit board), and they are implemented using embedded DRAM for memory. Memory is provided on each processor core, on the same die as each processor. The eDRAM may be optimized for low-power per memory access. For example, 8 megabit banks may be provided in 90 nm technology at 166 MHz using 32 bit or 64 bit words occupying approximately 3.25 millimeters squared of area, and using approximately 25 milliwatts during active use and about 1000 times less during standby.

Two of these banks may be provided on a given processor core 304, and the associated processor may have a clock rate of approximately 333 MHz, which would require a use of about 0.5 millimeters squared of silicon area and consume about 40 milliwatts of power in 90 nm technology.

Therefore, 32 processor cores configured in this manner along with 64 banks of eDRAM may fit in less than 250 millimeters squared of chip space, while consuming approximately 3.7 watts.

The processor cores of this set of 32 may communicate with each other over a shared bus, e.g., that can be adapted to communicate off-chip messages via a conventional networking arrangement such as Infiniband or a gigabit Ethernet.

Each 333 MHz processor of such an embodiment would include sufficient logical processors (for example, virtual processor threads) to hide memory latency and pipeline depth.

When using eDRAM in a five stage pipeline, the pipeline significantly contributes to the number of desired logical processors per regular processor. Ten virtual processors operating logically at 33 MHz each may be implemented by each real 333 MHz processor. Ten virtual processors are referenced in this example because this number relates to the exemplary number of stages in the pipeline—and this is one factor in the number of virtual processors provided. For example, in the case of a 5-stage pipeline, there would be provided 5 virtual processors (each operating at 66 MHz to total 333 MHz in this example) to hide the pipeline stages. However, in the case where the total memory bandwidth (in this case 333 MHz provided by two 166 MHz banks) is equal to the total number of virtual processors (the most efficient case), the number of virtual processors should be divisible by the number of memory banks (otherwise the respective threads are not interleaved properly). It follows that, because 5 is not divisible by 2, and the arrangement requires at least 5 virtual processors to hide the 5 pipeline stages, then 6, 8, 10, or more, virtual processors can be employed. Six processors would be the desired choice if the goal is to reduce the amount of registers required by the architecture (since each virtual processor requires its own set of registers, and these registers have a constant power cost). However, using at least 10 virtual processors allows insertion of additional waiting stages, lengthening the number of stages between the beginning of a memory access and the time at which the result is expected, thus supporting higher latency memory.

In this implementation, each processor would have access to memory each cycle. Each group of five processors may use the same memory bank in one embodiment, and share this memory, since there would be no power efficiency penalty for doing so. The processors could execute multiple compile time group instructions, while no out-of-order operation or speculative execution would be performed.

A given PCI express card may be implemented so that it is double its width to allow sufficient space for air cooling, or water cooling if preferred. Depending upon thermal constraints, heat sinks may be attached to each node module. The cooling system that may be provided may include a vacuum that sits outside the computer case and sucks air out of the computer case with a high CFM fan. Openings in each card may be provided so that air flows from the far end of the PCI Express card toward the vacuum opening. Voltage regulators may be provided, and placed together in a location on the printed circuit board with sufficient air flow, which may be controlled by an inlet design.

A given PCI Express card can be connected to another with a cable connecting the switching chips. This would allow for efficient communication between the cards and reduce bandwidth requirements to the connected motherboard's PCI Express.

The cards may also communicate with the host PC's processor (e.g., in a format as shown in FIG. 6, where the host processor includes a moderating CPU 600) individually via their PCI Express connection, currently up to PCIe x16.

Many servers (virtual processors each act as servers in this embodiment) may be implemented with cards in this manner to achieve a higher throughput than servers that are not implemented with search accelerator cards.

Alternatively, cards can be inserted into their own chassis and remain unconnected with a host PC directly, instead of connecting the cluster network directly via their switching chips. This would remove the power and cost overhead of the PC.

Each virtual processor module may read input from the network and perform searches on its assigned documents using the input keywords. With this specific embodiment, power usage for three cards may be on the order of 330 watts each, and approximately 1000 watts total. This is within a power footprint of a high-performance personal computer with a 1600 watt power supply. Meanwhile the power requirements can be reduced by two search cards per server instead, allowing for the use of a more power efficient power supply that is perhaps only available at a reduced capacity (for example, 1200 watts).

A system may be designed and implemented using low-power, or under-clocked processors. This would allow processors to not have to support a virtual processor mode and would be power efficient as long as power scales down approximately linearly with clock speed. Thus, by way of example, instead of using a 300 MHz processor to implement six 50 MHz virtual processors (to negate memory latency and pipeline performance barriers), six real processors running at 50 MHz can be used.

Memory latency and pipeline dependencies may hurt performance when virtual processors are not used. The memory latency problem can be combated by using relatively low-latency eDRAM and underclocking the processors even more (and adding more virtual processors to compensate).

The parallel processing that may be performed by a cluster of nodes, as described herein in various embodiments, could include financial data analysis or pattern recognition. Real-time market prices and financial and economic data can be streamed to the processors, possibly aided by a network multicast or broadcast function in cases where analyses performed by several proximal processors use the same input data.

Many different financial data pattern recognition algorithms can be used, and each financial data pattern recognition algorithm can operate on different input data in order to find patterns that are most suggestive of market actions such as buying or selling stock. These algorithms can be derived from historical data, and the likelihood of a successful action can be estimated. Even the error of this estimate can be calculated to determine the risk of a particular market action.

By utilizing some of the concepts described in various embodiments here, more patterns can be searched for in such a financial or economic data system, and many more stocks can be analyzed in real-time. In addition, the workload of processors may be decreased by increasing the number of nodes and spreading the workload over the entire cluster of nodes. In this case, it is possible for the novel architecture described herein to reduce latency of market actions by decreasing the number of serial operations that must be performed before an action can be selected. Decreasing this latency improves the probability that the market action will go into effect before competitors react and change market conditions, thus changing the probability of success or failure of the selected market action.

Reducing the latency required to perform an action, or increasing the amount of analysis performed on real-time stock price and market data input, reduces risk of market action. This can dramatically change the risk-reward ratio in which current market decisions must be made.

Depending upon the type of data analysis algorithm performed by the parallel processing system, the high capacity memory can be increased or decreased. For example, if the algorithms are highly computation intensive but require very little memory, the architecture may be optimized to use less high capacity memory and more processors, increasing the proportion of total power dedicated to computation. If the algorithms use fewer accesses to memory, then the architecture can be optimized by reducing memory bandwidth and optimizing the memory to consume less power relative to processor power consumption.

For certain financial algorithms, a large benefit may be achieved by maintaining a log of the recent stock price. If larger logs support more accurate market decisions, then increased memory capacity may become a high priority. The decision to increase memory capacity per virtual processor must be weighed against the advantages of simply adding more nodes.

When the architecture is balanced, the power usage of the network, processors, and memory are all relatively similar to each other, then an optimal allocation of resources delivers at most three times more performance per watt. Therefore, utilizing the architecture's general balance of power allocation will still deliver vastly superior performance compared to existing architectures while the architecture continues to be optimized.

Newly derived financial pattern analysis algorithms may have different network latency and/or throughput characteristics. In this case, it may be important to implement the node networks with Infiniband switches that supply microsecond latencies and 30 Gbps of inter-node bandwidth. Alternatively, if a communication latency is a high priority for algorithm performance (for example, to transmit new stock prices to processors as quickly as possible), but overall bandwidth is still small, then slower Infiniband connections can be used (e.g., 2 Gbps).

In select embodiments herein, a large scale parallel algorithm may be executed quickly and within a so called "power envelope", i.e. without using more electricity than has been allotted. If such an algorithm is well suited for cluster computing, a goal, per select embodiments, may be to use extremely power-efficient computers, i.e. computers optimized to achieve the highest performance-per-watt, which can then be networked together with relatively low-power network switches and routers.

A computer as described herein may comprise a microprocessor, memory, and one or more communication 10 devices. Depending on the embodiment, these components may reside on separate chips, in which case communication between chips requires much more power and is much slower than on-chip communication. System-on-chip architectures may include the processor, the memory, and the 10 interface all in one chip, substantially reducing off-chip communication. An architecture that includes sufficient on-chip memory may not need a dedicated external memory interface at all, but could instead use a single interface to the outside world for network communication.

There are different types of memory used in modern computers, each with different performance and power characteristics. Two types of memory used in computer chips today are SRAM and DRAM. SRAM is typically considered high-performance memory that is extremely fast and responsive. Because it is low-latency, relatively little time is needed between sending a command to SRAM and having that command carried out. Drawbacks of using SRAM are that it uses 6 transistors per memory bit, thereby consuming considerable chip area for large memories, which directly relates to higher manufacturing costs per bit. In addition, all of these transistors "leak" power, meaning that power usage increases linearly with memory capacity.

DRAM has considerably different characteristics. Compared to SRAM, DRAM is high-capacity because it uses only one transistor and one capacitor per bit. Using an existing low-power chip fabrication technology, CMOS, there are two types of transistors; one larger, called "pMOS" and one smaller, called "nMOS". While SRAM uses both types, DRAM may be implemented with only the smaller nMOS type. If the DRAM capacitor can be made very small, or even placed underneath the transistor rather than side-by-side, the memory capacity of DRAM can be much higher than of SRAM using the same chip area, up to seven times or more. Another benefit of DRAM is that it is naturally low-power because there is no typical leakage power consumption per bit. This is because each bit is stored in a capacitor which naturally serves as a kind of battery. No power supply is needed to maintain storage for each bit, although they must occasionally be read and re-written because the capacitor slowly loses its charge.

Especially high-capacity DRAM chips may be manufactured using special fabrication techniques that create very small capacitors. The steps of this fabrication have differed significantly from fabrication techniques employed to produce processor logic. Per select embodiments herein, system-on-chip designs that integrate on-chip DRAM may use a fabrication process that provides good performance for processor logic transistors while sacrificing some ability to construct the smallest capacitors, or they may use an optimal fabrication technique for both processor logic and memory by fabricating each on separate chips and then stacking these chips on top of each other and interconnecting them with small vertical metal wires. Processor logic and memory may be fabricated on the same chip. This may be done to avoid the possible difficulty of stacking two different chips with very low error (microns or less) and to avoid a reduction in cooling efficacy associated with stacking (e.g., which can cause heat to be insulated, reducing cooling efficacy, so that processors must consume much less power to avoid heat-induced errors).

If the logic and memory are formed in the same fabrication process (i.e. not chip stacking), the reduced on-chip memory capacity that might result may be compensated for by connecting to off-chip memory. An architecture that balances and reduces the amount of processing speed per chip so that sufficient memory will also fit on chip may gain improved power efficiency.

Some algorithms perform many memory operations that are independent and could be done in parallel with separate memories. These algorithms may work well with fast SRAM memories but could also work well utilizing many separate slower DRAM memories, called "banks", rather than one fast SRAM memory. For a highly parallel algorithm, many individual slow processes may complete the same job as a single fast process with minimal or zero increase in total cycles required.

Executing such algorithms on a computer architecture with many separate DRAM banks could achieve similar performance to SRAM-based architectures while providing higher memory capacity and wasting less power by eliminating SRAM leakage. More specifically, many parallel processes may be provided, each at a fixed slow speed sufficient to allow memory operations to complete before starting a process's next cycle.

If one process is using the memory bank that another process is trying to access, the second process may have to wait, thus reducing performance. Scaling the number of banks such that each process has its own memory bank that is functionally available every process cycle solves this problem. This technique need not require complex scheduling hardware, but may be costly if the hardware and power cost of providing for each process and its assigned memory bank is sufficiently high.

Since each bit of a DRAM bank naturally consumes almost no power while idle (requiring only a relatively rare refresh every few milliseconds), select embodiments herein suggest providing many on-chip DRAM banks which should not cause a significant power increase. This method may therefore provide improved power-efficiency. In addition, the large number of banks would provide area-efficient high memory capacity on chip that the algorithm may in fact need to avoid inefficient off-chip memory accesses.

For functions that are not speed-critical, a simple method of loading instructions from data memory such as DRAM allows programs with many instructions to be supported.

A second type of memory access, called instruction fetch, is performed at the start of each instruction cycle (described below) by retrieving memory at the location of the next instruction. The location may be stored internally on a given processor, in what is called a program counter, and may be incremented during each instruction cycle in order to automatically indicate the location of the next instruction. The program counter may also be manipulated by instructions, which allows the results of operations to determine which instruction is next (e.g. to loop multiple times through a certain instruction sequence until a condition is met).

For functions that are not speed-critical, a simple method of loading instructions from data memory allows execution of large programs. In high-performance processors, performance-critical instruction sequences may be stored or cached in a SRAM memory dedicated to this task and separate from data memory. If many processes are executing the same program, it is possible for them to share the instruction memory.

The performance of an algorithm may depend critically on the rapid execution of only a very small list of instructions. Thus, the capability for high performance on a small section of instruction code can be of the utmost importance in high-performance computing, while slower performance on other parts of a program may not affect the overall performance at all.

Although SRAM naturally uses more power per bit than DRAM, it may be power-efficient to use an SRAM memory for instruction fetches, provided it is sufficiently small, and, if used by slow processes, it is shared among many processes to fully utilize the speed benefit of SRAM.

As mentioned above with respect to certain embodiments, many slow processes may be executed on a single chip to achieve improved power efficiency. On-chip DRAM memory may be divided into many individual banks so that each process could perform a memory operation each cycle. On-chip networks may be provided to allow multiple processes executing on the same chip to communicate with each other.

Although each process' assigned memory bank might be relatively small, it is possible for processes to send messages over an on-chip network to request memory operations to be performed in a memory bank not assigned to the originating process. If these non-local memory operations are relatively infrequent (e.g. outside the performance-critical section of code), the on-chip network may be designed to service sufficiently low messaging speeds such that the on-chip network increases total chip power usage below a desired threshold, thus keeping the entire chip power-efficient.

An example benefit of this architecture is that previously existing useful programs (such as a full or partially functional Linux operating system) that require more memory than is assigned to any one process may still execute using non-local memory operations, albeit at reduced speed due to on-chip network latency and perhaps network congestion. These non-local memory operations may be restricted to accessing only a certain portion of the remote on-chip memory bank. Across the chip, these accessible bank portions may represent a contiguous memory space, facilitating execution of programs that are unaware they are executing on specialized hardware, of which the original programmer had not conceived.

A given processor core, per embodiments herein, may serve as its own microprocessor that, when coupled with memory and IO (network-on-chip), is capable of sequentially executing instructions. To communicate off-chip, these microprocessor communicate with an external network interface. The microprocessors might access this external network interface as if it were another microprocessor, over the network-on-chip. The microprocessors may send commands and data to the network interface according to a special protocol, or driver, which the network interface understands and executes. If the driver code requirements are burdensome, it is possible for microprocessors to aggregate their messages to one or a few on-chip microprocessors using a simpler protocol.

Aggregating microprocessors may carry out the commands received through a simple on-chip protocol and communicate them to the network interface using a more complicated driver. The speed capabilities and functionality of the external network and network interface may be reduced in order to reduce power consumption such that total cluster performance-per-watt will not be greatly impacted by network power usage. This can improve power-efficiency for algorithms that do not have prohibitive off-chip communication requirements.

In order to communicate with existing computers, it may be necessary to use contemporary network hardware such as Ethernet. A power-efficient architecture may choose to use more power-efficient network hardware to communicate among itself and utilize protocol translation equipment to provide a bridge for messages to traverse from the power-efficient network to other parts of a network. Alternatively if external network hardware is provided that is not too power-inefficient, the system-on-chip network interface could be implemented to be compatible.

When turned on, a given microprocessor may start an infinite loop through an instruction cycle, e.g., as follows: (1) Retrieve next instruction from memory according to the Program Counter PC; (2) Increment PC; (3) Decode instruction; (4) Dispatch register operands of instruction to the appropriate execution unit such as an arithmetic logic unit ALU; (5) Execute instruction; (6) Write results of instruction, if any, to the result register of the microprocessor. Computer clocks employ signals that toggle on/off/on/off . . . in an infinite loop.

Processors may initiate circuit functions on the rising (from off to on) or falling (from on to off) edge of a clock signal, in which case they are termed synchronous circuits. A simple synchronous processor might operate in the following manner: (1) Wait for next clock signal; (2) Perform steps 1-6 of the instruction cycle; (3) Repeat.

Note that while a simple processor may be performing any step in the instruction cycle, the logic responsible for the other 5 stages may not be doing anything useful. In order to reduce this waste and speed up processing, some modern microprocessors use a pipeline paradigm which attempts to start the next instruction before the previous instruction has finished. Using a 6-stage instruction cycle, programs can fill the pipeline completely so that no pipeline stage is idling, and 6 instructions are executing simultaneously to execute programs many times faster. This is not always possible, however, due to pipeline hazards that occur when either the results of an instruction (e.g. branch "IF" statement) can change selection of next instruction or an instruction in the pipeline requires the results of another instruction that has not yet completed and whose results are not yet available.

A method to avoid hazards in a pipeline is for a later instruction (and all those that come after it) to stall and not proceed until the necessary result is available. This can reduce performance if many stages become idle during the stall. Workarounds to this problem have included predicting the result of branch instructions, or proceeding on to independent succeeding instructions. These methods can require additional storage mechanisms and logic and increase power usage. For example, if a processor predicts the results of a branch instruction incorrectly, some systems "roll back" the state of the processor to a previous state prior to making the incorrect prediction. For this reason, some systems use advanced branch prediction hardware that increases power consumption and chip area requirements.

Another method is to include optimizations in the programmer's development tools that attempt to automatically predict hazards in programs and rearrange instructions so that hazards occur less frequently when the program is run. This method, however, cannot avoid all hazards and some types of "extremely serial" code still may gain no benefit from the pipelined operation.

Some architectures execute the same process repeatedly until a pipeline stall occurs, at which point they begin executing a different process. For many architectures it is possible for the microprocessor to have no remaining processes ready to execute because all are stalled. In addition, many architectures require scheduling hardware to determine which process should be run next, and this hardware consumes power and chip area and may potentially deprive some processes of their fair share of processor execution time.

One method, per embodiments herein, for keeping pipeline stages active with less risk of pipeline hazards, is to execute multiple processes on a single microprocessor, such that at the start of each new cycle an instruction can be retrieved for a process that does not have any instructions left in the pipeline. A specialization of this architecture executes a set number of processes in the same order in a permanent loop, called round-robin, which need not require any significant scheduling circuitry and may obtain better power efficiency. In this implementation, the processes do not perform operations that take more cycles than the number of processes executing on the microprocessor. Alternatively, notifying programmers of which instructions may cause stalling helps them design systems that avoid those instructions in the performance-critical sections of code.

Performance may also be improved by providing each process with a data memory of some form that is fast enough to complete a memory operation within a single process cycle and therefore avoid a stall. The above architecture can be adapted to provide this using low-power DRAM memory, as previously described.

In some embodiments, the microprocessor supports a sufficient number of processes such that the DRAM memory bank can complete an operation before the next instruction for that process starts execution. For example, a DRAM that requires 20 nsec to complete any operation can provide single-cycle data operations for a process executing at 50 MHz or less. A power-efficient microprocessor using a 350 MHz clock cycle and supporting 16 processes would operate individual processes at 22 MHz (350 mhz/16 processes=22 million instruction cycles per second per process), thus providing 45 nanoseconds between process cycles. The extra 23 nanoseconds could be used to complete the other stages of the instruction cycle such as instruction fetch and storing results in registers so that the entire instruction cycle can be completed each process cycle.

In order to improve the usefulness of new computer architecture embodiments presented herein, additional development tools may be provided. These could include a compiler for at least one programming language, e.g., C, which translates human-written programs into machine-understandable instructions. Portable programs could be provided in C, which can be compiled for different microprocessors. Many development tools and open source programs have been written in C so that providing a C compiler allows developers to use programs and code they are already familiar with.

Booting a computer involves loading the first few instructions of a process into memory. These instructions may then carry out the loading of additional instructions that contain normal operating procedures. Two options for booting a system-on-chip include: (1) Load instructions from persistent memory, either on-chip or off-chip; and (2) Load instructions from the network.

In a network case, a monitoring computer may watch the network for boot requests and then send the instructions. The above two methods are not necessarily exclusive, as the persistent on-chip memory may contain just enough instructions to enable booting from network.

A method that potentially achieves very low boot overhead is to boot the chip with a hard-coded first instruction address pointing to DRAM memory address zero. DRAM memory resets to all zero once powered off for a sufficient length of time. Thus if no boot precautions are contained in a given microprocessor, the microprocessor may load an all-zero instruction, which could be architected to be a jump statement to itself, tying the process in an infinite loop.

If the network interface loads instructions from the network and then sends them directly to each on-chip processor's assigned DRAM memory, it can install instructions into the microprocessor's memory while the microprocessor is busy looping (provided non-local memory access overrides instruction fetch during initial boot). In addition, it could overwrite the zero instruction to force the processor to stop looping and jump to the first instruction of the loaded program. This or other methods could allow a more complicated boot sequence (such as network boot) to be implemented in a single on-chip circuit that eventually boots all processes on the chip.

Some microprocessors process instructions that have been grouped into tiny bundles, called Very Long Instruction Words (VLIW), usually containing 1, 2 or 3 instructions. This bundling may be performed by the programmer's development tools, such as a compiler, that may be provided per one embodiment herein. These instructions, if independent, can be performed in parallel. With this said, the architecture of embodiments herein could use some of the spare processing time (e.g., 23 nsec) to perform these instructions in a specific serial order so that the second instruction may depend on the first, and third might depend on the first or second.

This could be used to allow for unusually useful VLIW instructions, such as a 3-instruction bundle that performs the following in a single cycle: (1) Load value from memory; (2) Compare to another value; (3) Select (branch) next instruction depending on the results of the comparison. An added value of this method is that fewer values can be simultaneously read and written to the registers holding the instruction operands and results. This can significantly reduce the area overhead, and possibly the power overhead, necessary to implement a VLIW architecture.

Each on-chip microprocessor can be coupled with a very simple IO processor that attempts interprocess communication that might otherwise have to be implemented in software and require a process to execute potentially blocking operations. The IO processor may accept very simple commands such as "transfer local memory block A to non-local memory block B". The microprocessor may check on the IO processor's progress and, when an IO command completes, give a new command to the IO processor. The IO processor would not execute software but instead accept very simple commands from its assigned microprocessor that might otherwise be very time consuming for the microprocessor. The IO processor is thus involved in memory access, and so it might be advantageous to control IO processor behavior using optional settings of the IO processor. For example, during boot, the IO processor might allow memory commands arriving from the on-chip network to get priority access to the local memory even if the local process is attempting to fetch instructions from it. Later, changing this setting would allow instruction fetches to have priority over other memory operations to improve the local process's performance. If the IO processor performs local memory operations only when the local process is not accessing local memory, it is possible for memory blocks to be transferred between processes without reducing process performance.

Described above in connection with select embodiments is a system-on-chip computer architecture comprising small SRAM instruction memories, highly multibank DRAM for data memory, combined with a simple and efficient scheduling algorithm to maintain a fully active instruction pipeline, and a relatively low-power on-chip network, network interface, and cluster network capable of adapting to arbitrary power envelopes running millions of processes for maximum throughput-per-watt. Many programs will not perform well on this architecture because they cannot be divided efficiently into millions of largely independent processes.

One algorithm particularly well-suited to this architecture, however, is a web search engine. Search engines crawl the web by downloading web pages, searching them for links, and downloading linked web pages. These downloaded web pages, numbering in the billions, are then stored so that then can be searched. Serving millions of users each day requires searching these pages thousands of times per second. To do this, a large cluster of computers stores the text of these web pages; each computer assigned a certain relatively small set of pages. When a new query arrives, the keywords are sent to all computers which then find best-matching web pages from their assigned set. These results aggregate up a hierarchy such that at each hierarchy level most pages are filtered out and only the best matches are forwarded to the next level of the hierarchy. At the top of the hierarchy the best matches across the entire web have been found.

This search engine algorithm is well-suited to the previously described computer architecture because web pages can be searched in parallel without communication between computers. Also, the results can be aggregated in a hierarchy whose height determines the total communication latency of the output. By adding a few levels to the hierarchy the algorithm can use many times more computers. By dividing web page sets into smaller sets the algorithm can accommodate small memory banks such as those DRAM banks assigned to each process. Using on-chip high capacity DRAM memory to store web pages allows a cluster of system-on-chips to store the entire web on chip. Additional aspects of the novel computer architecture are also well-suited for search engines; such as the matching functions used to rank web pages, which use many branch statements that slow down traditionally pipelined architectures. The load-compare-branch VLIW instruction described above is actually contained in the core of the search engine matching algorithm (for determining which pages contain all the keywords). Using contemporary computer clusters would probably require at least ten times more cycles to complete this fundamental micro-step of search.

Another algorithm well-suited to the novel architecture is financial algorithms using Monte Carlo simulation. These algorithms require random numbers as input, which can be time consuming to generate, but by storing many of these numbers locally in the DRAM memory they are easily accessible to a process (using much lower power than if they had to be regenerated). During a financial Monte Carlo simulation, the same code may be executed millions or billions of times, with the only modification between runs being the input random number. This extreme number of samples is necessary because (1) the precision of the final answer must be within some fraction of a cent, and the total dollar value of the final answer may be thousands, requiring 7 or more digits of precision; and (2) the precision of the final answer grows slowly, as the square root of the number of samples. For some algorithms, output of these runs must be averaged or summed, such that the final answer is the average of billions of individually derived numbers. During each Monte Carlo sample, a complicated function such as "exp" (raising the natural number e to the input power) can take multiple cycles to execute. Interestingly, because the final result of the simulation is the average of so many numbers, reducing the precision of this function (the number of decimal places of required accuracy) may not significantly impact the final answer. Instead of calculating the exp function directly, in this case it is possible to use a small lookup table with perhaps 12-bits of accuracy at the input and 12-bits at the output. Because of the significant local storage for each process in the novel architecture it is likely that such tables would be quickly accessible to each process. If stored in the most local DRAM memory the exp function could be completed in a single cycle via table lookup.

Figure 12:
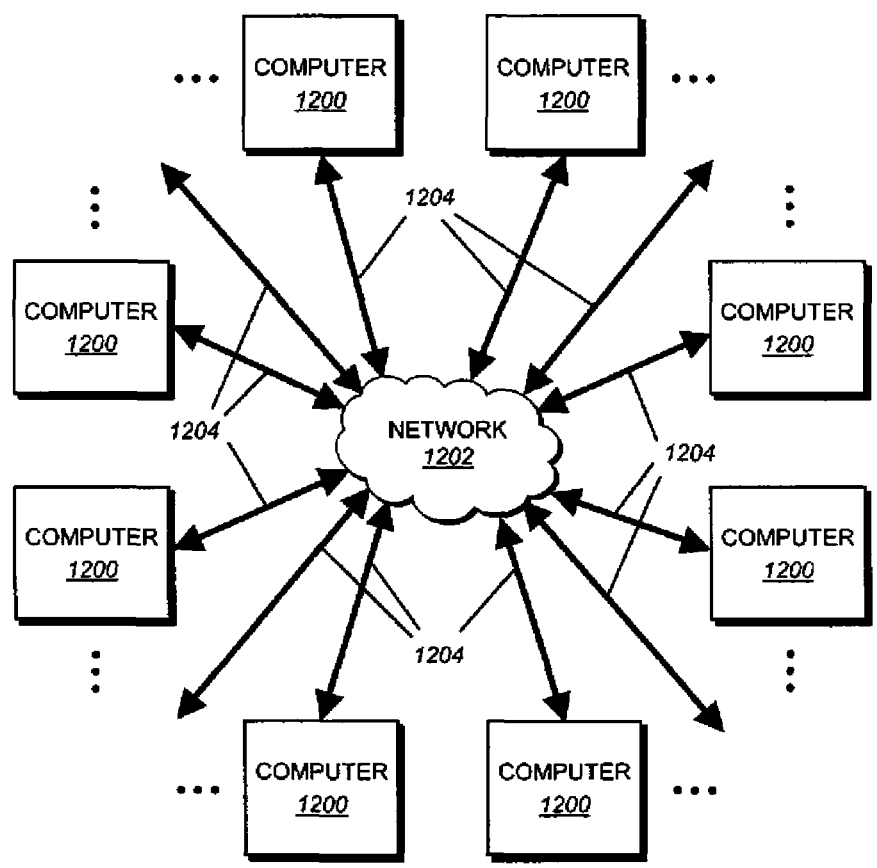
FIG. 12 is a block diagram of an exemplary parallel processing computer cluster.

Notably, FIG. 12 is a computer cluster comprising a collection of interconnected computers that together serve as a type of supercomputer useful for applications in need of high performance such as Search Engines, Financial Analysis, and Weather Prediction. As shown the depicted, exemplary computer cluster comprises many computers 1200, each with a network interface 1304, connected to a "wire" which may be copper or fiber optic 1204. The computers 1200 may be x86-compatible desktop computers all mounted in the same or nearby racks in a datacenter. It is also possible for a computer to be very small, for example a single 10 mm by 10 mm flat chip in a package, possibly with no cooling depending on heat production. The wire 1204 may be Cat6 Ethernet wire, and the network 1202 may include routers implementing an IP protocol, thereby allowing the computers 1200 to communicate using UDP or TCP/IP protocols. The network also comprises networking elements such as switches and routers that pass messages between computers based on the destination address of the message. Cluster applications run programs on each computer, each program performing a different sub-task of the overall application. Not all applications benefit from cluster hardware, because an application must use parallel algorithms to execute on multiple computers, and not all tasks can be separated into parallel sub-tasks.

Figure 13:
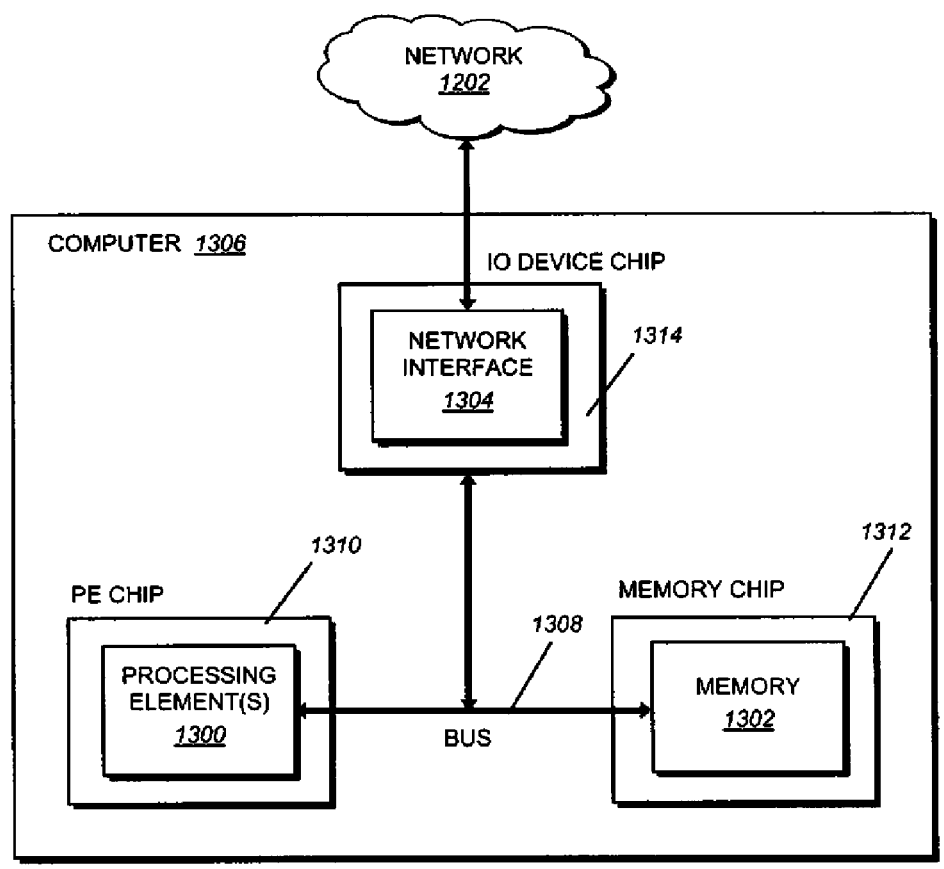
FIG. 13 is a block diagram of an exemplary desktop computer provided with power-efficiency-enhanced processor core chips according to an illustrative embodiment.

FIG. 13 is a block diagram of a computer 1306 such as might be used in a high-performance cluster as described in embodiments herein. The illustrated computer includes processing elements, memory 1302 and a network interface 1304, all interconnected via a bus 1308. Buses 1308 are slower than on-chip buses or networks, and their power-efficiency is typically rated in gigabits per second per milliwatt. In contrast on-chip communication requires orders of magnitude less power to achieve the same performance and is much lower latency, due to the shorter wire length and lack of transition between on-chip and off-chip wires.

When using separated chips for elements 1300, 1302, and 1304, there is a minimum power usage that can be attained for given inter-chip communication requirements, and this could in fact be much higher than the sum power usage of a highly efficient PE chip 1310, memory chip 1312 and network interface chip 1314 implementation.

Figure 14:
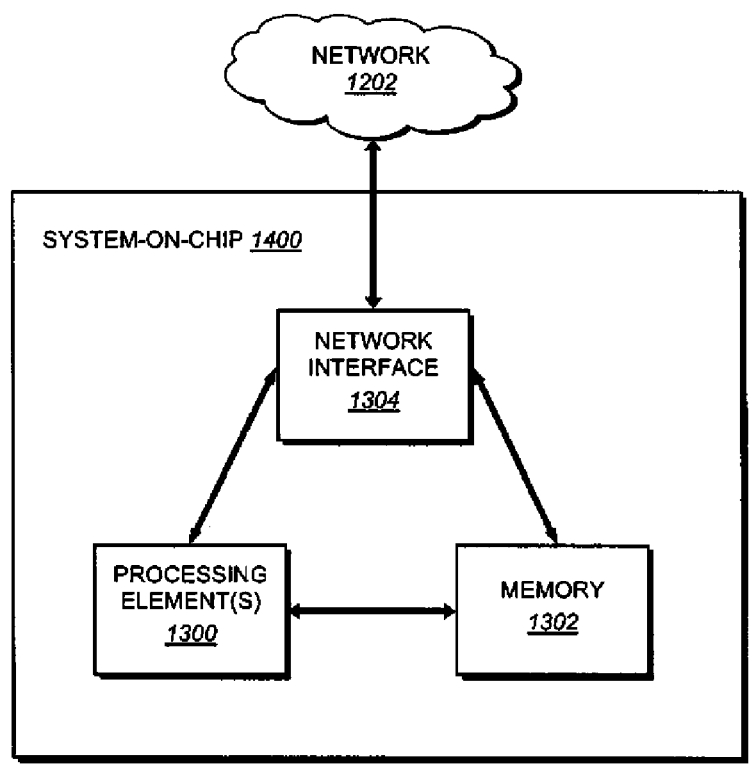
FIG. 14 is a block diagram of a system-on-chip embodiment of a power-efficiency-enhanced computer architecture according to an illustrative embodiment.

FIG. 14 is a block diagram of a system-on-chip 1400 computer architecture containing processing elements 1300, network interface 1304 and memory 1302 all on the same chip. The network interface 1304 connects the system-on-chip 1400, which can also be called a computer, to a cluster of system-on-chips 1400. The illustrated system-on-chip 1400 architecture uses a single network interface for all external communication, and therefore includes sufficient memory 1302 on chip to maintain good performance. The precise quantity of memory 1302 needed on chip is algorithm dependent. System-on-chips may be practically limited to approximately 100 or 200 square millimeters of chip area when using conventional packaging techniques. For the design of a cluster of system-on-chips, the improved power efficiency of on-chip communication encourages using a larger chip size so that less off-chip communication is necessary.

Figure 15:
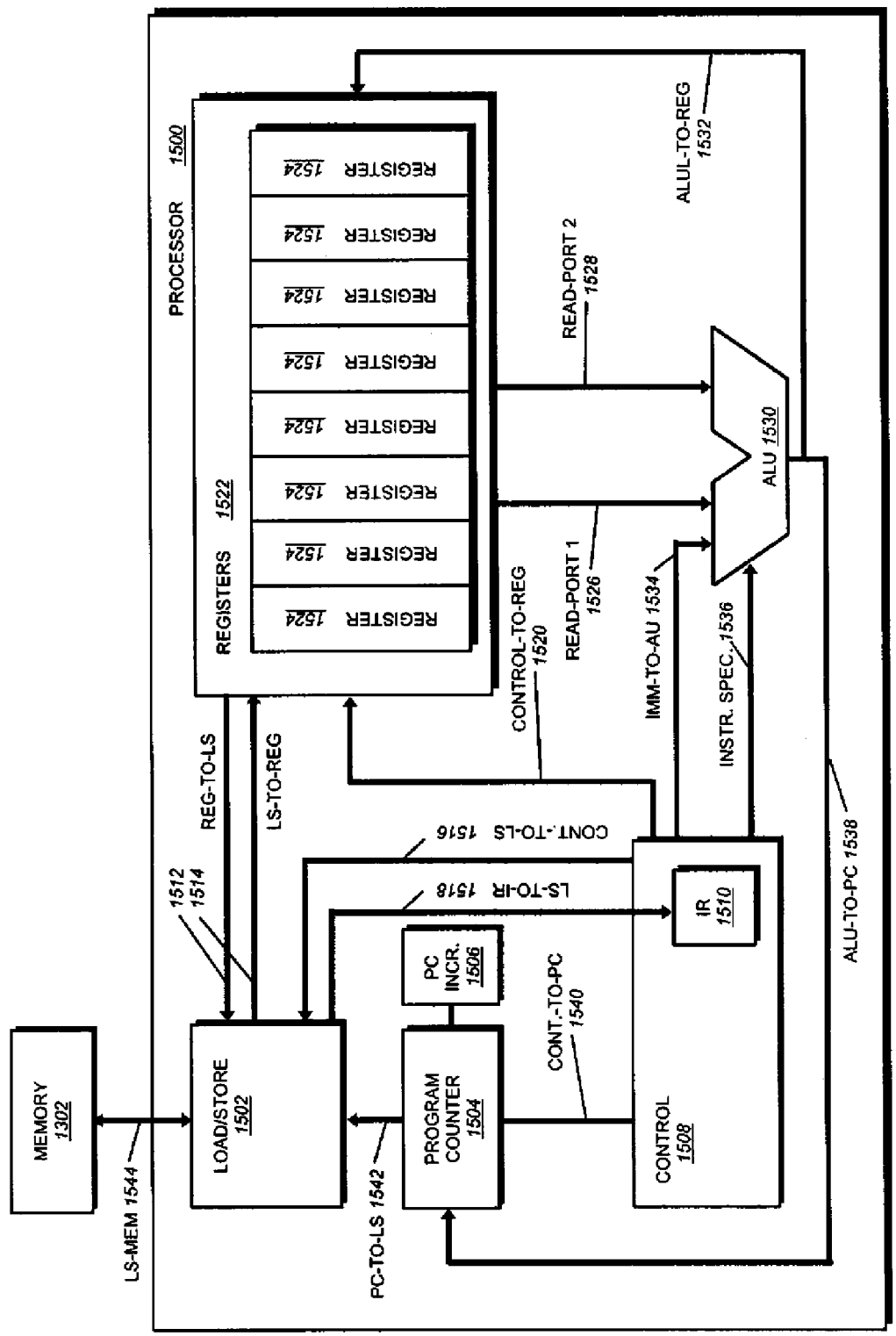
FIG. 15 is a schematic diagram of a basic processor architecture that may be employed in various embodiments herein.

FIG. 15 is a block diagram of a basic processor architecture 1500 from which processors as described herein may be implemented. Program execution proceeds by iteratively completing the instruction cycle. The instruction cycle proceeds through several steps and in an illustrative example this could be said to be 6 stages comprising: 1) Instruction Fetch 2); Increment PC; 3) Decode instruction; 4) Dispatch register operands; 5) Execute instruction; and 6) Write results. Instruction Fetch loads the next instruction in the program from memory 1302. This is involves the Control unit 1508 communicating to the Program Counter 1504, or PC unit, via the Control-to-PC pathway 1540. This communication tells the PC 1504 to send the current value of the PC 1504 to the Load/Store unit 1502.

The PC value designates the memory address necessary to locate the next program instruction from memory 1502. The PC unit 1504 then sends the PC value 1542 to the Load/Store unit 1502 via the PC-to-Load/Store pathway 1542. The Control unit 1508 then signals to the Load/Store unit 1502 via the Control-to-Load/Store pathway 1516 to use the PC value to read the next instruction from memory. The Load/Store unit 1502 then sends a read command to the memory unit 1302 via the Load/Store-Memory pathway 1544 indicating the PC value as the address to be read.

The memory unit 1302 then retrieves this value from its internal circuits and returns data representing the next instruction to the Load/Store unit 1502 via the LS-Mem pathway 1544. The Load/Store unit then sends the instruction data to the Instruction Register 1510, also called IR, via the Load/Store-to-IR pathway 1518. This is the end of the Instruction Fetch stage. Only the Control 1508, IR 1510, PC 1504, Load/Store 1502 and Memory 1302, as well as the necessary pathways (1540, 1542, 1544, 1518, 1516) were used during the Instruction Fetch stage. All other units (1512, 1514, 1520, 1534, 1536, 1526, 1528, 1532, 1538, 1524, 1522) in the processor 1500 will be used in a future stage of the Instruction Cycle but they did not perform any useful operations during the Instruction Fetch stage and were merely idling in the naive processor architecture.

The next stage is the Increment PC stage, in which the PC 1504 communicates to the PC Increment unit 1506 so that the value of the PC is incremented to the address of the next instruction in memory 1302 by the PC incrementer 1506. Besides these two units and their connecting pathway, no other processor units were involved in completing the Increment PC stage. The Increment PC stage does not have to occur immediately following the Instruction Fetch phase, and is performed after the Instruction Fetch stage and before the Write Results stage.

The next stage of the Instruction cycle is the Decode Instruction stage. In this stage the Control unit 1508 reads the bits in the instruction register 1510 and prepares to send the proper signals to the other units in the processor 1500 necessary to perform the instruction. Besides these two units no other units were contributing to the Decode Instruction stage and were waiting for a future stage.

The next stage is the Dispatch Register Operands stage. First we will consider the case where the instruction can be performed by the ALU. This stage proceeds by the Control unit 1508 signaling to the Registers unit 1522 over the Control-to-Registers pathway 1520 to send data from a particular register 1524 that was indicated in the current instruction to be an operand to the ALU 1530 over a particular port, either Read-port 1 1526 or Read-port 2 1528. If the instruction has two operands stored in registers, the signal sent from Control 1508 to Registers 1522 will also specify a second Register 1524 to be sent over the other Read port. Alternatively, the Control unit 1508 may provide an operand contained within the Instruction data, called an Immediate, over the Immediate-to-ALU pathway 1534. Instructions may specify either zero, one, or two operands. In the case of a single operand the operand may be either an immediate or a Register 1524 operand. In the case of two operands, the two operands may be provided in two Registers 1524, or a single register 1524 and a single Immediate.

If the instruction does not have any operands, a signal would not be sent to the Registers (1522) and no immediate value would be sent to the ALU 1530. When the Registers 1522 receive a signal to send operands to the ALU 1530 they send these to the ALU 1530 over the ports designated in the command from the Control unit 1508. As with previous stages in the Instruction cycle, many portions of the processor 1500 and the memory unit 1302 spend the Dispatch Register Operands stage idling.

In the event that the instruction is not an ALU 1530 instruction but instead a memory operation, the operand(s) will be sent to the Load/Store unit 1502 over the Register-to-Load/Store pathway 1512. In the case of a READ memory operation, the control unit 1508 will also indicate the destination register 1524 for the result to be sent to.

The next stage is the Execute Instruction stage. First, the case is considered where the current instruction is an ALU instruction 1530. During this stage the Control unit 1508 specifies the operation designated in the current instruction to the ALU 1530 over the Instruction Specification pathway 1536. The Control Unit also sends the ALU 1530 the destination to which the result should be sent during the Write Result stage that will follow. The ALU 1530 then performs the operation and computes the result.

In the case that the current instruction is not an ALU 1530 instruction but a memory instruction, the Control Unit 1508 sends a signal to the Load/Store unit 1502 to perform a read or write memory operation as designated by the current instruction. The Load/Store unit 1502 then sends the command to the memory unit 1302 with the data supplied by the Registers 1522 during the previous stage. If the memory operation is a write command, the data provided by the Load/Store unit 1502 designate the memory address to write to and the value to be written there. The memory unit 1302 will then write the data to that location in its internal circuitry. If the memory operation is a READ operation, then the Load/Store unit 1502 designates the location of the data to be read, which the Memory 1302 unit then retrieves from its internal circuitry and sends back to the Load/Store unit 1502 over the Load/Store-Memory pathway 1544.

In the next and final stage of the Instruction Cycle, results are written to the destination indicated in the current instruction. For ALU 1530 instructions that are not JUMP or BRANCH instructions, the ALU 1530 will send the computed result to the Register 1524 previously indicated by the Control unit 1508 over the ALU-to-registers pathway 1532. In the case that the current instruction is an ALU instruction 1530 that is a JUMP or BRANCH instruction, the result will be written to the PC 1504 through the ALU-to-PC pathway 1538, thus changing which instruction will be fetched at the beginning of the next Instruction Cycle. In the case that the instruction is a memory READ instruction, the Load/Store unit 1502 will send the previously retrieved data to the appropriate register 1524 over the Load/Store-to-Register pathway 1514, specifying which Register 1524 gets the data as previously indicated by the Control 1508 unit.

Figure 16:
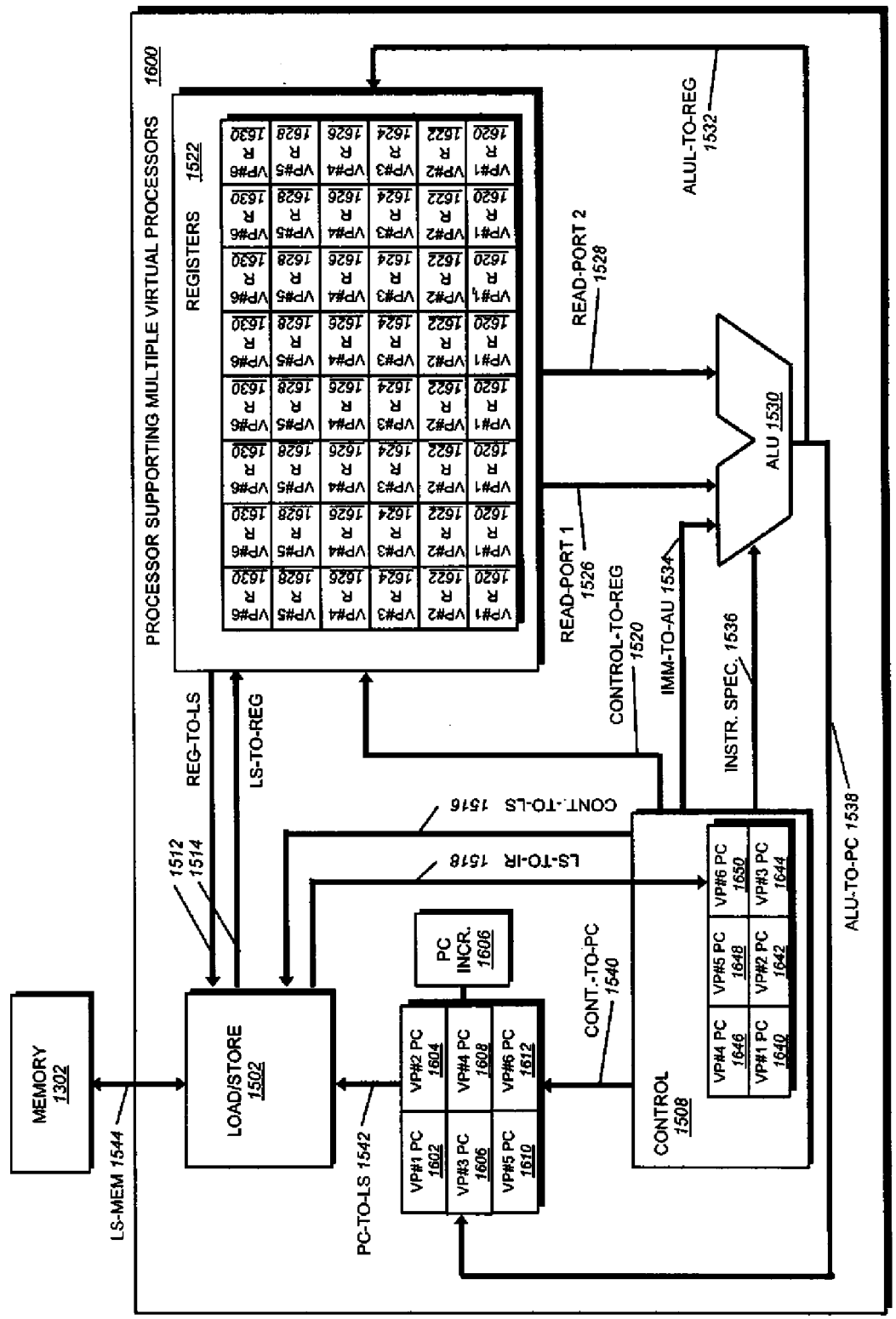
FIG. 16 is a schematic diagram of an illustrative processor implementing multiple virtual processors according to an illustrative embodiment.

FIG. 16 is a block diagram of a processor implementing multiple virtual processors 1600 which differs from FIG. 15 in that there are separate resources provided to each virtual processor such as a PC 1504, Instruction Register (IR) 1510 and a set of data registers 1522. This architecture 1600 implements separate instruction cycles for each virtual processor in a staggered fashion such that at any given moment exactly one VP is performing Instruction Fetch, one VP is Decoding Instruction, one VP is Dispatching Register Operands, one VP is Executing Instruction, and one VP is Writing Results. Each VP is performing a step in the Instruction Cycle that no other VP is doing. The entire processor's 1600 resources are utilized every cycle. Compared to the naïve processor 1500 this new processor could execute instructions six times faster.

As an example processor cycle, suppose that VP#6 is currently fetching an instruction using VP#6 PC 1612 to designate which instruction to fetch, which will be stored in VP#6 Instruction Register 1650. This means that VP#5 is Incrementing VP#5 PC 1610, VP#4 is Decoding an instruction in VP#4 Instruction Register 1646 that was fetched two cycles earlier. VP #3 is Dispatching Register Operands. These register operands are only selected from VP#3 Registers 1624. VP#2 is Executing the instruction using VP#2 Register 1622 operands that were dispatched during the previous cycle. VP#1 is Writing Results to either VP#1 PC 1602 or a VP#1 Register 1620.

During the next processor cycle, each Virtual Processor will move on to the next stage in the instruction cycle. Since VP#1 just finished completing an instruction cycle it will start a new instruction cycle, beginning with the first stage, Fetch Instruction.

A small flash memory could be made to reside adjacent to the system-on-chip 1400 or inside the system-on-chip. Flash memory provides the advantage that it can be completely turned off (thus, consuming no power) and still remember its stored data when turned back on, which is called persistent data. Such data is useful for storing seldom-accessed data such as boot loading instructions.

Figure 17:
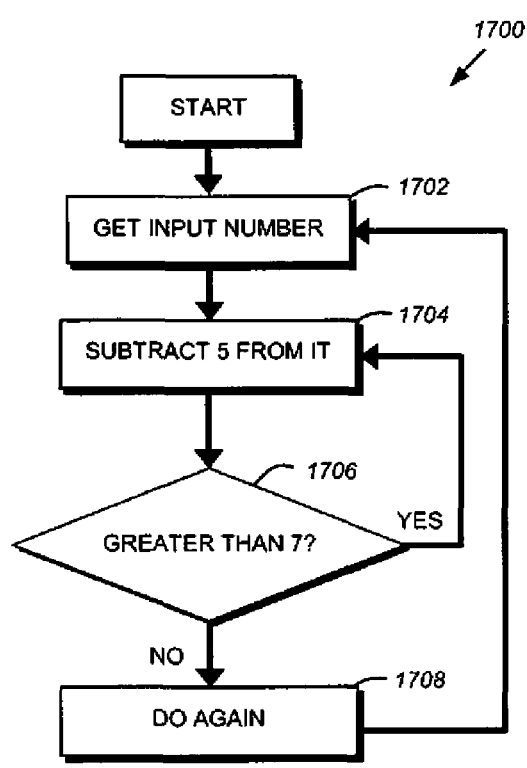
FIG. 17 is a flowchart of an exemplary process carried out by a processor in accordance with an illustrative embodiment.

FIG. 17 is a flowchart of an illustrative exemplary program 1700 that includes a branch instruction 1706, memory operation 1702, arithmetic operations (1704, 1706) and an unconditional jump 1708. The conditional branch instruction is actually two instructions, namely a comparison and a conditional branch, which will be divided into these constituent parts in the next figure. The program has similar properties to the inner loop of a Search Engine. A function of a Search engine is to find all of the web pages that contain all of the keywords in a given query. This can be done by finding one list of web pages for each keyword. These lists can be pre-sorted to facilitate search processing. As an example, consider two lists of web pages. To find all web pages in both lists, simply compare the two web pages at the beginning of the list (assume each list has already been sorted in ascending order according to their index). If the first list's first web page index is higher than the second list's first web page, the pages do not match and so the lesser web page is known to not be in both lists, and so remove the second list's first web page from the list. If the first list's first web page is less than the second list's first web page, the pages do not match and the lesser web page is known to not be in both lists, and so remove the first list's first web page. A program that performs this search engine function must repeatedly load web page indexes from memory, compare web page index's, and branch to different instructions depending on the result of the comparison.

Figure 18:
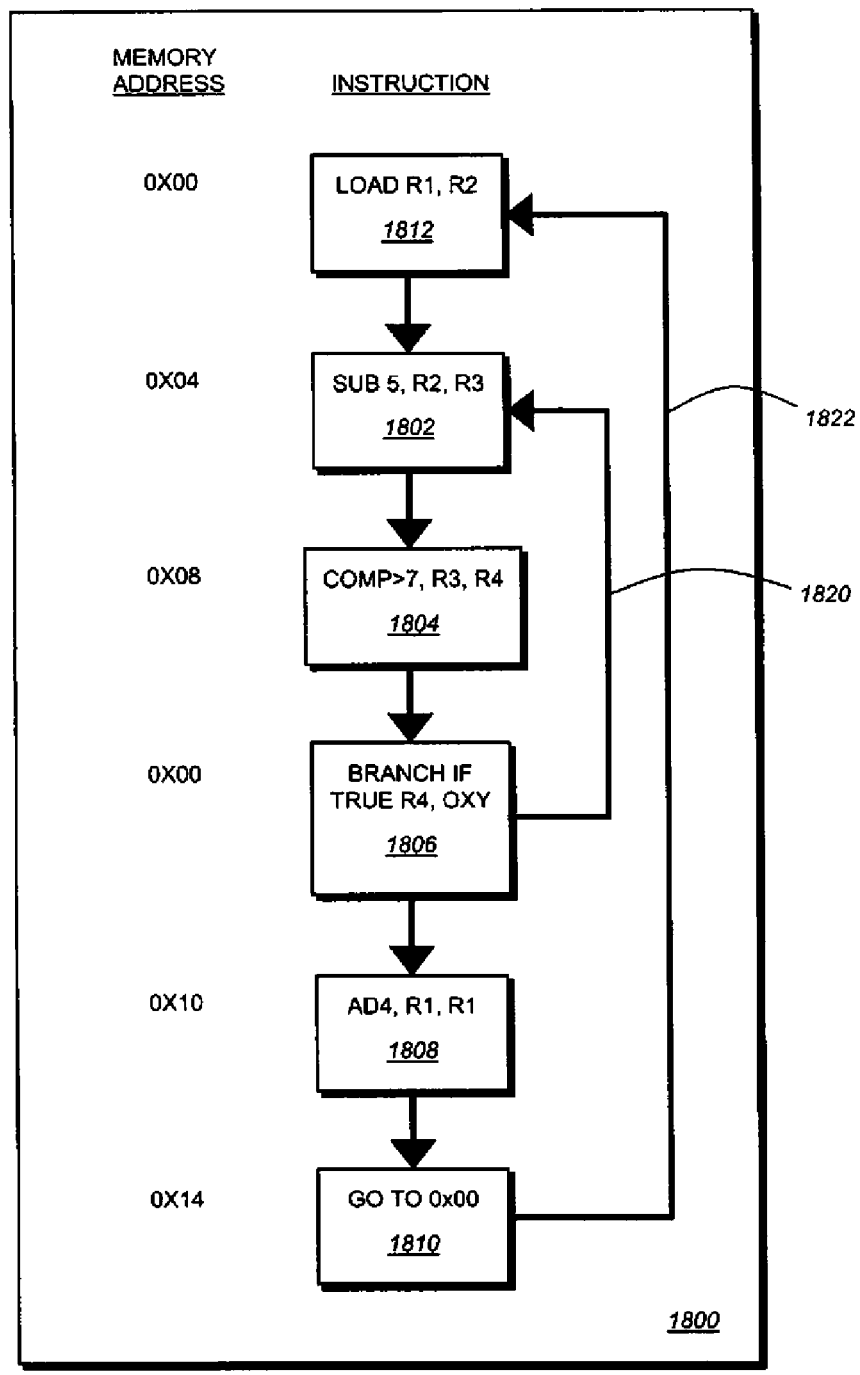
FIG. 18 is a flowchart of a process carried out by a given node, for example, of the cluster shown in FIG. 12.

FIG. 18 is a flowchart 1800 in which each node is an actual CPU instruction such that the program 1700 in FIG. 17 is carried out by the list of computer instructions in FIG. 18. The "inner loop" 1820 contains a subtraction instruction 1802, followed by a comparison instruction that depends on the results of the subtraction 1804, and then a branch instruction 1806 that depends on the results of the comparison. Memory addresses to the left of the instructions allow the GOTO statement 1810 to illustrate how an actual computer instruction uses memory to store instructions that are used to carry out the program. The outer loop 1822 also performs a memory operation 1812 before entering the inner loop 1820, which the first instruction of the inner loop 1820 is dependent upon and therefore the memory operation must finish before the subtraction 1802 can occur.

Figure 19:
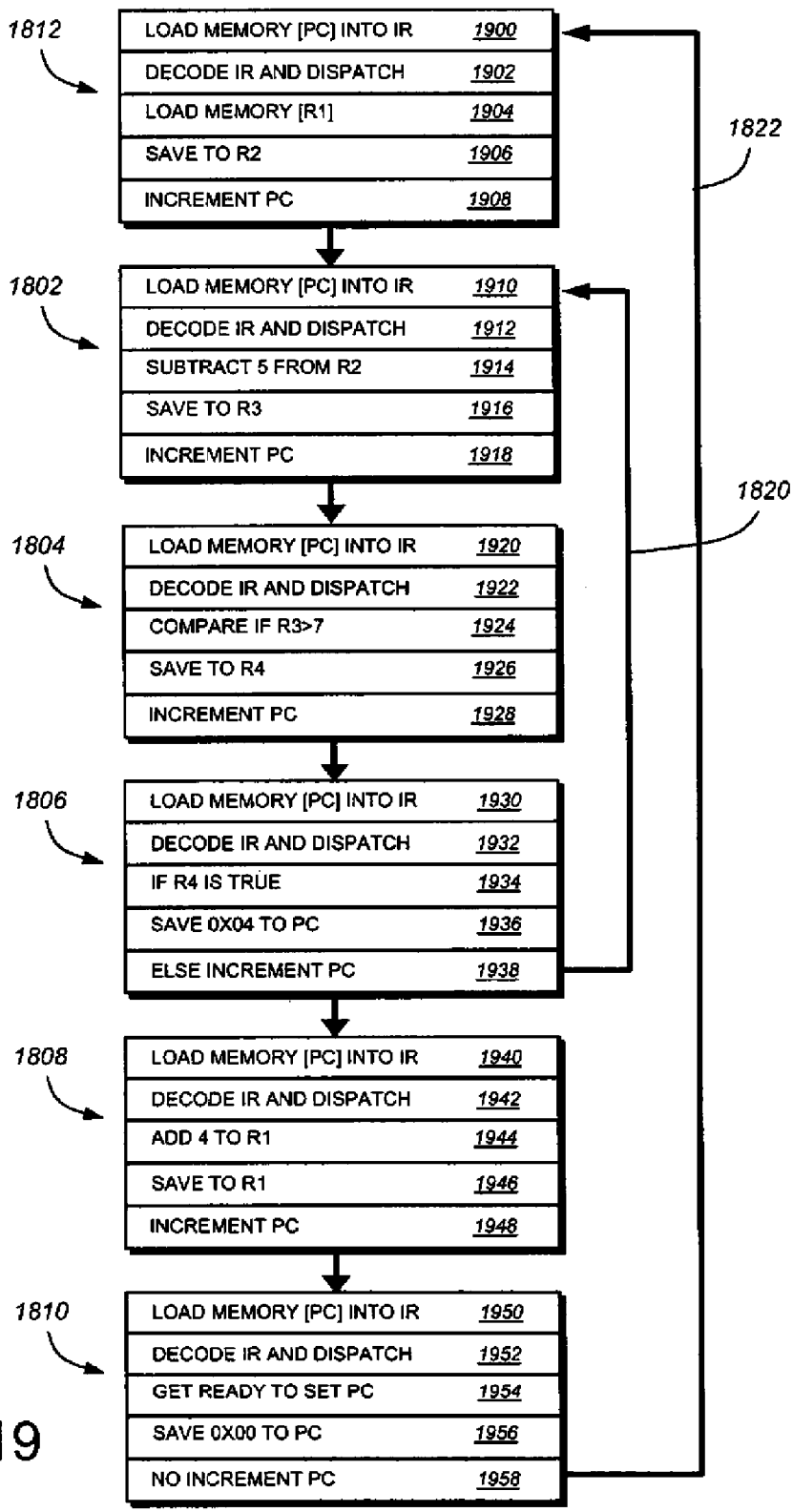
FIG. 19 is a more detailed flowchart of the process shown in FIG. 18.

This program uses a new instruction cycle that differs from that used in the descriptions of FIG. 15 and FIG. 16. The new instruction cycle accomplishes the Decode and Dispatch instructions together in the same stage. The other difference is that the Increment PC stage has been moved from Stage 2 to Stage 5. Otherwise the order instruction cycle stages are the same. Thus the new Instruction cycle for the following example is (1) Fetch Instruction (1900, 1910, 1920, 1930, 1940, 1950); (2) Decode Instruction and Dispatch Register Operands (sometimes abbreviated just "Decode" in the following Figures) (1902, 1912, 1922, 1932, 1942, 1952); (3) Execute Instruction (1904, 1914, 1924, 1934, 1944, 1954); (4) Write Results (1906, 1916, 1926, 1936, 1946, 1956); and (5) Increment PC (if the instruction has not modified it) (1908, 1918, 1928, 1938, 1948, 1958). It should be noted that it is not only possible to accomplish the instruction cycle in 5 or 6 stages, but each of the stages can be further decomposed to achieve a desired number of stages, although a computer architecture typically implements only a single type of pipeline with a predetermined decomposition of the Instruction Cycle. For example, the Intel Pentium 4™ architecture used a 34-stage pipeline. In FIG. 19 the stages are grouped according their corresponding instruction in FIG. 18.

Although the arrows are not shown, each box can, and usually does, flow into the next box underneath it. One exception is the last instruction's last stage 1958. The other caveat is the last stage of the branch "IF" instruction 1938. In this instruction either stage 1936 will set the PC to point to the first instruction of the inner loop 1802 so that the next stage will be Instruction Fetch 1910, or stage 1938 will increment the PC to point to the next instruction underneath 1808 so that the next stage will be Instruction Fetch 1940.

Figure 20:
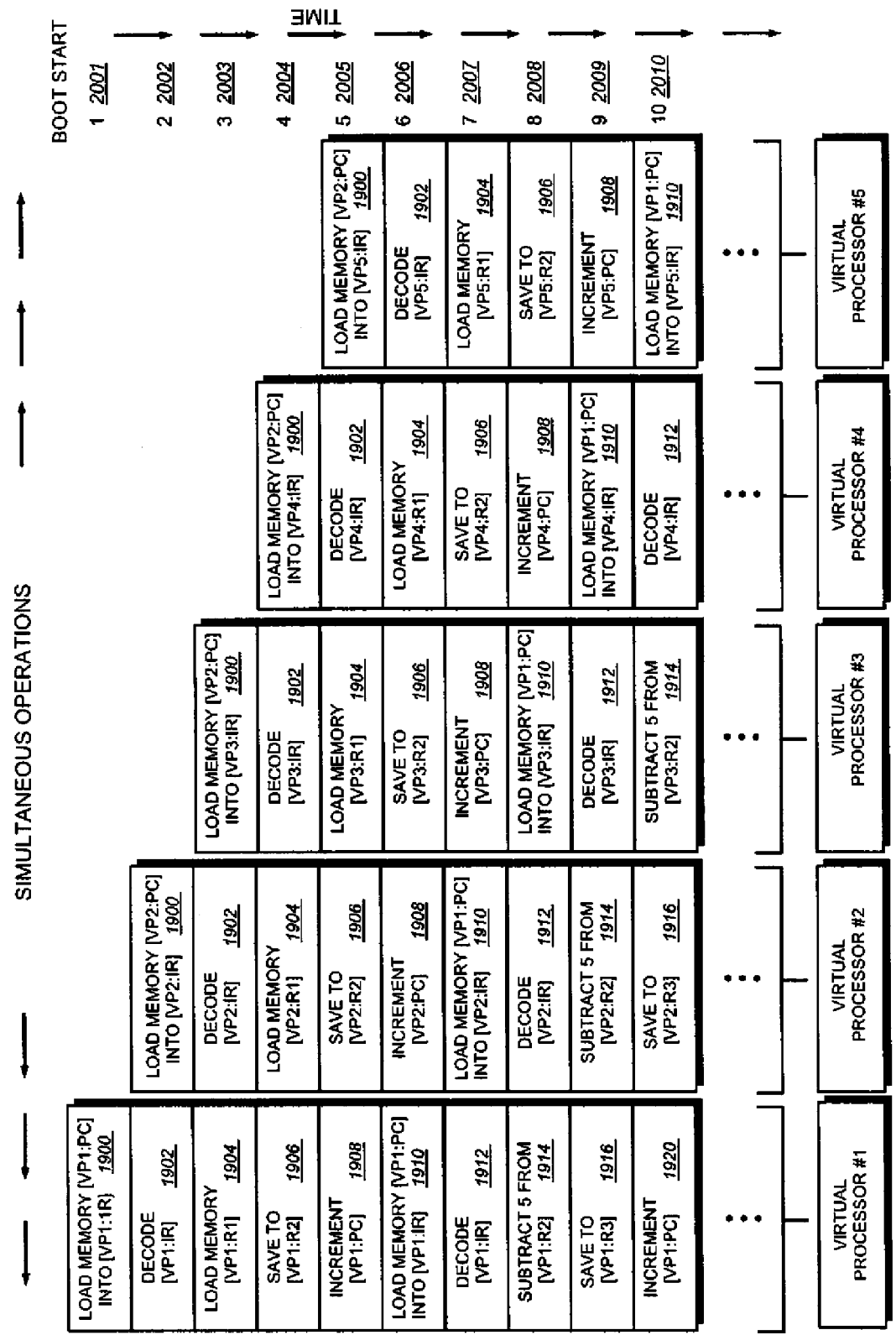
FIG. 20 is a block diagram illustrating how various operations can be pipelined with plural virtual processors in accordance with an illustrative embodiment.

FIG. 20 is a block diagram in which operations on the same horizontal axis occur simultaneously and operations lower in the chart occur later in time. Each column depicts the Instruction Cycle operation of a single virtual processor. Each virtual processor starts at the first stage 1900 of the first instruction of FIG. 19. The only time that Virtual Processors do not all simultaneously operate is at bootup, when each Virtual Processor must wait to start the Instruction Cycle to Fetch their first instruction. At time T=5 2005 all Virtual Processors are operating simultaneously and will continue to do so until the processor is turned off. Each block describes the instruction cycle stage that is being operated from FIG. 19. All Virtual Processors have started at the beginning of the program. Because no conditional branch ("IF") instructions are encountered during this execution all Virtual Processors proceed to execute the same instructions, although their stages are staggered. It can be seen that no pipeline hazards can occur because there are at least as many Virtual Processors (five) as pipeline stages (also five). Thus, the Virtual Processors achieve extremely high instruction throughput for a pipelined processor. The example, however, requires that all the stages of the instruction cycle require only a single cycle to complete.

Figure 21:
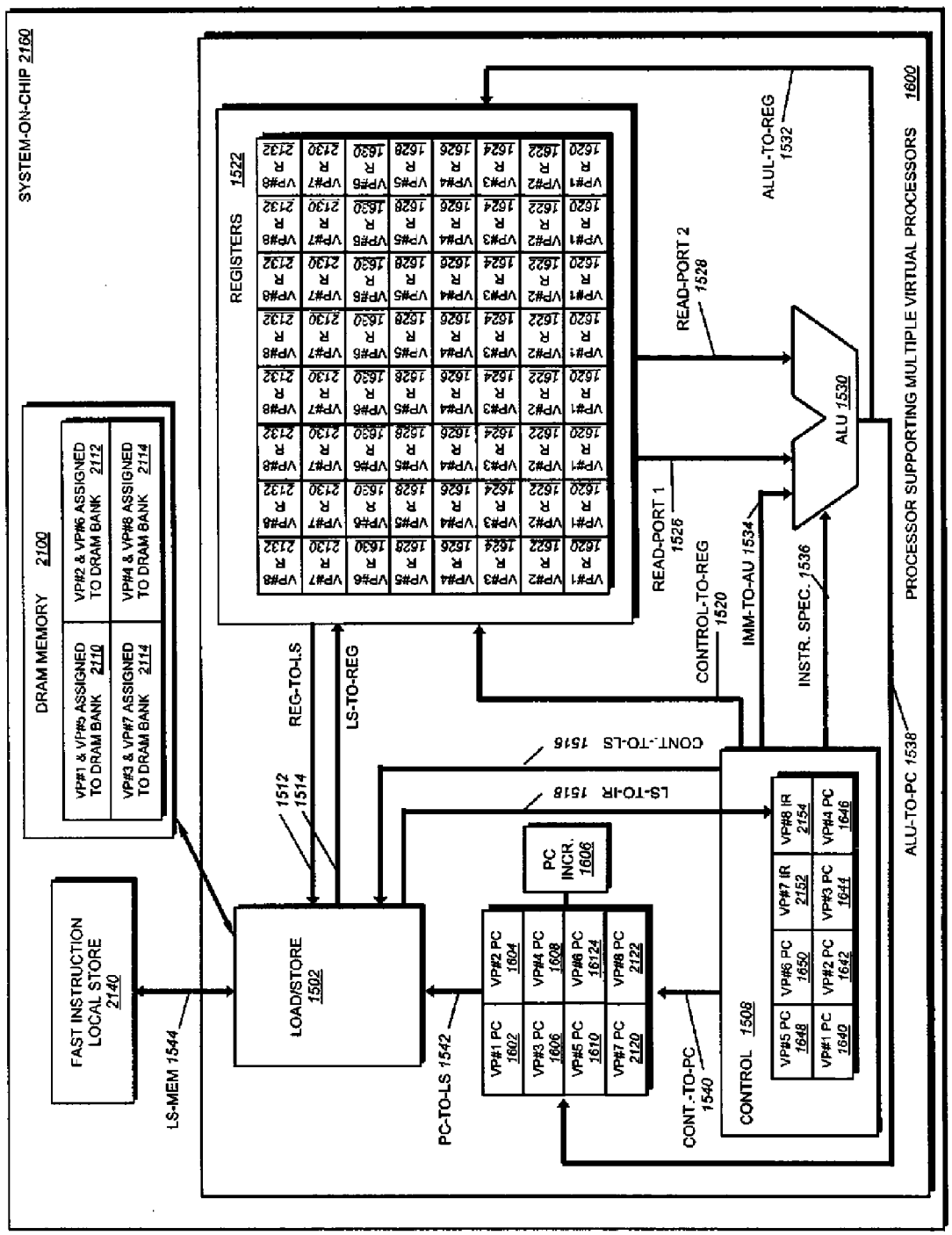
FIG. 21 is a schematic diagram of a system-on-chip processor architecture in accordance with an illustrative embodiment.

FIG. 21 is a block diagram schematic of a processor architecture 2160 utilizing on-chip DRAM (2100) memory storage as the primary data storage mechanism and Fast Instruction Local Store, or just Instruction Store, 2140 as the primary memory from which instructions are fetched. In this architecture the Instruction Store 2140 is fast, which may be achieved using SRAM memory. In order for the Instruction Store 2140 to not consume too much power relative to the microprocessor and DRAM memory, the Instruction Store 2140 can be made very small. Instructions can also be fetched from the DRAM memory 2100 however this should be avoided in performance-critical code. Because performance-critical code is usually a small set of instructions that are repeated many times, many programs will be able to fit this performance-critical code in the Instruction Store 2140.

The architecture has been adapted to use a DRAM memory 2100, which is organized into four banks 2110, 2112, 2114 and 2116, and requires 4 processor cycles to complete, called a 4-cycle latency. In order to allow such instructions to execute during a single Execute stage of the Instruction, the number of virtual processors has been increased to 8 including new VP#7 (2120) and VP#8 (2122). Thus, the DRAM memories 2100 are able to perform two memory operations for every Virtual Processor cycle by assigning the tasks of two processors (for example VP#1 and VP#5 to bank 2110). By elongating the Execute stage to 4 cycles, and maintaining single-cycle stages for the other 4 stages comprising: Instruction Fetch, Decode and Dispatch, Write Results, and Increment PC; it is possible for each virtual processor to complete an entire instruction cycle each virtual processor cycle. For example, at hardware processor cycle T=1 Virtual Processor #1 (VP#1) might be at the Fetch instruction cycle. Thus, at T=2 Virtual Processor #1 (VP#1) will perform a Decode & Dispatch stage. At T=3 the Virtual Processor will begin the Execute stage of the instruction cycle, which will take 4 hardware cycles (half a Virtual Processor cycle since there are 8 Virtual Processors) regardless of whether the instruction is a memory operation or an ALU 1530 function. If the instruction is an ALU instruction, the Virtual Processor might spend cycles 4, 5, and 6 simply waiting. It is noteworthy that although the Virtual Processor is waiting, the ALU is still servicing a different Virtual Processor (processing any non-memory instructions) every hardware cycle and is not idling at all. The same is true for the rest of the processor except the additional registers consumed by the waiting Virtual Processor, which are in fact idling. Although this architecture may seem slow at first glance, the hardware is being fully utilized at the expense of additional hardware registers required by the Virtual Processors. By minimizing the number of registers required for each Virtual Processor the overhead of these registers can be reduced. Although a reduction in usable registers could drastically reduce the performance of an architecture, the high bandwidth availability of the DRAM memory reduces the penalty paid to move data between the small number of registers and the DRAM memory.

Figure 21A:
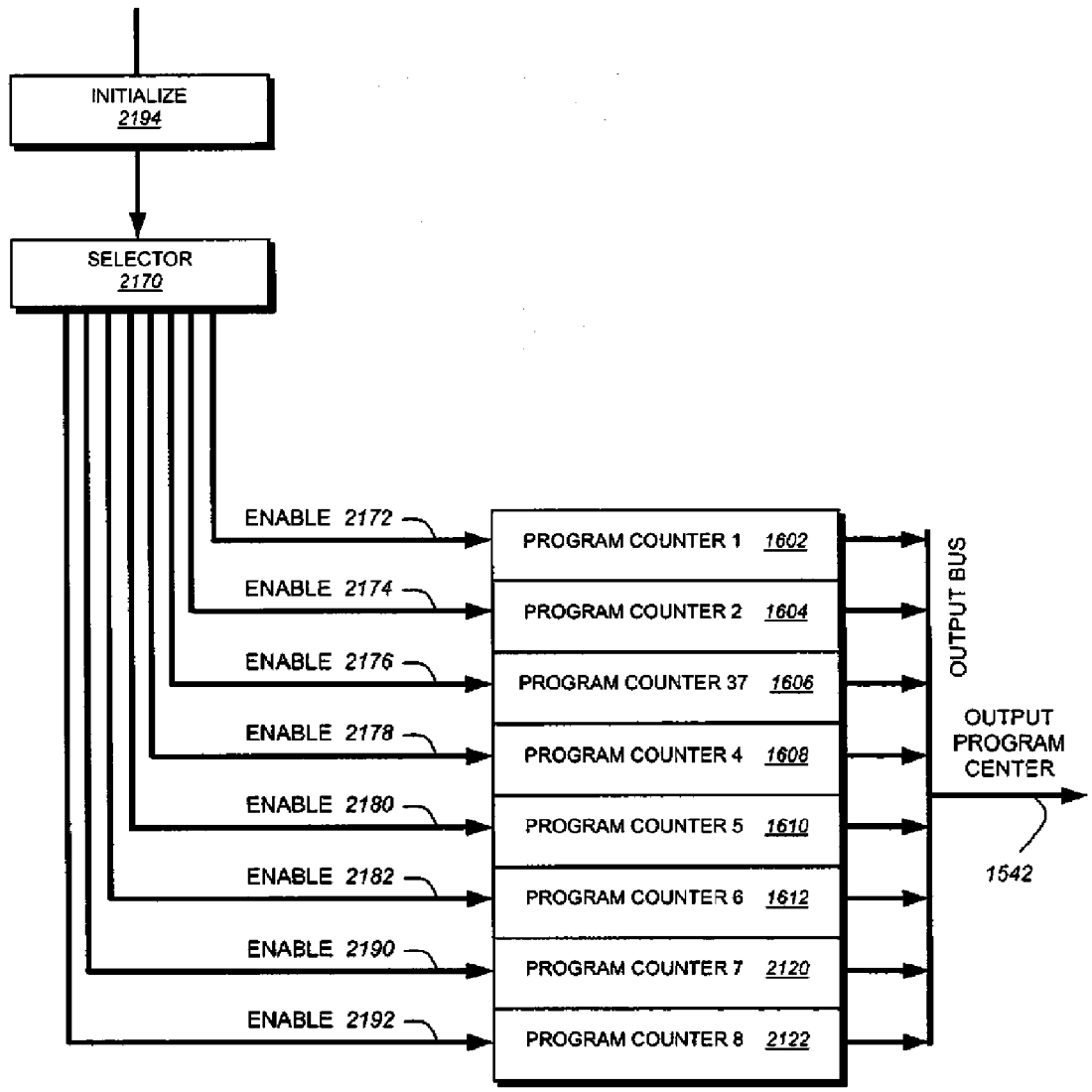
FIG. 21A is a block diagram of an illustrative selector for ordering the operation of each of the Virtual Processor counters in accordance with the embodiments of FIG. 21 and other embodiments employing a plurality of virtual processors.

Note, in the architecture 2160, in conjunction with the additional virtual processors VP#7 and VP#8, the system control 1508 now includes VP#7 IR 2152 and VP#8 IR 2154. In addition, the registers for VP#7 (2132) and VP#8 (2134) have been added to the register block 1522. Moreover, with reference to FIG. 21A, a Selector function 2110 is provided within the control 1508 to control the selection operation of each virtual processor VP#1-VP#8, thereby maintaining the orderly execution of tasks/threads, and optimizing advantages of the virtual processor architecture the has one output for each program counter and enables one of these every cycle. The enabled program counter will send its program counter value to the output bus, based upon the direction of the selector 2170 via each enable line 2172, 2174, 2176, 2178, 2180, 2182, 2190, 2192. This value will be received by Instruction Fetch unit 2140. In this configuration the Instruction Fetch unit 2140 need only support one input pathway, and each cycle the selector ensures that the respective program counter received by the Instruction Fetch unit 2140 is the correct one scheduled for that cycle. When the Selector 2170 receives an initialize input 2194, it resets to the beginning of its schedule. An example schedule would output Program Counter 1 during cycle 1, Program Counter 2 during cycle 2, etc. and Program Counter 8 during cycle 8, and starting the schedule over during cycle 9 to output Program Counter 1 during cycle 9, and so on . . . . A version of the selector function is applicable to any of the embodiments described herein in which a plurality of virtual processors are provided.

To complete the example, during hardware-cycle T=7 Virtual Processor #1 performs the Write Results stage, at T=8 Virtual Processor #1 (VP#1) performs the Increment PC stage, and will begin a new instruction cycle at T=9. In another example, the Virtual Processor may perform a memory operation during the Execute stage, which will require 4 cycles, from T=3 to T=6 in the previous example. This enables the architecture to use DRAM 2100 as a low-power, high-capacity data storage in place of a SRAM data cache by accommodating the higher latency of DRAM., thus improving power-efficiency. A feature of this architecture is that Virtual Processes pay no performance penalty for randomly accessing memory held within its assigned bank. This is quite a contrast to some high-speed architectures that use high-speed SRAM data cache, which is still typically not fast enough to retrieve data in a single cycle.

Each DRAM memory bank can be architected so as to use a comparable (or less) amount of power relative to the power consumption of the processor(s) it is locally serving. One method is to sufficiently share DRAM logic resources, such as those that select rows and read bit lines. During much of DRAM operations the logic is idling and merely asserting a previously calculated value. Using simple latches in these circuits would allow these assertions to continue and free-up the idling DRAM logic resources to serve other banks. Thus the DRAM logic resources could operate in a pipelined fashion to achieve better area efficiency and power efficiency.

Another method for reducing the power consumption of DRAM memory is to reduce the number bits that are sensed during a memory operation. This can be done by decreasing the number of columns in a memory bank. This allows memory capacity to be traded for reduced power consumption, thus allowing the memory banks and processors to be balanced and use comparable power to each other.

The DRAM memory 2100 can be optimized for power efficiency by performing memory operations using chunks, also called "words", that are as small as possible while still being sufficient for performance-critical sections of code. One such method might retrieve data in 32-bit chunks if registers on the CPU use 32-bits. Another method might optimize the memory chunks for use with instruction Fetch. For example, such a method might use 80-bit chunks in the case that instructions must often be fetched from data memory and the instructions are typically 80 bits or are a maximum of 80 bits.

Figure 22:
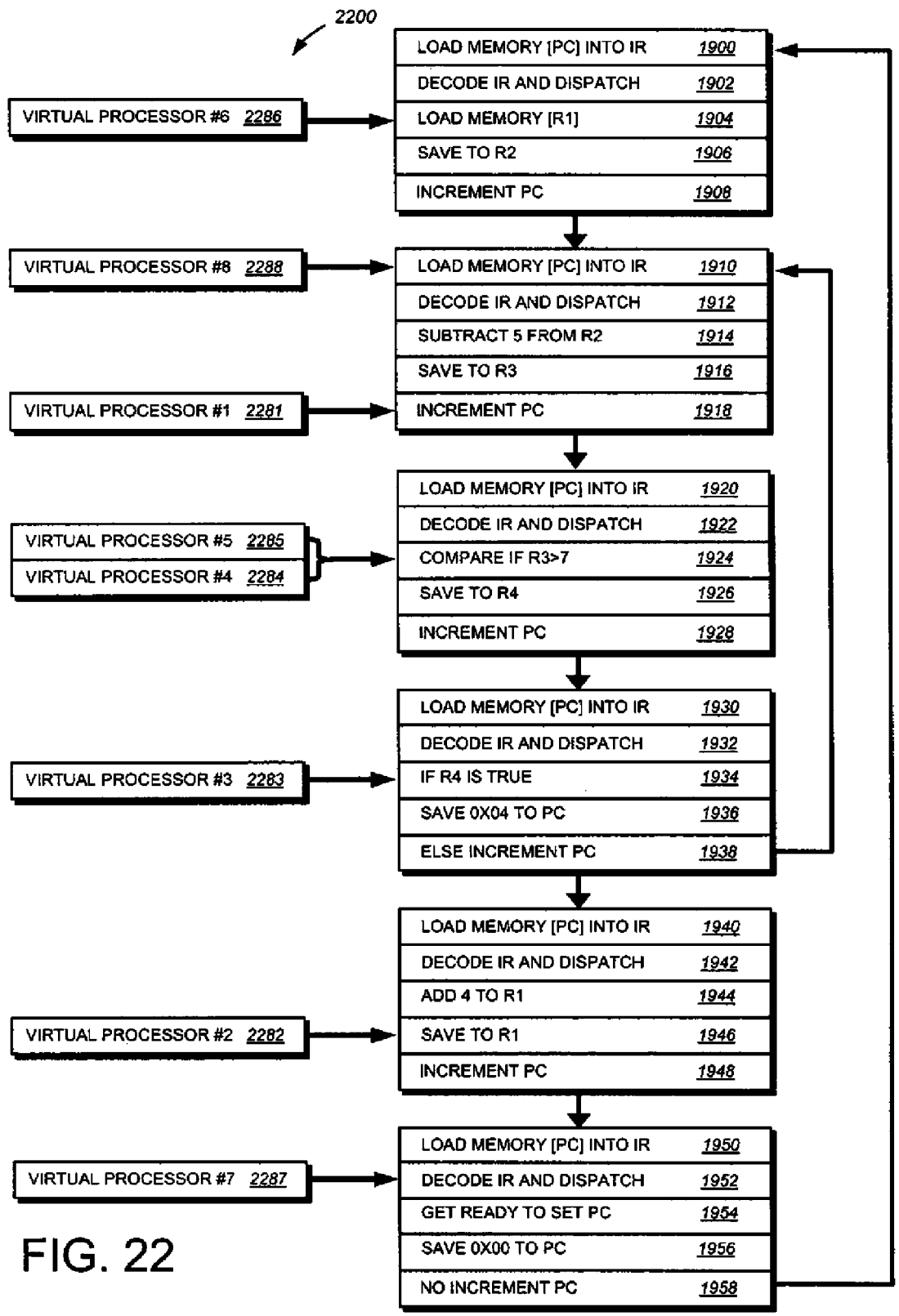
FIG. 22 is a flowchart showing example states of the architecture shown in FIG. 21.

FIG. 22 is a bock diagram 2200 showing an example state of the architecture 2160 in FIG. 21. Because DRAM memory access requires four cycles to complete, the Execute stage (1904, 1914, 1924, 1934, 1944, 1954) is allotted four cycles to complete, regardless of the instruction being executed. For this reason there will always be four virtual processors waiting in the Execute stage. In this example these four virtual processors are VP#3 (2283) executing a branch instruction 1934, VP#4 (2284) executing a comparison instruction 1924, VP#5 2285 executing a comparison instruction 1924, and VP#6 (2286) a memory instruction. The Fetch stage (1900, 1910, 1920, 1940, 1950) requires only one stage cycle to complete due to the use of a high-speed instruction store 2140. In the example, VP#8 (2288) is in the VP in the Fetch Instruction stage 1910. The Decode and Dispatch stage (1902, 1912, 1922, 1932, 1942, 1952) also requires just one cycle to complete, and in this example VP#7 (2287) is executing this stage 1952. The Write Result stage (1906, 1916, 1926, 1936, 1946, 1956) also requires only one cycle to complete, and in this example VP#2 (2282) is executing this stage 1946. The Increment PC stage (1908, 1918, 1928, 1938, 1948, 1958) also requires only one stage to complete, and in this example VP#1 (1981) is executing this stage 1918. This snapshot of a microprocessor executing 8 Virtual Processors (2281-2288) will be used as a starting point for a sequential analysis in the next figure.

Figure 23:
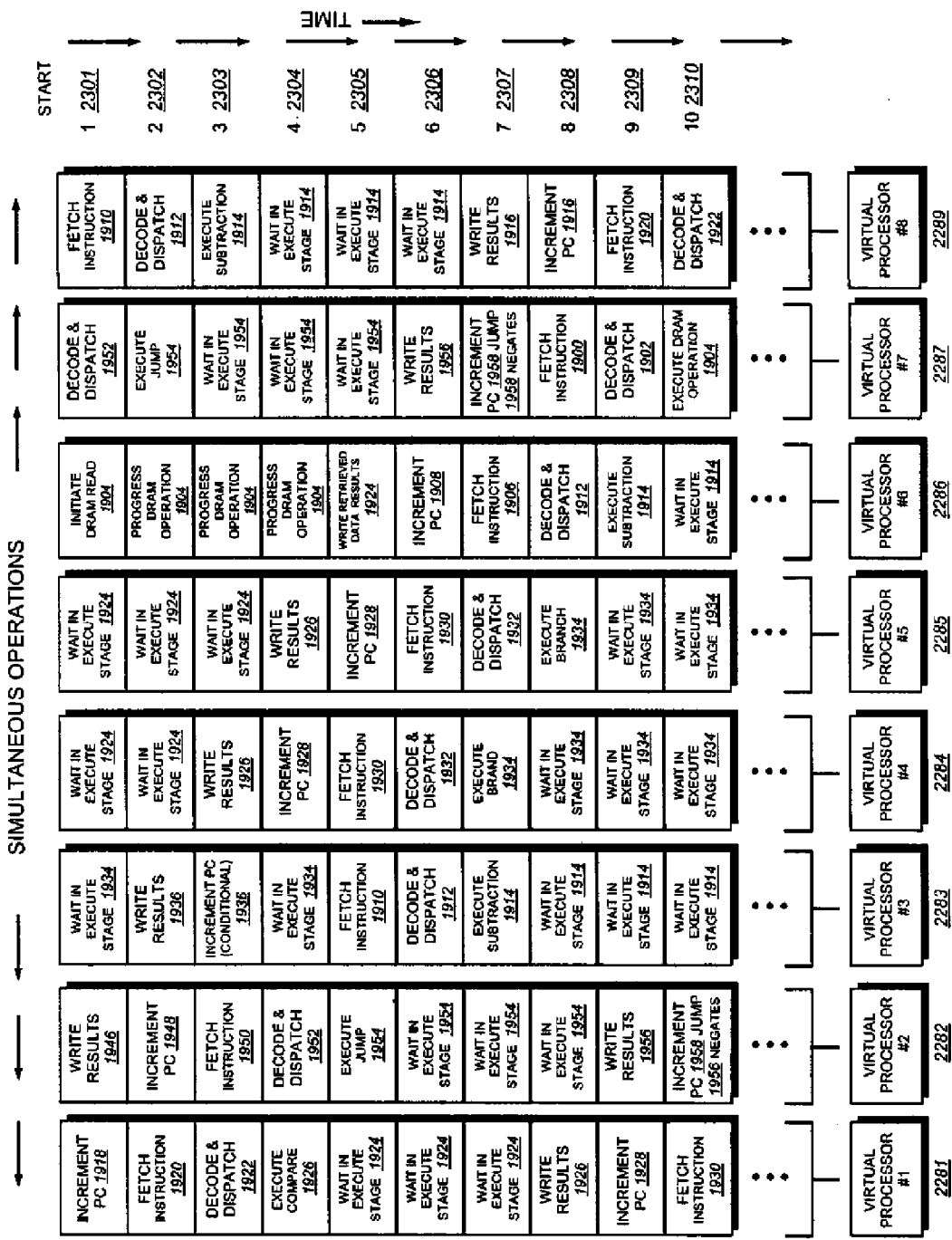
FIG. 23 is a block diagram showing, by way of example, ten cycles of operation of eight pipelined virtual processors.

FIG. 23 is a block diagram 2300 illustrating 10 cycles of operation during which 8 Virtual Processors (2281-2288) execute the same program but starting at different points of execution. At any point in time (2301-2310) it can be seen that all Instruction Cycle stages are being performed by different Virtual Processors (2281-2288) at the same time. In addition, three of the Virtual Processors (2281-2288) are waiting in the execution stage, and, if the executing instruction is a memory operation, this process is waiting for the memory operation to complete. More specifically in the case of a memory READ instruction this process is waiting for the memory data to arrive from the DRAM memory banks This is the case for VP#8 (2288) at times T=4, T=5, and T=6 (2304, 2305, 2306).

When virtual processors are able to perform their memory operations using only local DRAM memory, the example architecture is able to operate in a real-time fashion because all of these instructions execute for a fixed duration.

Figure 24:
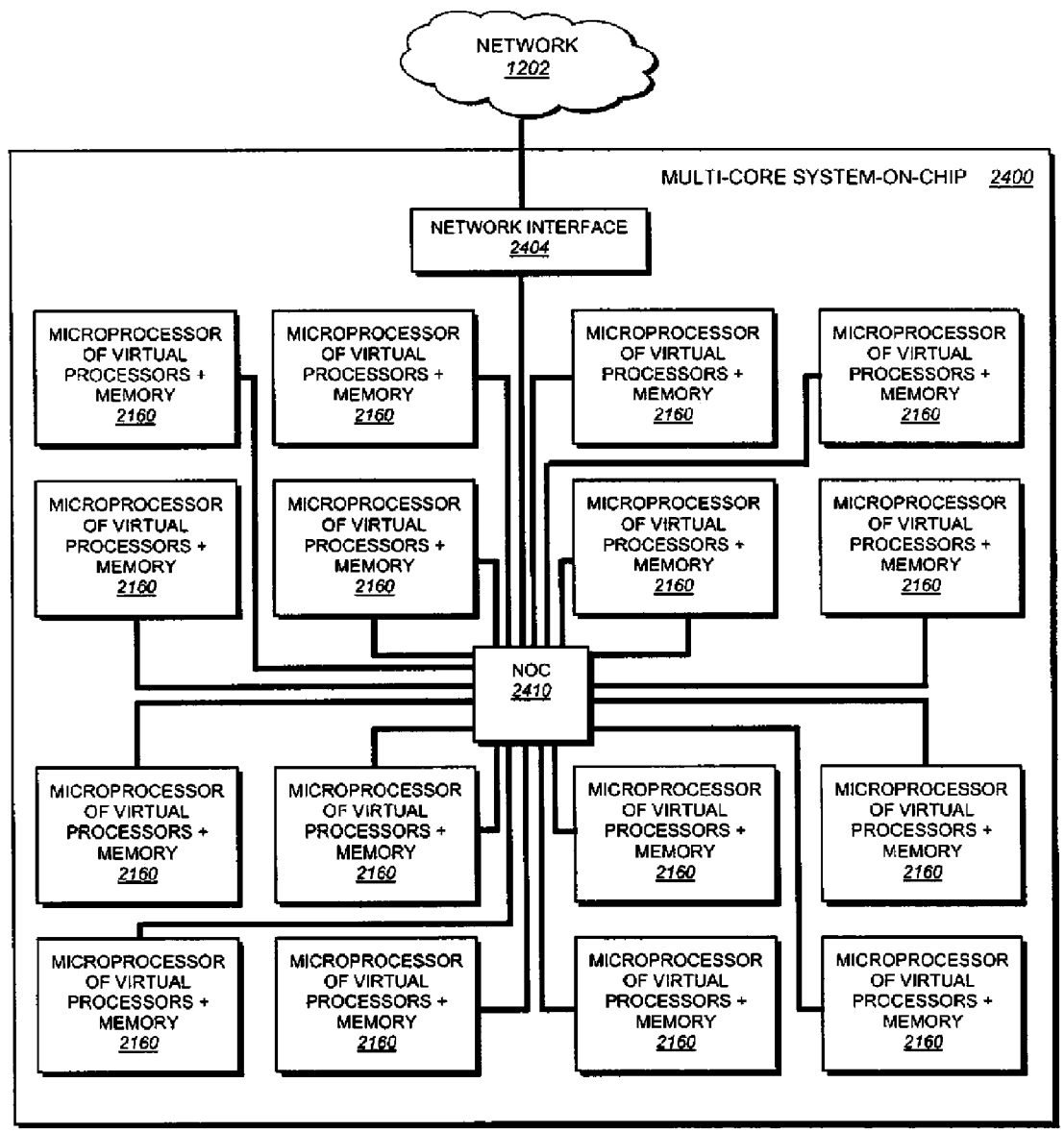
FIG. 24 is a block diagram of a multi-core system-on-chip processor architecture.

FIG. 24 is a block diagram of a multi-core system-on-chip 2400. Each core is a microprocessor implementing multiple virtual processors and multiple banks of DRAM memory 2160. The microprocessors interface with a network-on-chip (NOC) 2410 switch such as a crossbar switch. The architecture sacrifices total available bandwidth, if necessary, to reduce the power consumption of the network-on-chip such that it does not impact overall chip power consumption beyond a tolerable threshold. The network interface 2404 communicates with the microprocessors using the same protocol the microprocessors use to communicate with each other over the NOC 2410. If an IP core (licensable chip component) implements a desired network interface, an adapter circuit may be used to translate microprocessor communication to the on-chip interface of the network interface IP core.

Figure 25:
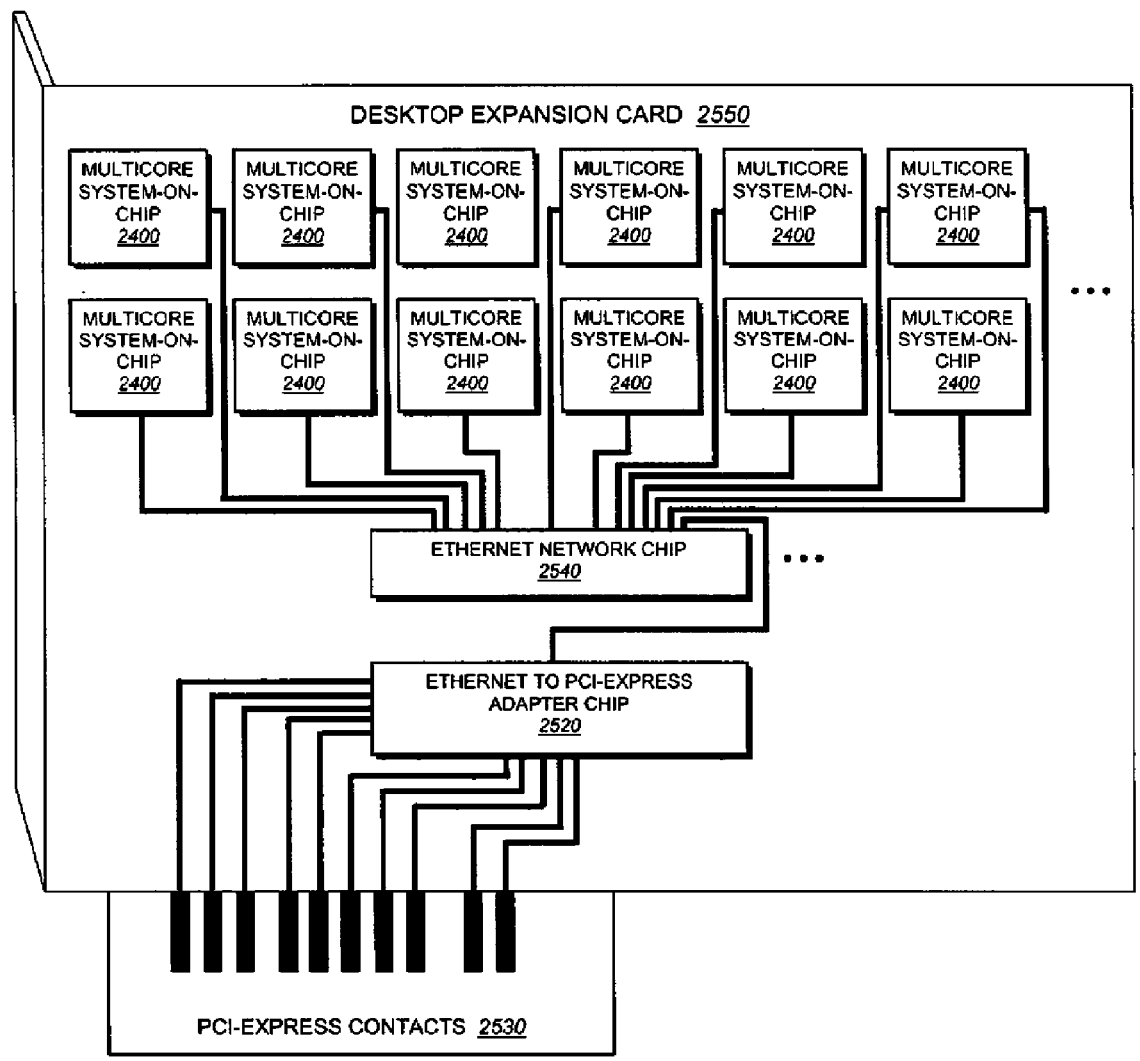
FIG. 25 is a block diagram of a desktop expansion card, implemented with many multi-core chips on a given card in accordance with an illustrative embodiment.

FIG. 25 is a block diagram of a desktop expansion card 2550 with many multi-core chips 2400 onboard. The multi-core chips interface with each other via an Ethernet switch 2540, although other networking protocols may deliver improved power-efficiency relative to IP over Ethernet. For example, a non-blocking switch architecture might be used to reduce buffer load, and thus power usage, by delivering messages as rapidly as possible. The Ethernet network chip 2540 interfaces with an Ethernet to PCI-Express adapter chip 2520 which is able to transfer messages between a desktop attached via the PCI-express contacts 2530 and the multi-core system-on-chips 2400 on the expansion card 2550.

The multi-core chips 2400 can be called nodes, and the nodes that reside on the same expansion card 2550 can be said to be in the same node group. Nodes in a node group may use knowledge of which other nodes are connected to the same network switch chip 2540 or connected through only a few network switch chips 2540 and residing on the same expansion card 2550. This knowledge may be used to avoid the highest latency network operations and provide known node peers with reasonable latency distributions bounds that might otherwise perform poorly by communicating more frequently with higher latency peers.

If more nodes are placed on the expansion card 2550 than can be serviced by a single network switch 2540 it possible to connect the network in a hierarchical fashion in order to reduce the number of network switches necessary to connect all the nodes, thus reducing power. Thus many, possibly hundreds or more, nodes may be placed on the same expansion card 2550.

Figure 26:
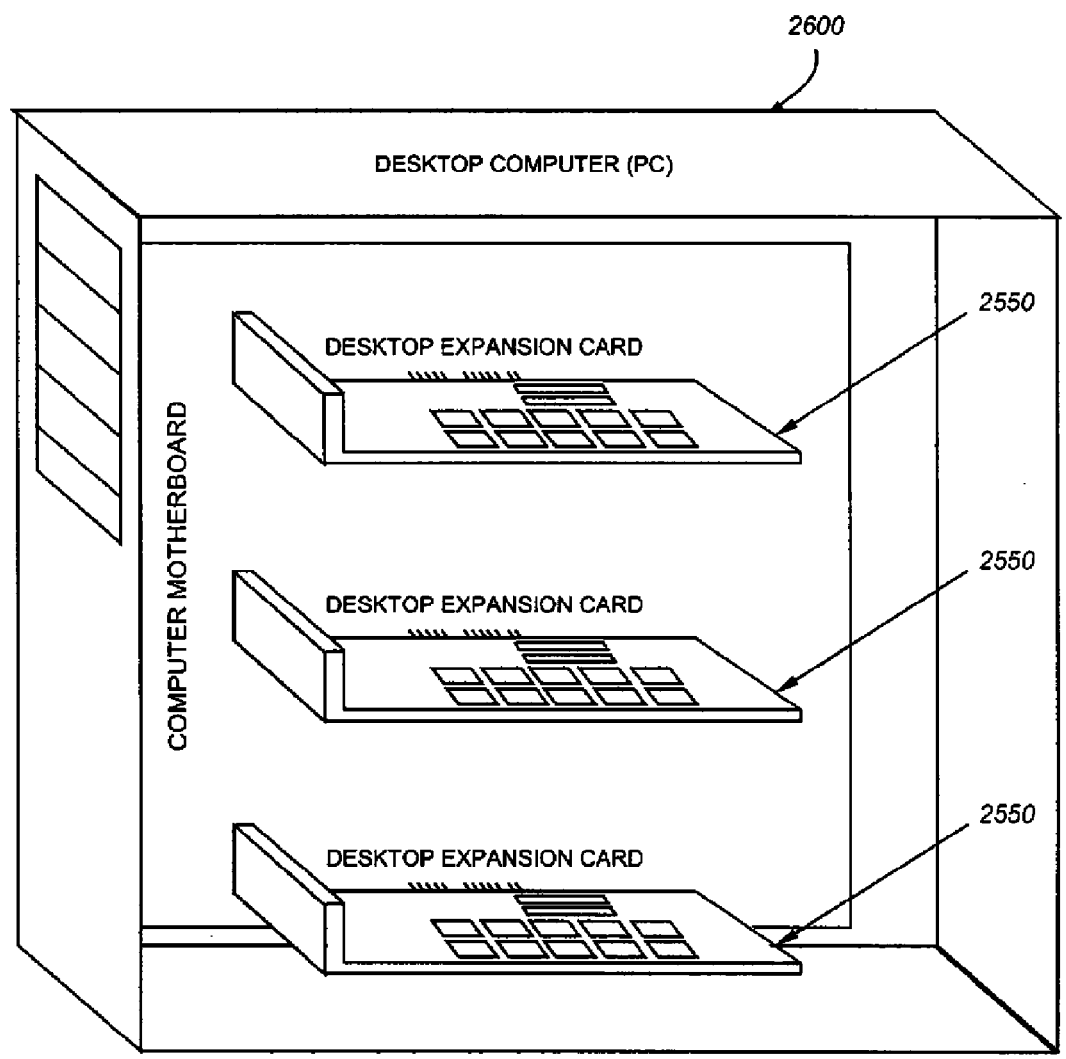
FIG. 26 is a simplified perspective drawing showing how several desktop expansion cards may be provided in an desktop computer in accordance with an illustrative embodiment.

FIG. 26 is a block diagram illustrating how several desktop expansion cards 2550 may be fit inside the case of a desktop computer 2600. Those calculations that benefit most from executing on a desktop computer 2600 (such as those that require access to hard drives) may be run on the desktop computer while the desktop expansion cards 2550 may be assigned just those tasks that need acceleration and for which they are well-suited.

Figure 27:
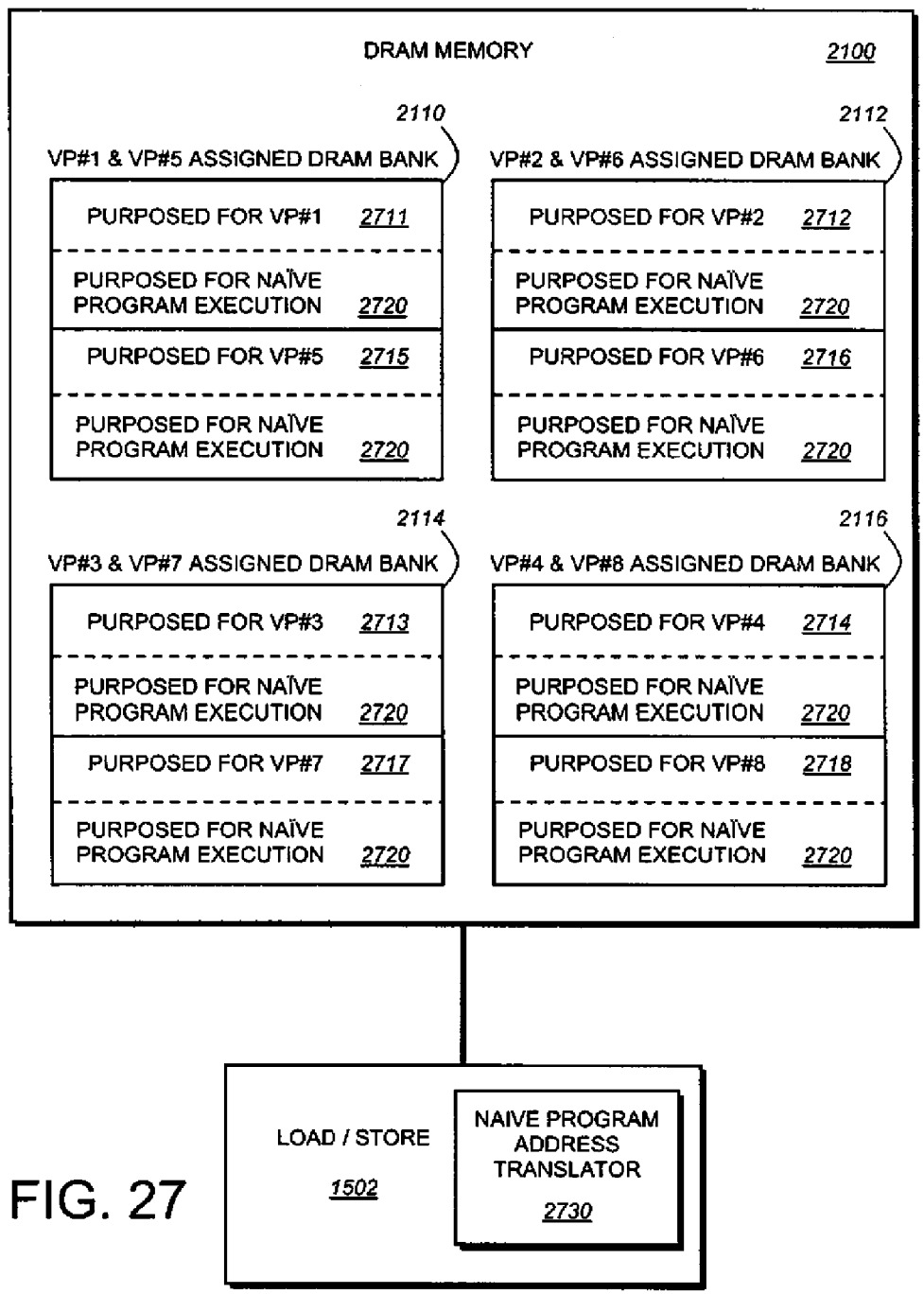
FIG. 27 is a block diagram of DRAM memory corresponding to eight virtual processors in accordance with one embodiment of a processor architecture.

FIG. 27 is a block diagram of DRAM Memory 2100 divided into four banks (2110, 2112, 2114, 2116), each bank further divided into memory regions purposed for use by the assigned virtual processors (2711-2718) and memory regions 2720 reserved for programs that must be run on-chip but have high memory requirements, such as several megabytes. Some versions of Linux are able to run with relatively low memory requirements (compared to desktop Linux), but these requirements are beyond the memory capacity of any one DRAM bank. Still, multiple DRAM banks may combine and emulate a contiguous address space to such programs, provided the Load/Store 1502 unit contains an address translator 2730 such that naive memory addressing (e.g. assuming random access among several megabytes of memory) can be translated to designate the appropriate bank and address within that bank. Across the entire system-on-chip 1400 the individual DRAMs may combine to provide a significantly large contiguous address space, facilitating the execution of programs that do not use memory efficiently, but are still useful to the system.

Figure 28:
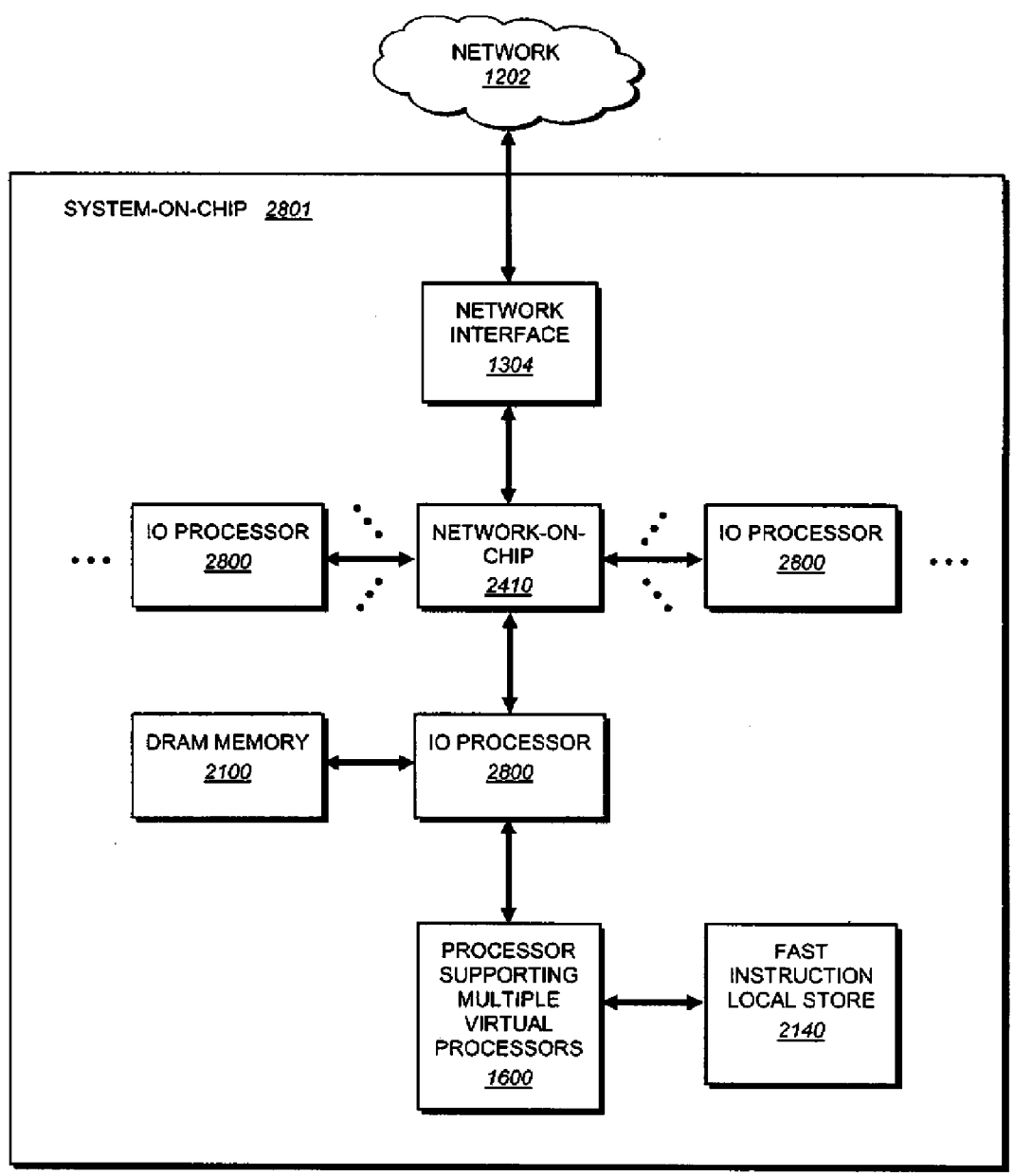
FIG. 28 is a block diagram of a network-on-chip implementation in accordance with an illustrative embodiment.

FIG. 28 is a block diagram 2801 that augments previously derived system-on-chips 2400 (FIG. 24), such that each processing core 2160 is coupled with an JO processor 2800 that mediates between the network-on-chip 2410, DRAM memory 2100 (FIG. 21), and processing core 1600. The IO processor 2800 may accept simple commands from the processing core 1600 such as the loading of a memory chunk residing in an on-chip non-local DRAM memory into the local DRAM memory. The IO processor may provide settings that allow the prioritizing behavior of the IO processor to be configured in a desired way, such as prioritizing Processor DRAM memory requests 1600 that are Instruction Fetches for instructions that do not reside in the Instruction store 2140. The IO processor 2800 is able to carry out these simple commands without disturbing the execution of the microprocessor 1600, thus improving throughput for programs that require both IO and processor computation. The IO commands executed by the IO Processor 2800 might otherwise require many software processor cycles to complete using blocking IO processor instructions.

A graphical tool may include, for example, an icon or button that can be activated by clicking a mouse with a curser situated over the icon button. A graphical tool may include a form or textual input represented on a computer screen. A graphical tool may include a menu of displayed symbols or text that could be chosen by pointing to and clicking over a given symbol or text. A graphical tool can also include a drop-down menu, or any other type of graphical tool. Alternatively, other tools may be provided to allow a user to control and operate various functions referred to in the interfaces depicted herein, for example, with the use of a command line type interface.

The foregoing has been a detailed description of illustrative embodiments of the invention. Various modifications and additions can be made without departing from the spirit and scope of this invention. Each of the various embodiments described above may be combined with other described embodiments in order to provide multiple features. Furthermore, while the foregoing describes a number of separate embodiments of the system and method of the present invention, what has been described herein is merely illustrative of the application of the principles of the present invention. The processing or functions described herein may be performed by a single processing platform or by a distributed processing platform linked by an appropriate interconnection. Any data handled in such processing or created as a result of such processing can be stored in any type of memory. By way of example, such data may be stored in a temporary memory, such as in the random access memory of a given computer. In addition, or in the alternative, such data may be stored in longer-term storage devices, for example, magnetic disks, rewritable optical disks, and so on. The operating system instantiated in the computer systems defined in accordance with this invention can be any acceptable computer operating system with the capabilities of handling the parallel processing tasks contemplated herein. Likewise, the computer systems contemplated herein can be adapted to run relatively conventional applications that include serial processes—particularly wherein the speed of such process may be of less concern. Accordingly, this description is meant to be taken only by way of example, and not to otherwise limit the scope of this invention.

What is claimed is:

1. A parallel processing computing system comprising:
(a) an ordered set of m memory banks including a first and a last memory bank, wherein m is an integer greater than 1; and
(b) a processor core that implements: (i) n ordered virtual processors, wherein n is an integer greater than 1, and (ii) a pipeline having p ordered stages, including a memory operation stage, wherein p is an integer greater than 1 and less than or equal to n; and
(c) a network-on-chip connected to the processor core and the memory banks through an IO processor,
wherein the memory banks are the most local data memory to the processor core, and are connected to the processor core through the IO processor,
wherein the processor core clock speed is faster than the memory access rate of the memory banks by an integer multiple k, and a memory bank access causes that bank to be unavailable for k cycles,
wherein each virtual processor is assigned in order to one of the memory banks,
wherein after the last memory bank is assigned, the next virtual processor is assigned to the first memory bank, and
wherein the virtual processors and their respective memory banks are adapted to simultaneously execute independent threads, and each virtual processor is adapted to execute pipeline stages in order, and no virtual processor executes the same pipeline stage as any other virtual processor at the same time.

2. The parallel processing computing system of claim 1, wherein the IO processor is configured to:
receive a first command from the processor core, the first command identifying at least one first memory bank; and
operate on the at least one first memory bank.

3. The parallel processing computing system of claim 2 wherein the IO processor is configured to:
receive a second command from the network-on-chip, the second command identifying at least one second memory bank; and
operate on the at least one second memory bank.

4. The parallel processing computing system of claim 3 further comprising:
an IO processor mode setting that prioritizes commands received from the processor core over commands received from the network-on-chip,
wherein commands received from the network-on-chip to operate on a third memory bank are performed only when a virtual processor core assigned to the third memory bank does not perform a memory operation.

5. The parallel processing computing system of claim 1 further comprising:
a naïve memory address translator enabling a virtual processor to access a contiguous address space spanning multiple memory banks.

6. The parallel processing computing system of claim 5, wherein the IO processor is configured to accept commands from the naïve memory address translator to perform memory operations for a virtual processor on a memory bank that is not assigned to that virtual processor.

7. The parallel processing computing system of claim 1, wherein the IO processor is configured to accept commands such that a command to be performed on a memory bank that is not assigned to a commanding virtual processor is carried out if the memory bank is not in a k-cycle period of unavailability.

8. A parallel processing computing system comprising:
(a) an ordered set of m memory banks including a first and a last memory bank, wherein m is an integer greater than 1; and
(b) a processor core that implements (i) n ordered virtual processors, wherein n is an integer greater than 1, and (ii) a pipeline having n ordered stages, including a memory operation stage,
wherein the memory banks are (i) the most local data memory to the processor core, and (ii) connected to the processor core through an IO processor,
wherein the processor core clock speed is faster than the memory access rate of the memory banks by an integer multiple,
wherein each virtual processor is assigned in order to one of the memory banks,
wherein after the last memory bank is assigned, the next virtual processor is assigned to the first memory bank, and
wherein the virtual processors and their respective memory banks are adapted to simultaneously execute independent threads, and each virtual processor is adapted to execute pipeline stages in order and no virtual processor executes the same pipeline stage as any other virtual processor at the same time.

9. The parallel processing computing system of claim 8, wherein the IO processor is configured to accept commands to access the memory banks, and store the commands in communication buffers until requested by the processor core in order to not disturb execution of the processor core.

10. The parallel processing computing system of claim 9, wherein the IO processor is further configured to read B bits of data from the memory banks, and to service requests for C bits of data, where C is less than B.

11. The parallel processing computing system of claim 10, wherein B is equal to 256, and data is fetched from the memory banks in sizes of 256 bits.

12. The parallel processing computing system of claim 11, wherein the register buffers are configured to hold the 256 bit fetches of data from the memory banks.

13. The parallel processing computing system of claim 12, wherein the IO processor is configured to service commands fetching 64 bits of data such that the 64 bits are retrieved from a 256 bit piece of data held in register buffers that were filled during a previous memory bank access.

14. The parallel processing computing system of claim 10 further comprising:
a plurality of register buffers, wherein pieces of data requested from the IO processor by the processor core are fetched from the memory banks by the IO processor, and the data fetched from memory banks are held in the register buffers to service future memory fetches with reduced power consumption.

15. The parallel processing computing system of claim 10, wherein C is equal to 64, and the processor core fetches data from the memory banks through the IO processor in sizes of 64 bits.

16. The parallel processing computing system of claim 8 further comprising:
a low-power data cache on the same chip as the virtual processors and local to the virtual processors, enabling full communication between the virtual processors.

17. The parallel processing computing system of claim 16, wherein the data cache is a read-only data cache.

18. The parallel processing computing system of claim 8, further comprising:
(c) a network-on-chip, wherein the IO processor is connected to the network-on-chip.

* * * * *